(12) United States Patent
Kley

(10) Patent No.: US 7,091,476 B2
(45) Date of Patent: *Aug. 15, 2006

(54) SCANNING PROBE MICROSCOPE ASSEMBLY

(75) Inventor: Victor B. Kley, Berkeley, CA (US)

(73) Assignee: General Nanotechnology LLC, Berkeley, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/047,454

(22) Filed: Jan. 14, 2002

(65) Prior Publication Data

US 2002/0135755 A1    Sep. 26, 2002

Related U.S. Application Data

(63) Continuation of application No. 08/776,361, filed as application No. PCT/US95/09553 on Jul. 28, 1995, now Pat. No. 6,339,217, which is a continuation-in-part of application No. 08/412,380, filed on Mar. 29, 1995, now abandoned, which is a continuation-in-part of application No. 08/281,883, filed on Jul. 28, 1994, now abandoned.

(51) Int. Cl.
*H01J 3/14* (2006.01)
*G01B 5/28* (2006.01)

(52) U.S. Cl. ........................ 250/234; 73/105
(58) Field of Classification Search ............... 250/216, 250/234, 306–311; 73/105
See application file for complete search history.

(56) References Cited

U.S. PATENT DOCUMENTS

| | | | |
|---|---|---|---|
| 3,586,865 A | 6/1971 | Baker et al. | |
| 3,812,288 A | 5/1974 | Walsh et al. | |
| 4,115,806 A | 9/1978 | Morton | |
| 4,604,520 A | 8/1986 | Pohl | |
| 4,672,559 A | 6/1987 | Jansson et al. | |
| 4,673,477 A | 6/1987 | Ramalingam et al. | |
| RE32,457 E | 7/1987 | Matey | |
| 4,681,451 A | 7/1987 | Guerra et al. | |
| 4,697,594 A | 10/1987 | Mayo, Jr. | |
| 4,831,614 A | 5/1989 | Duerig et al. | |
| 4,866,986 A | 9/1989 | Cichanski | |
| 4,907,195 A | 3/1990 | Kazan et al. | |
| 4,924,091 A | 5/1990 | Hansma et al. | |
| 4,954,704 A | 9/1990 | Elings et al. | |
| 4,999,495 A | 3/1991 | Miyata et al. | |
| 5,001,344 A | 3/1991 | Kato et al. | |
| 5,010,249 A | 4/1991 | Nishikawa | |
| 5,015,850 A | 5/1991 | Zdeblick et al. | |
| 5,018,865 A | 5/1991 | Ferrell et al. | |
| 5,025,346 A | 6/1991 | Tang et al. | |

(Continued)

FOREIGN PATENT DOCUMENTS

EP         0325058         7/1989

(Continued)

OTHER PUBLICATIONS

Betzig et al "Near-Field Optics: Microscopy Spectroscopy and Surface Modification Beyond the Diffraction Limit" Science 257:(1992).

(Continued)

*Primary Examiner*—Thanh X. Luu
(74) *Attorney, Agent, or Firm*—Townsend and Townsend and Crew LLP

(57) ABSTRACT

A scanning probe microscope assembly that has an atomic force measurement (AFM) mode, a scanning tunneling measurement (STM) mode, a near-field spectrophotometry mode, a near-field optical mode, and a hardness testing mode for examining an object.

39 Claims, 37 Drawing Sheets

U.S. PATENT DOCUMENTS

| | | |
|---|---|---|
| 5,038,322 A | 8/1991 | Van Loenen |
| 5,043,577 A | 8/1991 | Pohl et al. |
| 5,047,633 A | 9/1991 | Finlan et al. |
| 5,047,649 A | 9/1991 | Hodgson et al. |
| 5,072,116 A | 12/1991 | Kawade et al. |
| 5,081,390 A | 1/1992 | Elings |
| 5,105,305 A | 4/1992 | Betzig et al. |
| 5,107,112 A | 4/1992 | Yanagisawa et al. |
| 5,108,865 A | 4/1992 | Zwaldo et al. |
| 5,118,541 A | 6/1992 | Yamamoto et al. |
| 5,138,159 A * | 8/1992 | Takase et al. ............... 250/306 |
| 5,142,145 A | 8/1992 | Yasutake |
| 5,148,308 A | 9/1992 | Miyauchi |
| 5,155,589 A | 10/1992 | Gere |
| 5,168,520 A | 12/1992 | Weiss |
| 5,187,367 A | 2/1993 | Miyazaki et al. |
| RE34,214 E | 4/1993 | Carlsson et al. |
| 5,210,410 A | 5/1993 | Barrett |
| 5,216,631 A | 6/1993 | Sliwa, Jr. |
| 5,220,555 A | 6/1993 | Yanagisawa et al. |
| 5,231,286 A | 7/1993 | Kajimura et al. |
| 5,241,527 A | 8/1993 | Eguchi et al. |
| 5,249,077 A | 9/1993 | Laronga et al. |
| 5,254,854 A | 10/1993 | Betzig |
| 5,260,824 A | 11/1993 | Okada et al. |
| 5,276,672 A | 1/1994 | Miyazaki et al. |
| 5,278,704 A | 1/1994 | Matsuda et al. |
| 5,283,437 A | 2/1994 | Greschner et al. |
| 5,289,004 A * | 2/1994 | Okada et al. ............... 250/306 |
| 5,289,408 A | 2/1994 | Mimura et al. |
| 5,297,130 A | 3/1994 | Tagawa et al. |
| 5,299,184 A | 3/1994 | Yamano et al. |
| 5,302,239 A | 4/1994 | Roe et al. |
| 5,308,974 A | 5/1994 | Elings et al. |
| 5,317,152 A | 5/1994 | Takamatsu et al. |
| 5,317,533 A | 5/1994 | Quate et al. |
| 5,319,961 A | 6/1994 | Matsuyama et al. |
| 5,319,977 A | 6/1994 | Quate et al. |
| RE34,708 E | 8/1994 | Hansma et al. |
| 5,338,932 A * | 8/1994 | Theodore et al. .......... 250/306 |
| 5,343,460 A | 8/1994 | Miyazaki et al. |
| 5,349,735 A | 9/1994 | Kawase et al. |
| 5,353,632 A | 10/1994 | Nakagawa |
| 5,354,985 A | 10/1994 | Quate |
| 5,357,109 A | 10/1994 | Kusumoto |
| 5,357,110 A | 10/1994 | Statham |
| 5,360,977 A | 11/1994 | Onuki et al. |
| 5,362,963 A | 11/1994 | Kopelman et al. |
| 5,373,494 A | 12/1994 | Kawagishi et al. |
| 5,389,475 A | 2/1995 | Yanagisawa et al. |
| 5,392,275 A | 2/1995 | Kawada et al. |
| 5,393,647 A | 2/1995 | Neukermans et al. |
| 5,396,483 A | 3/1995 | Matsuda et al. |
| 5,408,094 A | 4/1995 | Kajimura |
| 5,412,641 A | 5/1995 | Shinjo et al. |
| 5,414,260 A | 5/1995 | Takimoto et al. |
| 5,414,690 A | 5/1995 | Shido et al. |
| 5,416,331 A | 5/1995 | Ichikawa et al. |
| 5,418,363 A * | 5/1995 | Elings et al. ............... 250/306 |
| 5,426,631 A | 6/1995 | Miyazaki et al. |
| 5,453,970 A | 9/1995 | Rust et al. |
| 5,455,420 A | 10/1995 | Ho et al. |
| 5,461,605 A | 10/1995 | Takimoto et al. |
| 5,463,897 A | 11/1995 | Prater et al. |
| 5,471,458 A | 11/1995 | Oguchi et al. |
| 5,472,881 A | 12/1995 | Beebe et al. |
| 5,490,132 A | 2/1996 | Yagi et al. |
| 5,495,109 A | 2/1996 | Lindsay et al. |
| 5,502,306 A | 3/1996 | Meisburger et al. |
| 5,506,829 A | 4/1996 | Yagi et al. |
| 5,510,615 A | 4/1996 | Ho et al. |
| 5,519,686 A | 5/1996 | Yanagisawa et al. |
| 5,548,117 A | 8/1996 | Nakagawa |
| 5,559,328 A | 9/1996 | Weiss et al. |
| 5,560,244 A | 10/1996 | Prater et al. |
| 5,583,286 A | 12/1996 | Matsuyama |
| 5,602,820 A | 2/1997 | Wickramasinghe et al. |
| 5,610,898 A | 3/1997 | Takimoto et al. |
| 5,623,476 A | 4/1997 | Eguchi et al. |
| 5,634,230 A | 6/1997 | Maurer |
| 5,644,512 A | 7/1997 | Chernoff et al. |
| 5,679,952 A | 10/1997 | Lutwyche et al. |
| 5,717,680 A | 2/1998 | Yamano et al. |
| 5,721,721 A | 2/1998 | Yanagisawa et al. |
| 5,751,683 A | 5/1998 | Kley |
| 5,756,997 A | 5/1998 | Kley |
| 5,763,879 A | 6/1998 | Zimmer et al. |
| 5,821,410 A | 10/1998 | Xiang et al. |
| 5,825,670 A | 10/1998 | Chernoff et al. |
| 5,865,978 A | 2/1999 | Cohen |
| 5,874,726 A | 2/1999 | Haydon |
| 5,883,387 A | 3/1999 | Matsuyama et al. |
| 5,922,214 A | 7/1999 | Liu et al. |
| 6,031,758 A | 2/2000 | Katayama et al. |
| 6,066,265 A | 5/2000 | Galvin et al. |
| 6,101,164 A | 8/2000 | Kado et al. |
| 6,144,028 A | 11/2000 | Kley |
| 6,229,138 B1 | 5/2001 | Kley |
| 6,229,609 B1 * | 5/2001 | Muramatsu et al. ......... 250/234 |
| 6,252,226 B1 | 6/2001 | Kley |
| 6,265,711 B1 * | 7/2001 | Kley ......................... 250/234 |
| 6,337,479 B1 | 1/2002 | Kley |
| 6,340,813 B1 | 1/2002 | Tominaga et al. |
| 6,353,219 B1 | 3/2002 | Kley |
| 2002/0007667 A1 | 1/2002 | Pohl et al. |

FOREIGN PATENT DOCUMENTS

| | | |
|---|---|---|
| JP | 61-133065 | 8/1986 |
| JP | 63-062186 | 2/1989 |
| JP | 1-262403 | 10/1989 |
| JP | 02-131433 | 1/1992 |
| JP | 03-140323 | 3/1992 |
| JP | 04-032424 | 7/1993 |
| JP | 7-105580 | 4/1995 |
| WO | WO 96/03841 A1 | 2/1996 |
| WO | WO 97/04449 | 2/1997 |
| WO | WO 98/34092 A2 | 8/1998 |
| WO | WO 01/03157 | 1/2001 |

OTHER PUBLICATIONS

Davis "Deposition characterization and device development in diamond silicon carbide and gallium nitride thin films" J. Vac. Sci. Technol. A 11(4). Jul./Aug. (1993).

Givargizov et al "Growth of diamond particles on sharpened silicon tips" Materials Letters 18:(1993).

Toledo-Crow et al "Near-field differential scanning optical microscope with atomic force regulation" Appl. Phys. Lett. 60: (1992).

Van Hulst et al "Near-field optical microscope using a silicon-nitride probe" Appl. Phys. Lett. 62: (1993).

Watson et al "The Radiation Patterns of Dielectric Rods—Experiment Theory" Journal of Applied Physics 19: (1948).

Ager et al., "Multilayer hard carbon films with low wear rates," *Surface and Coatings Technology*, 91:91-94 (1997).

Dai et al. "Nanotubes as nanoprobes in scanning probe microscopy," Nature 384:147-150 (1996).

Diaz, D.C., et al., An Improved Fabrication Technique for Porous Silicon, Rev. Sci. Instrum.64 (2), Feb. 1993, pp. 507-509.

Gomyou, H., et al. Effect of Electrochemical Treatments on the Photoluminescence from Porous Silicon, J. Electrochem. Soc., vol. 139, No. 9, Sep. 1992, pp. L86-L88.

Nossarzewska-Orlowska, E., et al., Photoluminescence Properties of Porous Silicon Prepared by Electrochemical Etching of Si Epitaxial Layer, Acta Physica Polonica A, No.4, vol. 84 (1993), pp. 713-716.

Rasmussen et al. "Fabrication of an All-metal Atomic Force Microscope Probe," IEEE (1997).

Rossow, U., et al., Influence of the Formation Conditions on the Microstructure of Porous Silicon Layers Studied by Spectroscopic Ellipsometry. Thin Solid Films, 255 (1995), pp. 5-8.

Smestad, G., et al., Photovoltaic Response in Electrochemically Prepared Photoluminescent Porous Silicon, Solar Energy Materials and Solar Cells, 26, pp. 277-283 (1992).

Tang, William Chi-Keung, "Electrostatic comb drive for resonant sensor and actuator applications," Abstract of dissertation at the University of California at Berkeley (1990).

* cited by examiner directed from light source 180

SCANNING PROBE MICROSCOPE ASSEMBLY

The present invention relates generally to spectrophotometry, near-field microscopy, and scanning probe microscopy. Specifically, it relates to a scanning probe microscope assembly and corresponding method for making spectrophotometric and near-field measurements in addition to conventional scanning probe measurements.

BACKGROUND OF THE INVENTION

In the past, near-field optical microscopes, such as those described in U.S. Pat. No. 4,604,520, have incorporated spectrophotometer in order to obtain information about the composition of the specimen being examined. However, they are plagued by the extremely slow rate at which the specimen area can be scanned. This problem has severely limited the use of near-field optical microscopes and spectrophotometer for commercially important applications in the biological and industrial fields. In addition, near-field optical microscopes can not achieve the resolution of scanning probe microscopes.

On the other hand conventional scanning probe microscopes, such as scanning tunneling microscopes and atomic force microscopes, have been able to make only limited determinations of the constituents of an object under inspection. Moreover, these conventional scanning probe microscopes cannot define the structure of the object below its surface and cannot define with fine resolution pits, walls, projections, and other structures which prevent the end of the probe tip from coming close enough to the object in these areas for accurate inspection by conventional scanning probe microscopy.

U.S. Pat. No. 5,319,977 describes a scanning probe microscope that utilizes the probe tip to make acoustic microscopy measurements and either atomic force microscopy (AFM) measurements or scanning tunneling microscopy (STM) measurements during the same scanning sequence. The resolution of acoustic microscopy is however rather low in comparison to AFM, STM, or near-field optical microscopy. Moreover, as with conventional scanning probe microscopes, the scanning probe microscope described in U.S. Pat. No. 5,319,977 cannot define those types of structures which prevent the end of the probe tip from coming close enough to the object for accurate inspection.

Furthermore, many objects exhibit areas of varying composition and conductivity. For example, the surface of a semiconductor may change from being conductive to insulative as a function of position. However, no scanning probe microscopes currently exist which are capable of making STM, AFM, near-field optical microscopy, and spectrophotometric measurements during the same scanning sequence in order to properly image and identify such an object.

Moreover, in the past microscope systems for Confocal or Scanning Probe Microscopy have been limited in the tools available for manipulating the 2D, 3D and volume image characteristics they generate.

In addition, they have been limited in the ability (particularly in Scanning Probe Microscopy) to make accurate measurements in x,y, and z directions. In particular it is useful to have accurate position feedback when operating a Scanning Probe Microscope in order to close the control loop in positioning and repositioning the Scanning Probe.

Furthermore the collection of sectional data in volume confocal microscopy has taken substantial amounts of time making some measurements of time varying specimens difficult or impossible.

SUMMARY OF THE INVENTION

The foregoing problems are solved by a scanning probe microscope assembly that has an AFM mode, an STM mode, a near-field spectrophotometry mode, a near-field optical mode, and a hardness testing mode for examining an object.

The scanning probe microscope assembly includes a probe having a base. The probe also includes a cantilever connected to the base, a tip connected to the cantilever, and a clamp connected to the base.

The scanning probe microscope assembly is configured to induce atomic force interaction between the tip and the object and to detect deflection of the cantilever due to the atomic force interaction during the AFM.

The scanning probe microscope assembly is also configured to induce and detect a tunneling current between the tip and the object during the STM mode. During the STM mode, the cantilever is held rigid with respect to the base.

The scanning probe microscope assembly includes a spectrophotometer which has a light source optically coupled to the tip. The light source is controlled to provide light to the tip during the spectrophotometry mode. The tip is shaped so that it emits the provided light at the sharp end of the tip. The emitted light then optically interacts with the object. The spectrophotometer includes a photodetector for detecting light that results from the emitted light optically interacting with the object in order to make spectrophotometric measurements of the detected light.

The scanning probe microscope assembly is also configured to rotationally polarize the light provided by the light source of the spectrophotometer during the near-field mode. The scanning probe microscope assembly identifies deep surface features based on the light detected by the photodetector that results from the rotationally polarized light being emitted by the tip and optically interacting with the object.

The scanning probe microscope assembly is also configured to direct the tip to penetrate the object at a specific point with a predefined known force. The light source is controlled to provide light to the tip during the hardness testing mode before and while the tip penetrates the object. The photodetector detects the light that results from the emitted light optically interacting with the object before and while the tip penetrates the object. The scanning probe microscope assembly compares the resulting light detected before the tip penetrates the object with the resulting light detected while the tip penetrates the object to determine the hardness of the object.

BRIEF DESCRIPTION OF THE DRAWINGS

The invention will be more readily apparent from the following detailed description and appended claims when taken in conjunction with the drawings, in which:

FIG. 12b shows the operation of the mode shifter and lens of FIG. 12a;

DESCRIPTION OF THE FIRST EMBODIMENT

Figure 1:
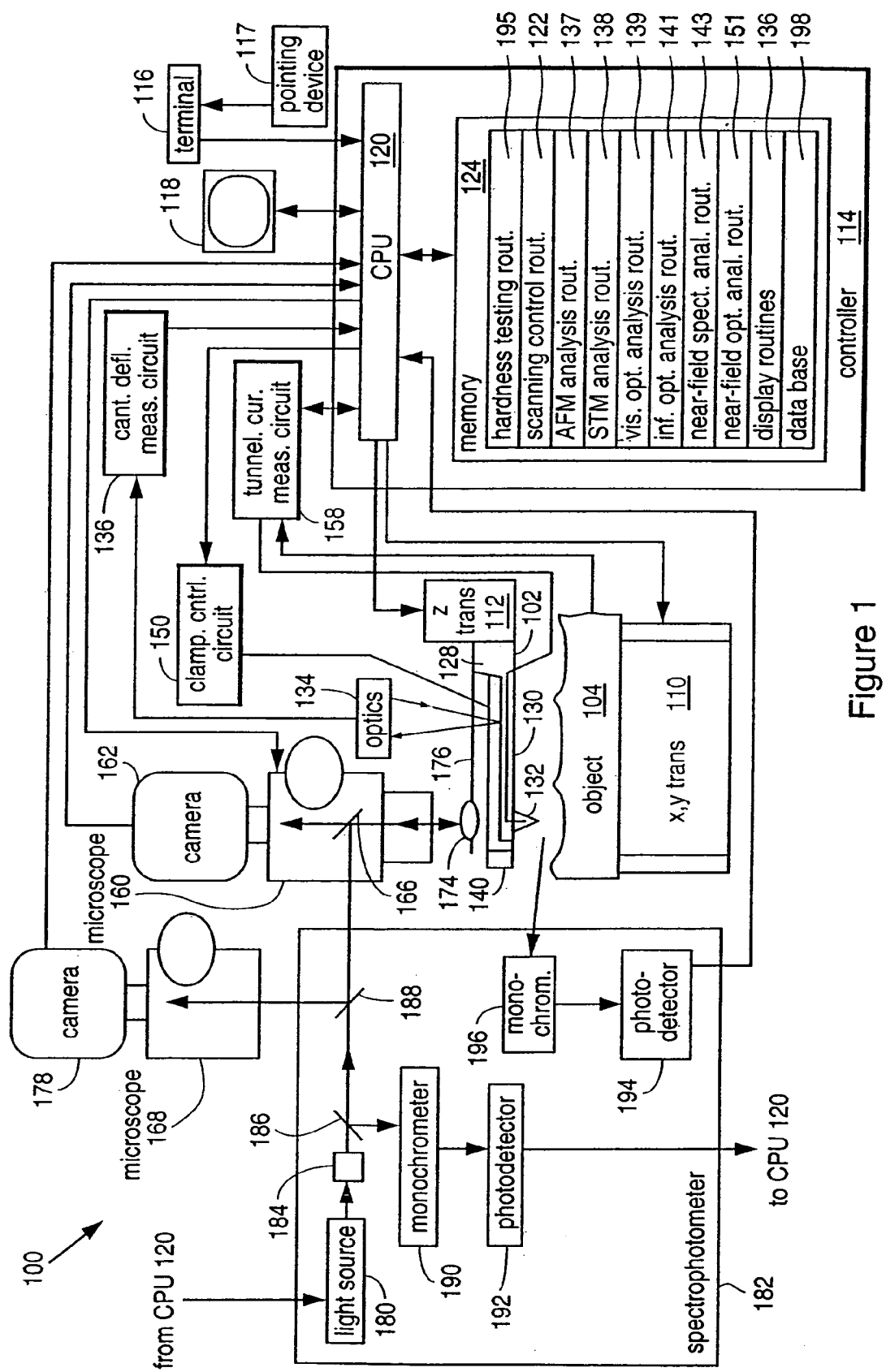
FIG. 1 shows a conceptual view of a scanning probe microscope assembly in accordance with the present invention.

Referring to FIG. 1, there is shown a conceptual diagram of one embodiment of a scanning probe microscope assembly 100 in accordance with the present invention.

A probe 102 is used to scan the surface of an object 104 in variety of measurement modes, as will be discussed shortly. In the preferred embodiment, the surface of the object 104 is scanned by probe 102 using a conventional piezoelectric XY translator 110 to move the object 104 along the X and Y axes and a conventional piezoelectric Z translator 112 to move the probe 102 along the Z axis. However, those skilled in the art will appreciate that a piezoelectric XYZ translator may be used instead to move the object 104 along the X, Y, and Z axes while the probe 102 remains stationary. Alternatively, a piezoelectric XYZ translator may be used to move the probe 102 along the X, Y, and Z axes while the object 104 remains stationary.

Scanning is controlled by controller or computer 114 based on inputs received from the control terminal 116. During scanning, controller 114 analyzes measurement data and displays measurement information on display monitor 118.

Atomic Force Microscopy Mode

Scanning probe microscope assembly 100 is configured to perform atomic force microscopy (AFM). As will be explained later, the AFM mode may occur when the user has selected the AFM mode with the control terminal 116 and also issues with the control terminal 116 a high magnification zoom control signal received by the CPU 120 for a high magnification scan of the object 104. The scanning control routine 122 stored in the memory 124 and run on the CPU 120 then generates scanning control signals outputted by the CPU 120 for controlling the XY and Z translators 110 and 112 to position probe 102 over the surface of the object 104 for AFM measurements.

Probe 102 includes a base 128 coupled to the Z translator 112, a cantilever 130 integrally connected to the base 128, and a sharp projecting tip 132 integrally connected to the cantilever 130. The scanning control signals generated by the scanning control routine 122 control the XY and Z translators 110 and 112 so that tip 132 is positioned in close proximity to or in contact with the object 104 depending on what type of force interaction between the tip 132 and the object 104 is desired. As a result, the cantilever 130 will be deflected due to a non-optical interaction in the form of an atomic force interaction between the tip 132 and the object 104. As those skilled in the art know, this atomic force interaction may be due to Van der Waals forces, magnetic forces, electrostatic forces, lateral forces, or other related forces.

The deflection of the cantilever 130 representing the atomic force interaction between the tip 132 and the object 104 is optically detected by conventional optics 134. The conventional deflection measurement circuit 136 is coupled to the optics 134. It measures the optically detected deflection and outputs a deflection measurement signal containing data representing the measured deflection. The measured deflection also corresponds to the topography of the object. Thus, the optics 134 and the deflection measurement circuit 135 serve as a cantilever deflection measurer. Those skilled in the art will appreciate that other types of systems may be used to measure deflection of the cantilever 130.

The deflection measurement signal is provided to the CPU 120. The data contained by the signal is analyzed and processed by the AFM analysis routine 137 to produce AFM image data representing a high magnification (or nanoview) image of the topography of the object 104. The display routines 136 then formats the AFM image data, in the way described later, and the CPU 120 provides it to the display monitor 118 for display. The routines 136 and 137 are both stored in the memory 124 and run on the CPU 120.

Scanning Tunneling Microscopy Mode

The scanning probe microscope assembly 100 of FIG. 1 is configured also to perform scanning tunneling microscopy (STM). Like the AFM mode, the STM mode may occur when the user selects with the control terminal 116 the STM mode and also issues with control terminal 116 a high magnification zoom control signal received by the CPU 120 for a high magnification scan of the object 104. During this scan, the scanning control routine 122 generates scanning control signals outputted by the CPU 120 for controlling the XY and Z translators 110 and 112 to position probe 102 over the surface of the object 104 for STM measurements.

Figure 2A:
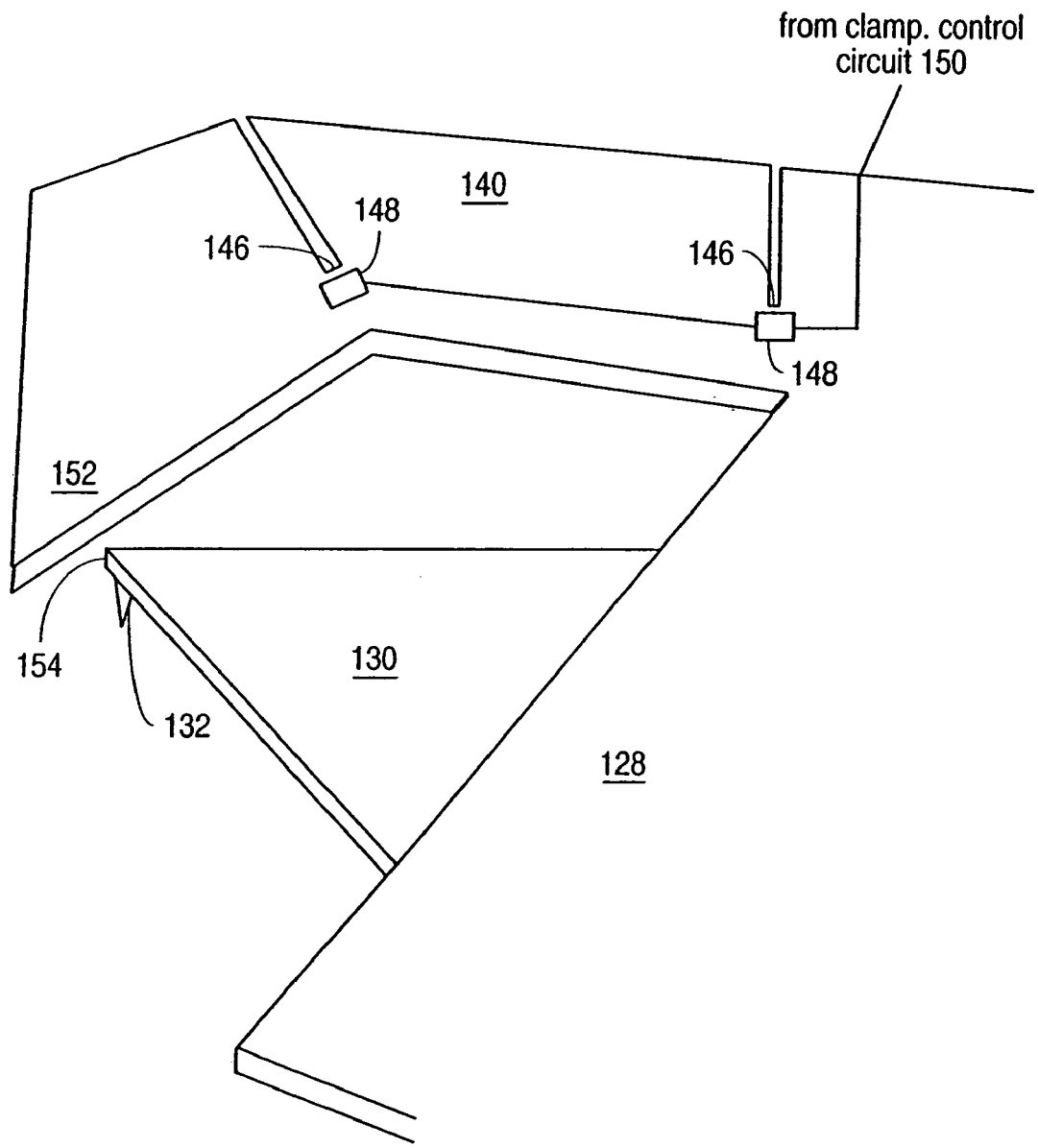
FIGS. 2a and 2b show embodiments of a clamping structure for holding rigid the cantilever of the probe of the scanning probe microscope assembly of FIG. 1 during a scanning tunneling measurement (STM) mode.

Referring to FIG. 2a, probe 102 includes, in addition to the base 128, the cantilever 130, and the tip 132, a clamp in the form of a clamping arm 140 integrally connected to the base 128. The lens system 174 and the lens system support 176 of the probe 102, which are shown in FIG. 2c and described later, are not shown in FIG. 2a for ease of illustration. The clamping arm 140 is L-shaped and extends out from the base 128 past and adjacent to the free end 142 of the cantilever 130. The clamping arm 140 has slots 144 which form action joints 146 at the closed ends of the slots 144.

In one embodiment, heating elements 148 are disposed on the clamping arm 140 at the action joints 146, as shown in FIG. 2a. Referring to FIG. 1, when the user selects the STM mode with the control terminal 116, the scanning control routine 122 generates a clamping control signal received by the clamping control circuit 150. In response, the clamping control circuit 150 generates clamping arm movement signal provided to the heating elements 148 shown in FIG. 2a. The heating elements 148 are responsive to the clamping arm movement signal and heat the action joints 146 so that the clamping arm 140 thermally expands at the action joints 146 and the free end 152 of the clamping arm 140 moves in and presses firmly against the free end 154 of the cantilever 130. As a result, the cantilever 130 in the STM mode is immobilized and held rigidly against the clamping arm 140 so that STM can be performed with tip 132, as will be described shortly.

Figure 2B:
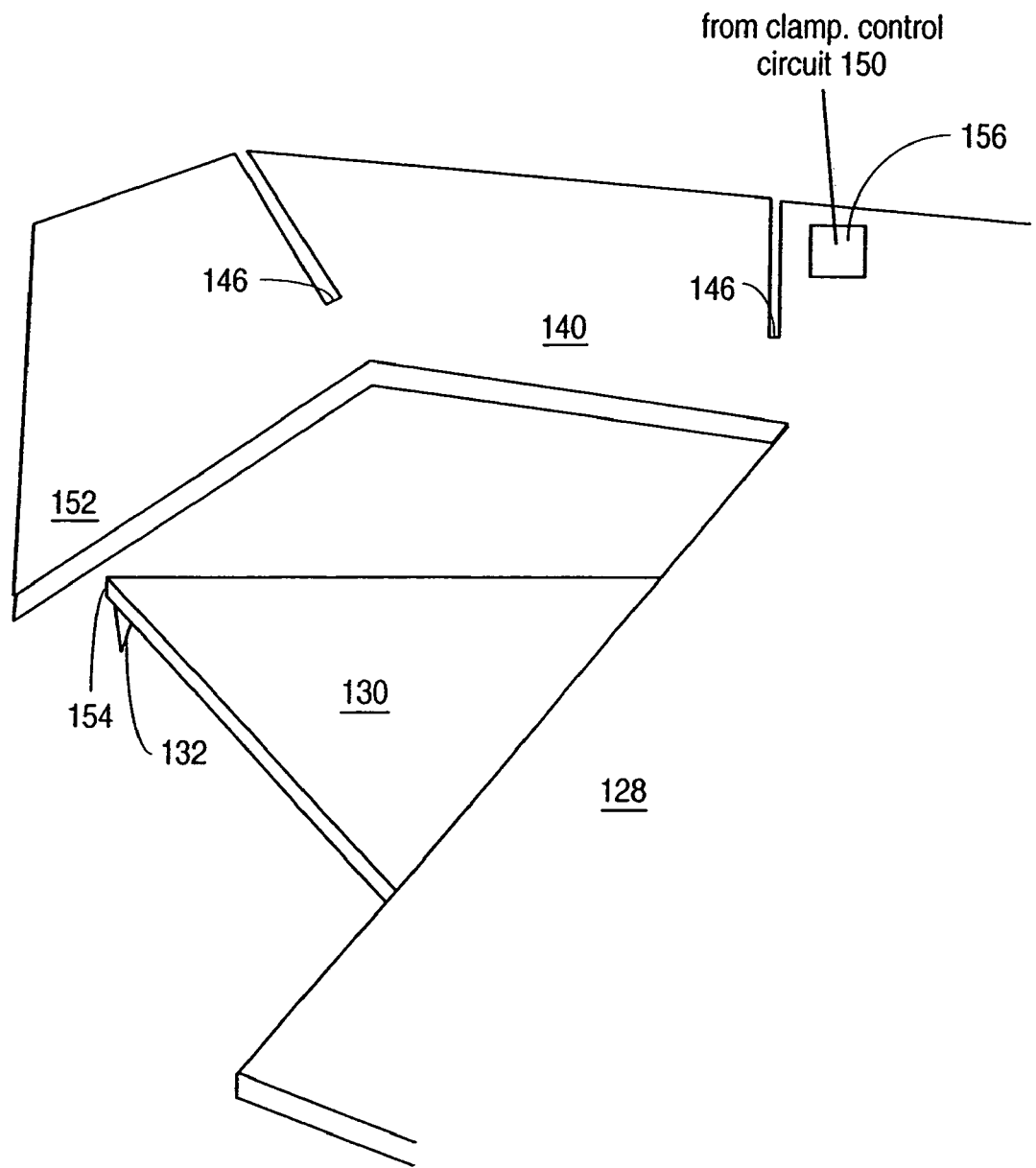
Figure 2C:
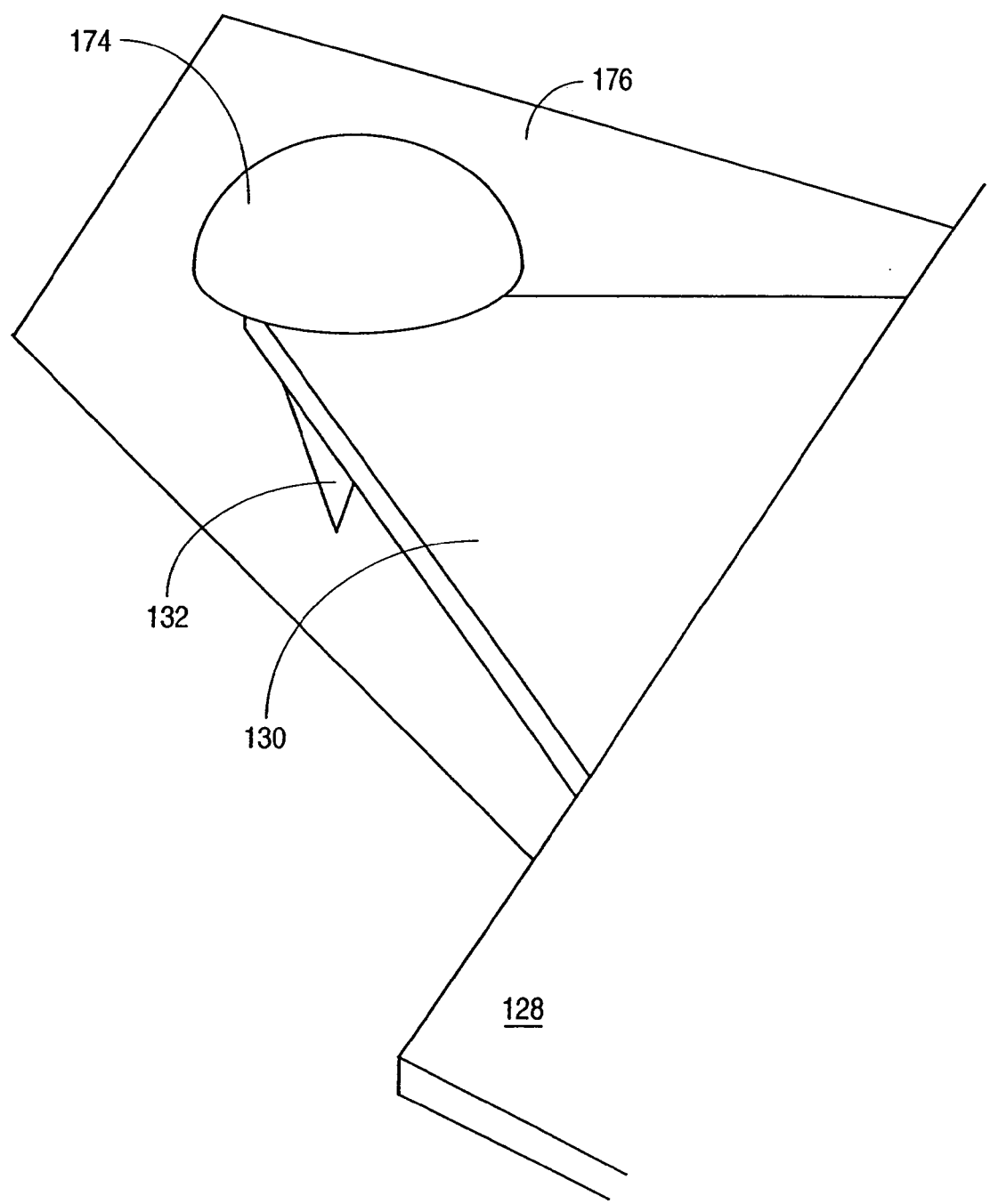
FIG. 2c shows the probe of the scanning probe microscope assembly of FIG. 2a or 2b with an attached refractive lens over the tip of the probe.

Alternatively, an electrode 156 may be fixed to the clamping arm 140, as shown in FIG. 2b. In response to the clamping arm movement signal provided by the clamping control circuit 150 of FIG. 1, the electrode 156 applies an electrostatic charge to the clamping arm 140. As in the embodiment of FIG. 2a, the clamping arm 140 expands at the action joints 146 so that the free end 152 of the clamping arm 140 moves in and presses against the free end 154 of the cantilever 132.

Figure 3A:
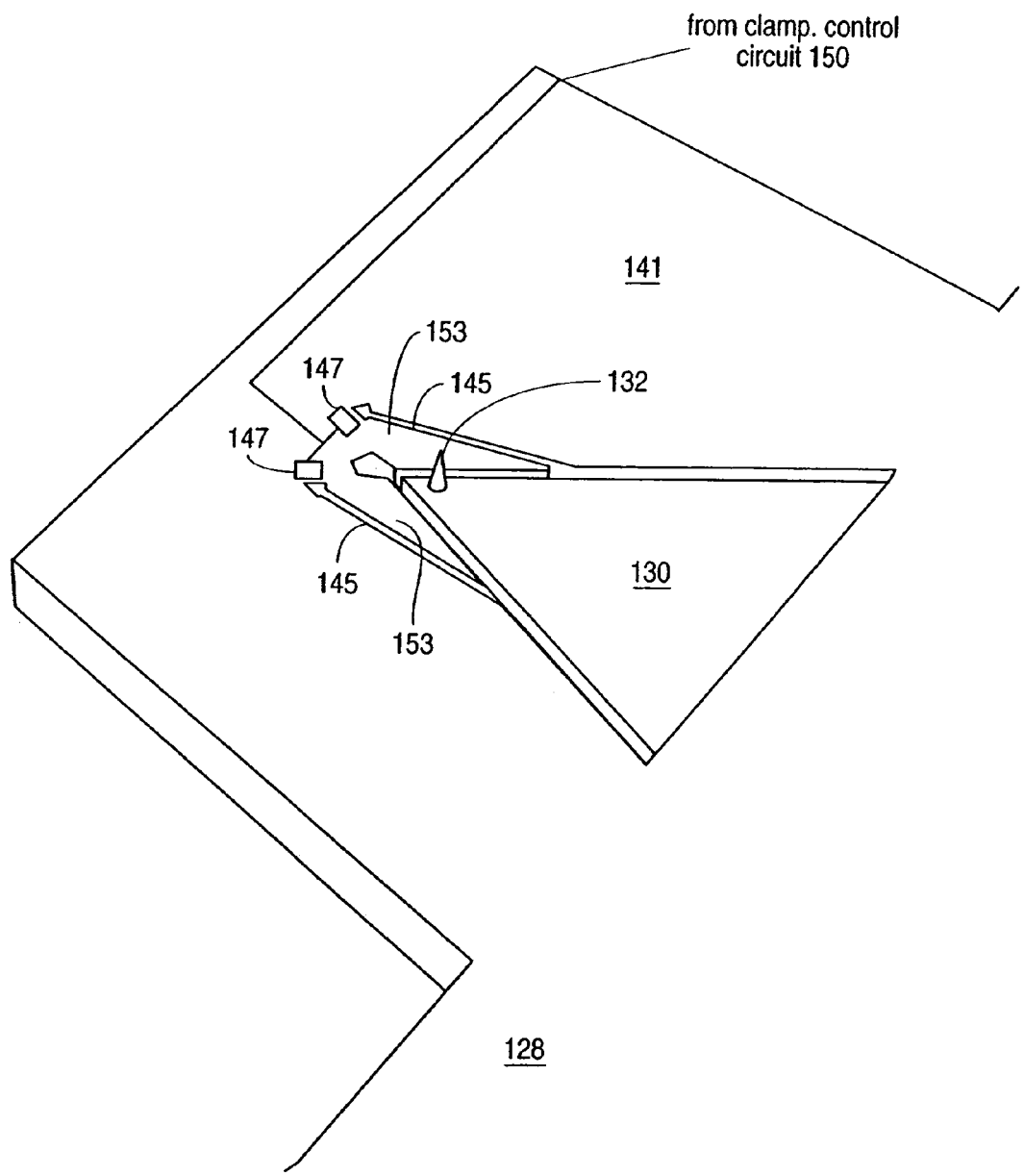
FIGS. 3a and 3b show still other embodiments of a clamping structure for holding rigid the cantilever of the scanning probe microscope assembly of FIG. 1 during the STM mode.

FIG. 3a shows an alternative clamp in the form of a clamping structure 141 that is integrally formed with the base 128 and surrounds the cantilever 130. The clamping structure 141 has slots 145 which form action joints 147 at the closed ends of the slots 145.

Similar to the embodiment of FIG. 2a, heating elements 149 are disposed on the clamping structure 141 at the action joints 147. When the user has selected the STM mode, the clamping control circuit 150 provides a clamping structure movement signal to the heating elements 149. The heating elements 149 heat the action joints 147 so that the clamping structure 141 expands at the action joints 147 and the clamping arms 153 of the clamping structure 141 move in and press firmly against the sides of the cantilever 130.

Figure 3B:
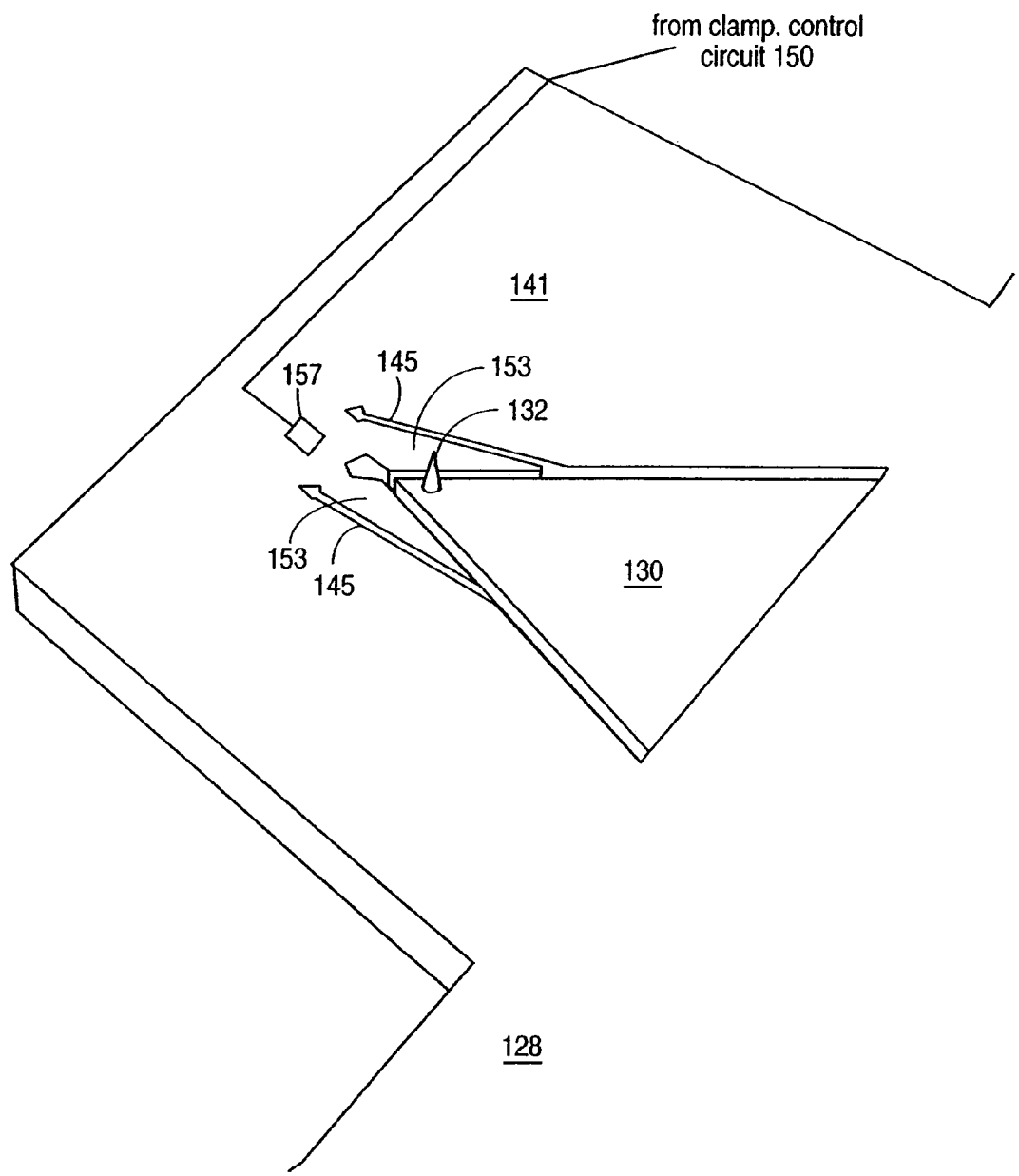

Alternatively, an electrode 157 may be fixed to the clamping structure 141, as shown in FIG. 3b. Similar to the embodiment of FIG. 2b, the electrode 157 applies an electrostatic charge to the clamping structure 141 in response to the clamping structure movement signal provided by the clamping control circuit 150. Like in the embodiment of FIG. 4, the clamping structure 141 expands at the action joints 147 and the clamping arms 153 move in and press against the sides of the cantilever 130.

Figure 3C:
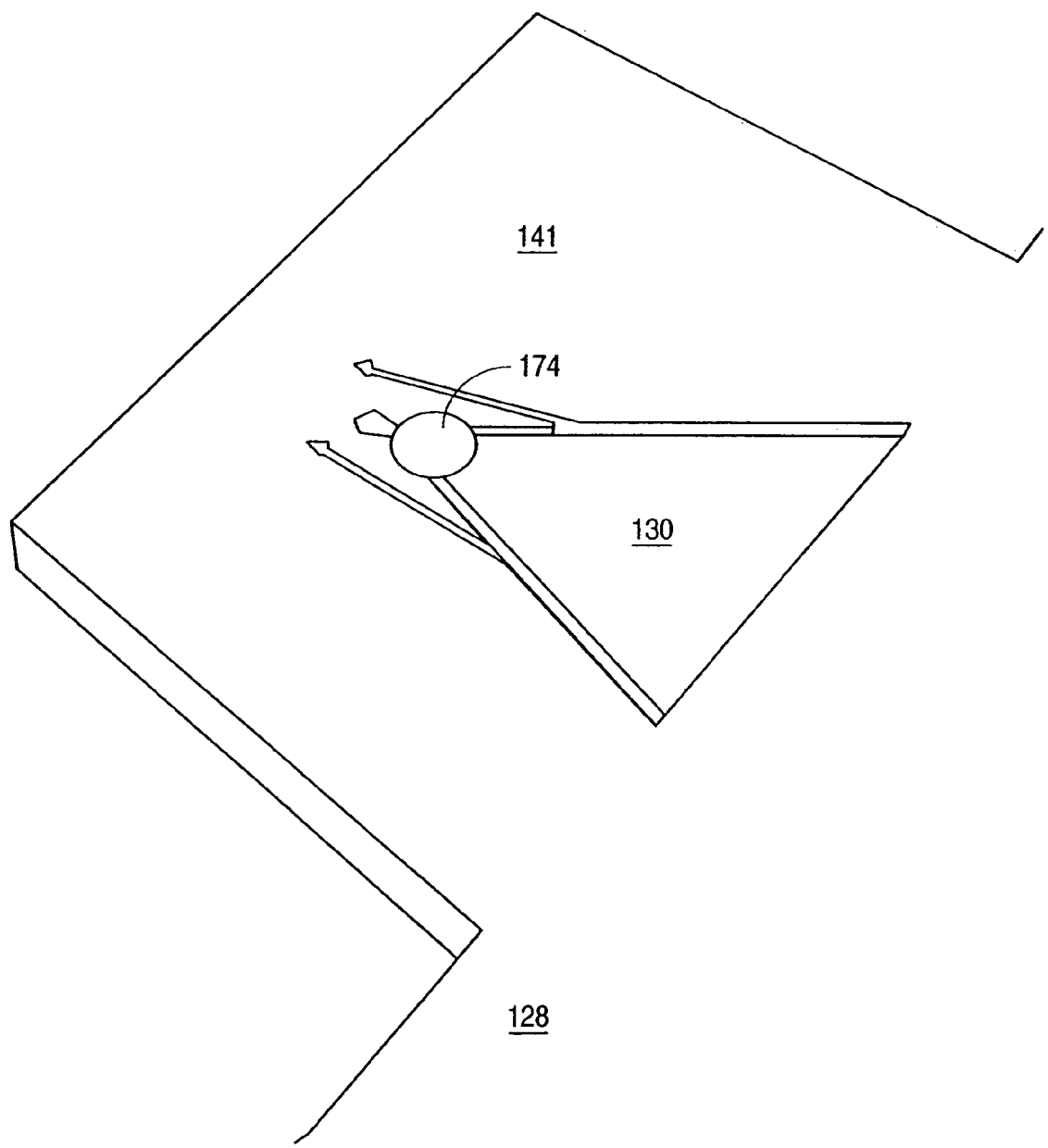
FIG. 3c shows the probe of the scanning probe microscope assembly of FIG. 3a or 3b with an attached refractive lens over the tip of the probe.

As shown in FIG. 3c, the clamping structure 141 of FIGS. 3a and 3b serves as a shelf and support for the lens 174 which may be independent from or integrally formed with the clamping structure 141. The optical operation of the lens 174 will be described later.

Figure 4A:
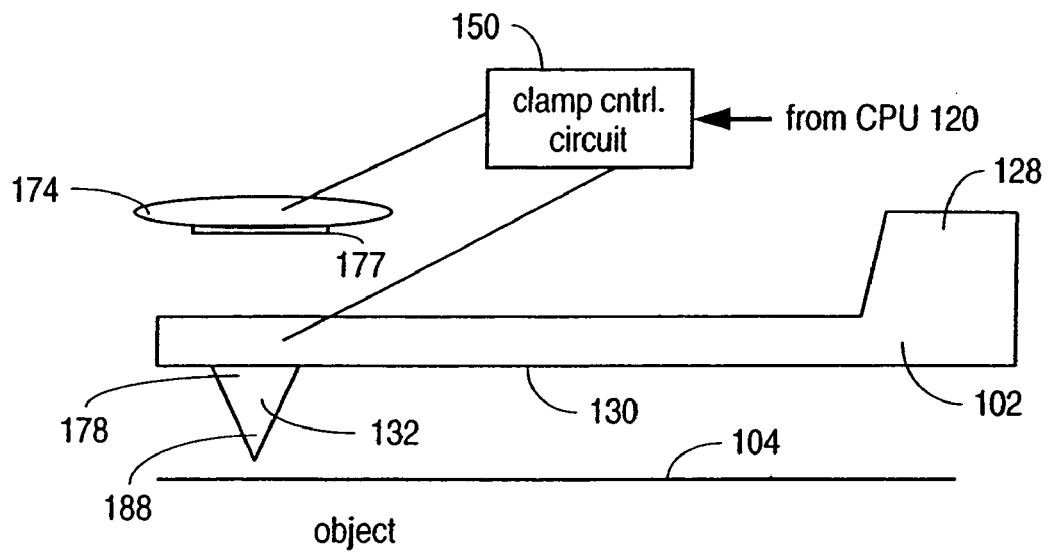
FIGS. 4a and 4b show further embodiments of a clamping device for holding rigid the cantilever of the scanning probe microscope assembly of FIG. 1 during the STM mode.
Figure 4B:
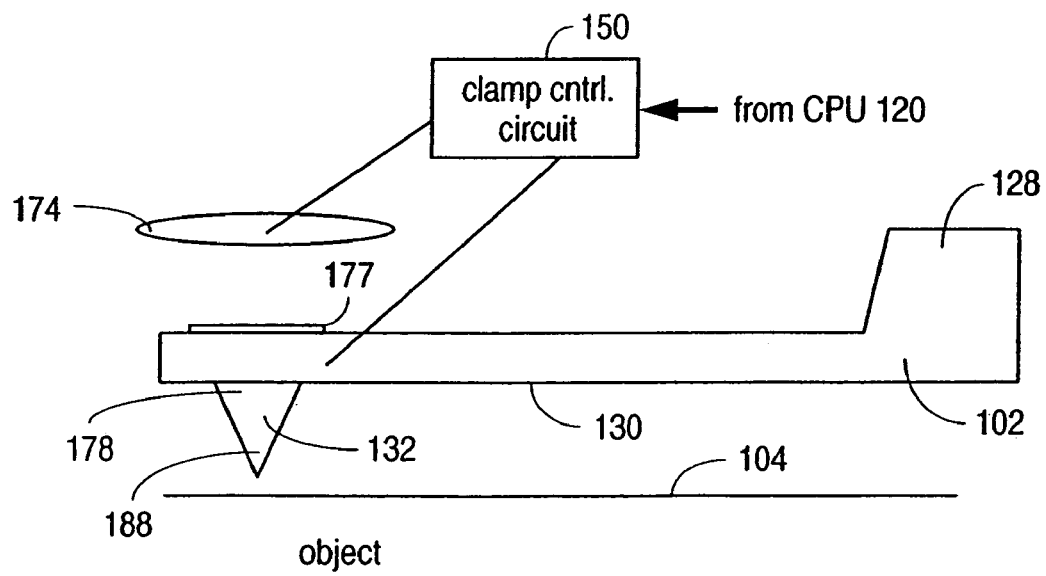

Referring to FIGS. 4a and 4b, the lens 174 can be used to provide clamping of the cantilever 130 alone or in conjunction with the embodiments of FIGS. 3a and 3b. As shown in FIGS. 4a and 4b, an optically transparent insulating layer 177, such as silicon dioxide, is formed on the lower surface of the lens 174 (or similar support member) or the upper surface of the cantilever 130. In the STM mode, the clamping control circuit 150 applies an appropriate voltage between the lens 174 and the cantilever 130 so as to form a capacitive structure which electrostatically clamps the motion of the cantilever 130. Those skilled in the art will appreciate that this configuration can additionally be used to damp, drive, or detect the motion of the cantilever 130 depending on which of the modes of operation described herein is being employed by scanning probe microscope 100.

Figure 5:
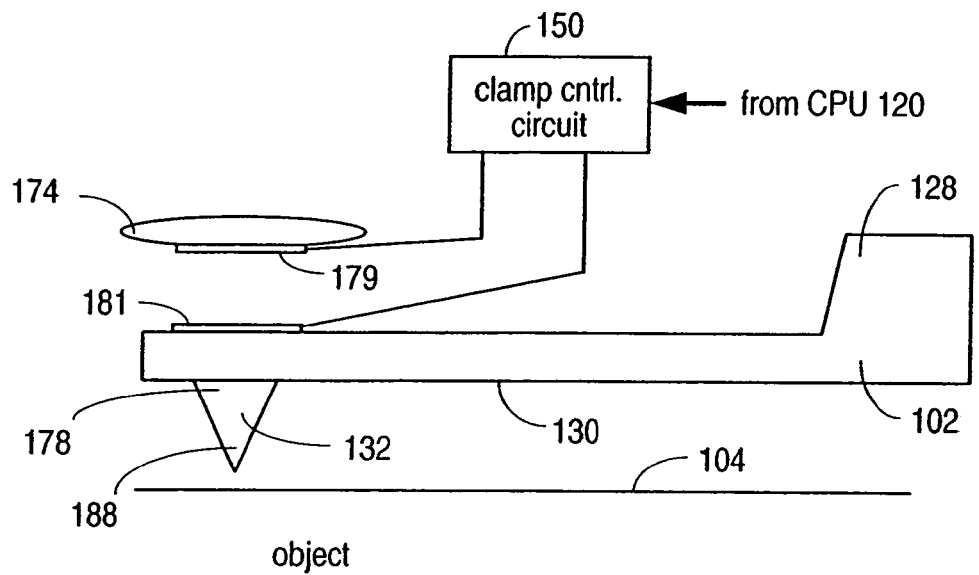
FIG. 5 shows yet another embodiment of a clamping device for holding rigid the cantilever of the scanning probe microscope assembly of FIG. 1 during the STM mode.

Alternatively, optically transparent and conductive coil patterns 179 and 181 are respectively formed on the lower surface of lens 174 and the upper surface of the cantilever 130, as shown in FIG. 5. The coil patterns 179 and 181 are formed from Indium Tin Oxide. In the STM mode, the clamping control circuit 150 applies voltages to the coil patterns 179 and 181 so that their currents are opposite in direction. As a result, an attractive magnetic field is created which immobilizes (i.e., clamps) the cantilever 130. Those skilled in the art will appreciate that one of the coil patterns 179 or 181 may be replaced with a permanent magnet formed with a thin film of samarium cobalt or other permanently magnetizable material. Moreover, this arrangement may also be used to damp, drive, or detect the motion of cantilever depending on which of the modes of operation described herein is being employed by scanning probe microscope 100.

Referring back to FIG. 1, in the STM mode, the scanning control signals generated by the scanning control routine 122 control the XY and Z translators 110 and 112 so that tip 132 is positioned in close proximity to the object 104. Then, scanning control routine 122 generates tunneling control signals provided to the tunneling current measurement circuit 158. In response, the tunneling current measurement circuit 158 generates a voltage signal applied to the tip 132 of probe 102.

Since tip 132 is coated with a conductive layer, a non-optical interaction in the form of a tunneling current is produced between the tip 132 and the object 104. The tunneling current in the object 104 is detected and measured by the tunneling current measurement circuit 158. In response, the tunneling current measurement circuit 158 outputs a tunneling current measurement signal containing data representing the measured tunneling current. The measured tunneling current corresponds to the topography of the object.

Alternatively, those skilled in the art will appreciate that the tunneling current may be kept fixed by changing the position of tip 132 with the Z axis translator 112. The amount of change in position required to keep the tunneling current constant is the measure of topography of the surface.

The tunneling current signal is provided to the CPU 120. The data contained by the signal is analyzed and processed by the STM analysis routine 138 to produce STM image data representing a high magnification (or nanoview) image of the topography of the object 104. The display routines 136 then formats the STM image data, in the way described later, and the CPU 120 provides it to the display monitor 118 for display. The routine 138 is stored in the memory 124 and run on the CPU 120.

Low Magnification Optical Microscopy Mode

Referring again to FIG. 1, scanning probe microscope assembly 100 is configured also to provide conventional, confocal spot scan, or confocal scanning disk optical microscopy. As is explained later, the optical microscopy mode may occur when the user issues with control terminal 116 a low magnification zoom control signal received by the CPU 120 for a low magnification scan of the object 104. During this scan, the scanning control routine 122 generates scanning control signals outputted by the CPU 120 for controlling the XY translator 110 to position probe 102 over the surface of the object 104 for a low magnification optical microscopy measurement. As will be described later, the low magnification optical microscopy mode is used in conjunction with the high magnification AFM or STM modes and the medium magnification optical microscopy mode (discussed later) to provide a continuous zoom display of an image of object 104 on the display monitor 118.

In order to perform low magnification visible optical microscopy, scanning probe microscope assembly 100 includes a conventional, confocal spot scan, or confocal scanning disk visible optical microscope 160 and visible optical camera 162. The visible light source of the microscope 160 illuminates the object 104 with visible light. The portion of visible light which is within the visible field of view of the microscope 160 and reflected by the object 104 and the probe 102 is then received by the microscope 160. This reflected visible light passes through the beam splitter 166 to the filter of the microscope 160 which removes any non-visible components. The filtered visible light is then focused on the camera 162 by the eyepiece (i.e., focusing lens) of microscope 160. The objective of microscope 160 is chosen to provide a numerical aperture in the range of approximately 0.1–0.2 for low magnification (i.e., macroview of) visible images of the object 104.

The camera 162 then converts the focused visible light into a data signal containing data representing the focused visible light. The data contained by the signal is analyzed and processed by the low magnification optical microscopy analysis routine 139 to produce visible image data representing a low magnification (or macroview) visible image of the topography of the object 104. The display routines 136 then formats the visible image data, in the way described later, and the CPU 120 provides it to the display monitor 118 for display. The routine 139 is stored in the memory 124 and run on the CPU 120.

Medium Magnification Optical Microscopy Mode

The scanning probe microscope assembly 100 of FIG. 1 is further configured to provide medium magnification infrared or visible optical microscopy. The medium magnification microscopy mode may occur when the user issues with control terminal 116 a medium magnification zoom control signal received by the CPU 120 for a medium magnification scan of the object 104, as is explained later. During this scan, the scanning control routine 122 generates scanning control signals outputted by the CPU 120 for controlling the XY translator 110 to position probe 102 over the surface of the object 104 for a medium magnification optical microscopy measurement. As was alluded to earlier, the medium magnification optical microscopy mode is used in conjunction with the high magnification AFM or STM mode and the low magnification optical microscopy mode to provide a continuous zoom display of an image of object 104 on the display monitor 118.

In the case where tip 132 is made of a material, such as silicon, which is opaque to visible light, the scanning control routine 122 generates control signals for controlling the light source 180 to provide a wide beam of infrared light. The light source 180 of the spectrophotometer 182 is configured so that the wavelength (i.e., frequency) and beam size of the light that it provides may be varied in ways well known to those skilled in the art. In the preferred embodiment, this light source 180 is variable in wavelength over the range of approximately 6 microns to 200 nm and has a beam size variation ratio of approximately 1000 to 1 so that the beam can be as made as narrow as the base of the tip 132 (down to 1 micron) and as wide as the largest objective in the system (up to 2 cm).

The wide beam of infrared light is directed by the beam splitters 186 and 188 to the beam splitter 166. The beam splitter 166 reflects (i.e., directs) the wide beam of infrared light to the lens system 174.

Figure 6:
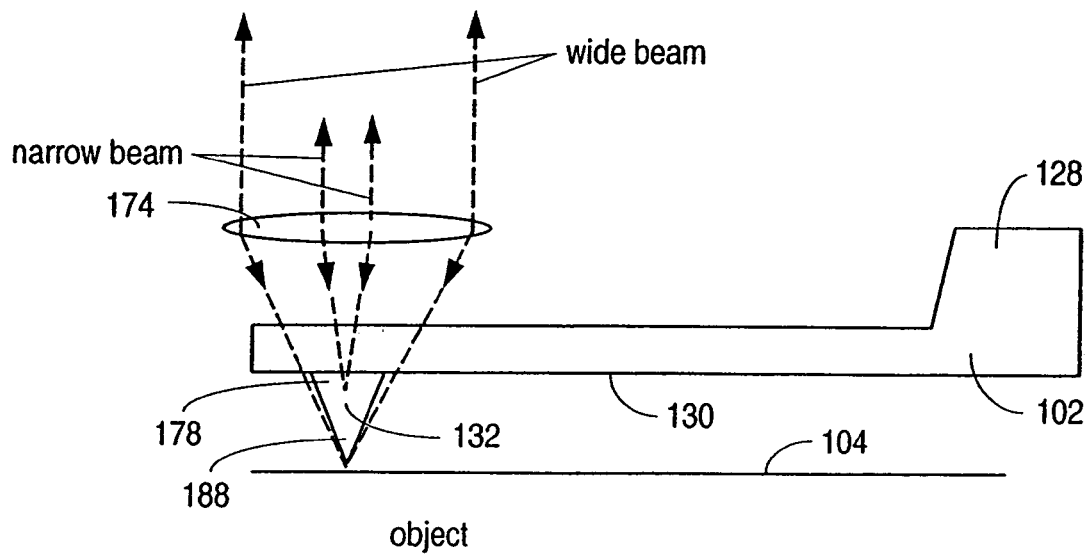
FIG. 6 shows the operation of the lens of FIG. 2c or 3c.

As shown in FIG. 6, the lens system 174 is disposed over the portion of the cantilever 130 connected to the base 128 of the tip 132. For the embodiments of FIGS. 2a and 2b, the lens system 174 is held and supported by the thin lens system support 176, as shown in FIG. 2c. The lens system support 176 is transparent to visible light, is connected to the base 128 of the probe 102, and holds and supports the lens system 174. For ease of illustration, FIG. 2c does not show the clamping arm 140 shown in FIGS. 2a and 2b.

The lens system 174 may be a standard objective arrangement of one or more lenses to form an appropriate tube length or provide the preferred infinity corrected tube length in a manner well known to lens designers. A two lens system may be made by providing a mounting barrel with a partial or complete hole in the thin support structure. Moreover, as those skilled in the art will appreciate, lens system 174 may be a fresnel lens arrangement constructed similar to the fresnel lens 250 shown in FIGS. 11a and 11b.

The lens system support 176 is transparent to visible light and may extend across the entire visible field of the visible optical microscope 160. It may include a cutoff filter such that only visible light may pass through it while infrared light is blocked except in a central area within the lens system 174 where it acts like a field stop (part of standard objective lens design practice and well known in the art) to eliminate extraneous light which would lower contrast in the medium magnification optical mode.

The lens system support 176 may also be an electro-optically adjustable iris, mechanical iris, optically enabled iris, such as a glass assembly made from glass doped everywhere except over lens system 174 which becomes opaque on exposure to UV light from the light source 180, and may be used as a field stop. This is true even when lens system 174 is a fresnel lens arrangement such as that shown in FIGS. 12*a* and 12*b*.

For the embodiments of FIGS. 3*a*, 3*b*, 4*a*, 4*b*, and 5, the lens system 174 and the clamping structure 141 are shown in FIG. 3*c*. The clamping structure 141 serves as a support shelf for lens system 174.

Referring again to FIG. 6, lens system 174 is spaced from the cantilever 130 such that it has a focal length in focus with the surface of the object (and also the sharp end 188 of the tip 132) for the wide beam of infrared light 167 received from the beam splitter 166. The focal length is chosen so that lens system 174 has a numerical aperture in the range of approximately 0.7 to 0.9 to provide medium magnification (i.e., microview of) images of the object 104. Typically, the lens system 174 is disposed above the cantilever 130 in the range of approximately 40 to 4000 microns.

Moreover, lens system 174 occupies only a small area of the visible light field of view of the microscope 160. In particular, lens system 174 has a diameter substantially smaller than the diameter of the objective lens of the microscope 160 shown in FIG. 1 but large enough to allow the wide beam of infrared light to be focused at the surface of the object 104, as shown in FIG. 6. The diameter of lens system 174 must be appropriate for the size of the cantilever 130 and is typically less then 2 mm and is approximately in the range of 100 to 500 microns.

Moreover, FIG. 1 shows the optical path of the cantilever deflection optics 134 traveling through the lens system support 176 but not the lens system 174. However, those skilled in the art will appreciate that the optics 134 may be arranged to have an optical path that travels through the lens system 174.

The wide beam of infrared light focused by the lens system 174 at the surface of the object 104 is reflected by the object 104 back to the lens system 174, as shown in FIG. 6. Referring to FIG. 1, the beam splitters 166 and 188 direct the reflected infrared light to the optics 168. The filter of the optics 168 allows only the wide beam of reflected infrared light to pass which is then focused by the eyepiece (i.e., focusing lens) of the optics 168 on the camera 178.

The camera 178 converts the focused infrared light into an infrared data signal containing data representing the focused infrared light. The data contained by the signal is analyzed and processed by the medium magnification optical microscopy analysis routine 141 to produce infrared image data representing a medium magnification (or microview) image of the topography of the object 104. The display routines 136 then formats the infrared image data, in the way described later, and the CPU 120 provides it to the display monitor 118 for display. The routine 141 is stored in the memory 124 and run on the CPU 120.

Alternatively, when the tip 132 is made of a material, such as silicon nitride, which is transparent to visible light, then lens system 174 may be configured and disposed over the tip 132 so that it has a focal length in focus with the surface of the object (and also the sharp end 188 of the tip 132) for a portion 165 of the visible light 164 provided by the visible light source of the microscope 160. Again, the focal length is chosen so that lens system 174 has a numerical aperture in the range of approximately 0.7 to 0.9 to provide medium magnification (i.e., microview on images of the object 104.

The portion 165 of visible light focused by the lens system 174 at the surface of the object 104 is reflected by the object 104 back to the lens system 174. From there, it is directed by the beam splitters 166 and 188 to the optics 168. In this case, the filter of the optics 168 allows only the visible light portion to pass through and be focused by the eyepiece of the optics 168 on the camera 178.

The camera 178 converts the focused visible light 165 into a visible data signal containing data representing the focused visible light. Similar to above, the medium magnification optical microscopy analysis routine 141 produces medium magnification visible image data representing a medium magnification (or microview) image of the topography of the object 104 which is then formatted by the display routines 136 and displayed on the display monitor 118.

Near-Field Spectrophotometry Mode

Referring to FIG. 1, scanning probe microscope assembly 100 is configured also to perform near-field spectrophotometry. As explained later, the near-field spectrophotometry mode may occur when the user selects this mode with the control terminal 116 and issues with control terminal 116 the high magnification zoom control signal described earlier. The near-field spectrophotometric measurements may be made in conjunction with AFM and STM measurements during the high magnification scan.

When a near-field spectrophotometric measurement is to be made, scanning control routine 122 will generate scanning control signals outputted by the CPU 120 for controlling the XY and Z translators 110 and 112 to position tip 132 in close proximity to the object 104 for making near-field spectrophotometric measurements. In the preferred embodiment, the sharp end 188 of the tip 132 is placed from the object 104 no further then approximately half of the wavelength of the light provided by the light source 180 for the near-field spectrophotometric mode.

Additionally, scanning control routine 122 generates control signals to control light source 180 to provide a narrow beam of infrared or visible light 185 which is transparent to the probe 102 and the lens system 174. This is done at a variety of chopping frequencies to enable the photodetectors 192 and 194 of the spectrophotometer to discriminate between the detected optical energy due to excitation by the light 185 and detected background energy through lock-in amplification and other noise rejection and amplification methods well known to those in the art. As a result, spectrophotometer 182 may make absorption, Raman, second harmonic, fluorescence, and other well known spectrophotometric measurements of the object 104.

The mechanically rotatable plane polarizer 184 is held stationary in the near-field spectrophotometry mode. The light 185 from the light source 180 is plane polarized by the polarizer 184, passes through the beam splitters 186 and 188, and is directed by the mirror 172 to the lens system 174.

The light 185 is focused by the lens system 174 within the base 178 of the tip 132, as shown in FIG. 6. The tip 132 acts similar to an antenna coupled to a waveguide such that the light 185 focused within the base 178 propagates through the tip 132 and is emitted or guided out at the sharp end 188 of the tip 132. The emitted light 185 optically interacts with the object 104. Since the tip 132 acts as an antenna, the sharp end 188 of the tip 132 captures the resulting light due to the optical interaction of the emitted light with the object 104. This light propagates back through the tip 132 to the lens system 174.

As was just alluded to, tip 132 acts similar to an antenna. This, the propagation in, emission of, and capture of energy in a pyramid shaped antenna is analogous to that of tip 132 when shaped as a cone or tetrahedral. The propagation, emission, and capture of energy in a pyramid shaped antenna is described in *The Radiation Patterns of Dielectric Rods-Experiment and Theory*, by R. B. Watson and C. W. Horton, Journal of Applied Physics, volume 19, pg. 661 (1948) and is expressly incorporated by reference herein.

Specifically, the electrical and magnetic fields at the base 178 of tip 132 are analogous to the following equations which define the electrical and magnetic fields at the base of a pyramid shaped antenna:

$$E_{0'1} = x \cos(\pi y_1/b) \exp(-j(\omega t - k'z_1)),$$

$$H_{0'1} = [y(k'/\omega\mu)\cos(\pi y_1/b) + z(\pi/j\omega\mu b)\sin(\pi y_1/b)] \exp(-j(\omega t - k'$$

where a and b represent the size of the sides of the base of the pyramid shaped antenna, k represents the wave number in a vacuum, and k' represents the wave number in the material of a waveguide connected to the antenna.

The method employed by Watson and Horton prescribes magnetic currents on the two electrical field plane sides of the pyramid shaped antenna and electric currents on the two magnetic field plane sides. The emitted and captured optical energy is then found by applying a Fresnel-Huygens method to obtain the radiation fields produced by these currents. Adopting spherical geometry, with the z axis corresponding to $\theta=0$, the following fields are obtained:

$$E_r = 0,$$

$$E_\theta = (jk \cos \theta) P_1(\theta, \phi)$$

$$E_\phi = (-jk \sin \phi \cos \theta) P_1(\theta, \phi)$$

where $$P_1(\theta, \phi) = M_0 \cos[(ka/2)\sin \theta \cos \phi] \cdot I_1 \cdot I_2$$

$$I_1 = 2 \frac{b}{\pi} \frac{(\pi/2)^2 \cos((kb/2)\sin\theta\sin\phi)}{(\pi/2)^2 - ((kb/2)\sin\theta\sin\phi)^2}$$

$$I_2 = \frac{1}{2k}(A - jB),$$

$$A = \frac{1}{n - \cos\theta}[1 - \cos[(n + \cos\theta)kl]] + \frac{1}{n + \cos\theta}[1 - \cos[(n + \cos\theta)kl]]$$

$$B = \frac{\sin[(n - \cos\theta)kl]}{n - \cos\theta} - \frac{\sin[(n + \cos\theta)kl]}{n + \cos\theta}$$

Here n=k/k' and l is the length of the pyramid shaped antenna in the z direction.

Figure 7A:
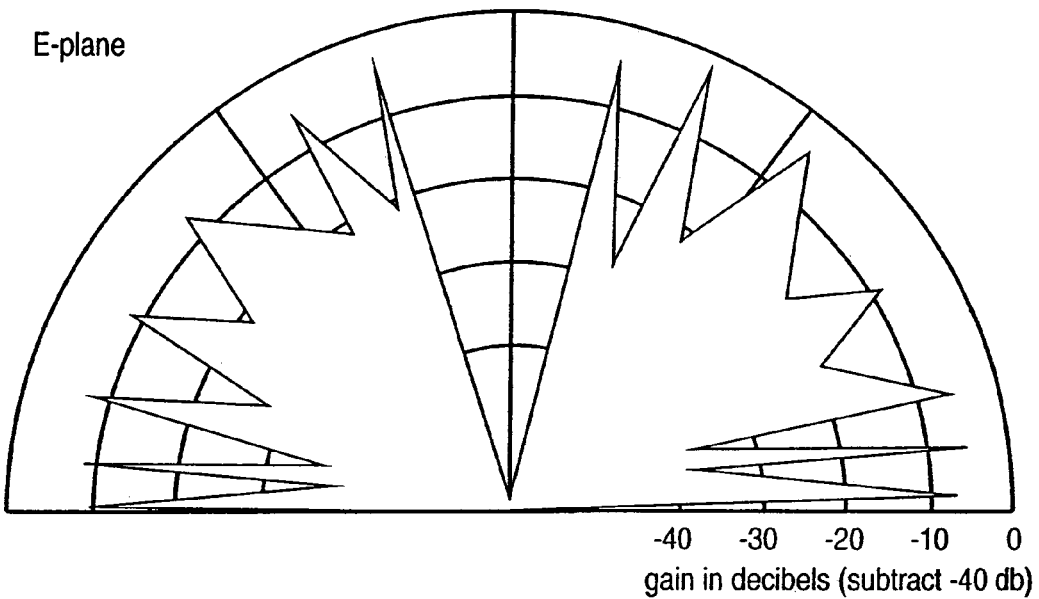
FIGS. 7a and 7b provide electrical field plane and magnetic field plane polar plots of optical energy emissions by the tip of the scanning probe microscope assembly of FIG. 1.
Figure 7B:
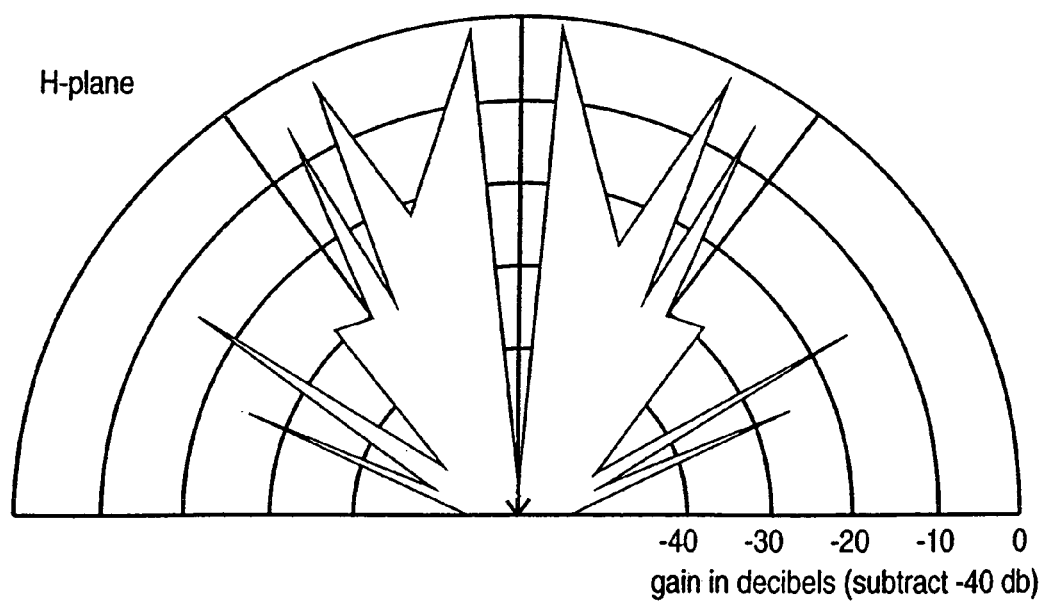

It is clear from the foregoing discussion, that the propagation, emission, and capture of energy described by these equations is analogous to that which occurs in tip 132. FIGS. 7a and 7b provide electrical field plane and magnetic field plane polar plots of optical energy emissions by tip 132 in accordance with the above equations.

Referring again to FIG. 1, from the lens system 174, the captured light 185 is directed by the mirror 166 through the beam splitters 188 and 186 to the monochromator 190. In the preferred embodiment, the monochromator 190 is conventionally configured to separate the captured light into an array of its constituent wavelengths. The photodetector 192 includes an array of photodiodes or photomultipliers for detecting emissions at the various wavelengths. Alternatively, the monochromator 190 may be conventionally configured to sequentially separate the wavelengths of the captured light and the photodetector 192 may be conventionally configured to sequentially scan the spectrum of wavelengths.

The photodetector 192 converts the detected optical energy (i.e., detected wavelengths) into a detection signal containing data representing the detected optical energy. The data contained by the signal is analyzed and processed by the near-field spectrophotometry analysis routine 143 to produce data representing information on the composition of the object 104. Depending on the particular wavelength of the light 185 provided by the light source 180, the optical interaction between the tip 132 and the object may involve reflection, absorption, photoemission (including fluorescence, Raman, and second harmonic), and/or other types of well known interactions.

As was indicated earlier, the scanning control routine 122 generates control signals for varying the wavelength of the light provided by the light source 180. As a result, the above described interactions may be detected by the photodetector 192 and analyzed by the analysis routine 143 to produce data representing information on the composition of the object 104. The data is then formatted for display, in the way described later, by the display routines 136 and provided to the display monitor 119 for display of this information.

Alternatively, or in conjunction with the near-field spectrophotometric arrangement described above, scanning probe microscope assembly 100 of FIG. 1 may also perform near-field spectrophotometry by detecting light energy from the near-field with the photodetector 194 at a distance which is many wavelengths away from the tip 132. In this arrangement, optical interaction between tip 132 and the object 104 is induced in the same way as was described earlier. However, the resulting photoemissive energy (such as fluorescence, Raman, and second harmonic) is detected by the photodetector 194 after the monochromator 196 has separated the photoemissive light into its constituent wavelengths. As with the monochromator 190, the monochromator 196 is preferably configured to separate the photoemissive light into an array of its constituent wavelengths and the photodetector 194 includes an array of photodiodes or photomultipliers for detecting the array of wavelengths.

Photodetector 194 converts the detected optical energy into a detection signal containing data representing the detected optical energy. The data contained by the detection signal is provided to the CPU 120 and analyzed and processed by the near-field spectrophotometry analysis routine 147 to produce data representing information on the composition of the object 104. This data is formatted by the display routines 136, in the way described later, and provided to the display monitor 119 for display of the information.

Near-Field Optical Microscopy Mode

Turning again to FIG. 1, scanning probe microscope assembly 100 is also configured to perform near-field optical microscopy to define deep surface features of the object 104 which cannot be detected through the AFM or STM mode. Like the near-field spectrophotometry mode, the near-field optical microscopy mode may occur when the user selects this mode with the control terminal 116 and issues with control terminal 116 the high magnification zoom control signal described earlier. The near-field optical microscopy measurements may be made in conjunction with AFM, STM, and spectrophotometric measurements during the high magnification scan.

As was just alluded to, this mode is used when the AFM or STM measurements indicate that tip 132 is not directly over a structure of the object 104 and is instead directly over a deep surface feature, such as a pit, wall, or projection. When this occurs, optical interaction between tip 132 and the object 104 is induced in the same way as was described earlier for the near-field spectrophotometry mode except that scanning control routine 122 issues a control signal for controlling the rotatable plane polarizer 184 to rotate during this mode. As a result, the light is rotationally plane polarized (i.e., the polarization state of the light provided by the light source 180 is continuously changed) during the near-field optical mode.

The optical energy pattern detected by the photodetector 192 or 194 during this rotation is recorded by the near-field optical analysis routine 151. The routine 151 then compares the recorded optical energy pattern with predefined optical energy patterns stored in the data base 198 of the memory 124 which correspond to various types of deep surface features. This comparison is made in order to determine what is directly underneath or near tip 132. The analysis routine 151 then generates image data representing an image of the determined deep surface feature and the display routines 136 formats the data for display of this image on the display monitor 118.

Moreover, this type of near-field microscopy may be used to examine tip 132 in a tip testing mode. This is done by placing tip 132 over a uniform and already defined hole in an object. By comparing the optical energy pattern detected by the photodetector 192 or 194 with a predefined optical energy pattern stored in the data base 198 for a non-defective tip, the analysis routine 151 can determine whether tip 132 is defective or not.

Alternatively, rather than utilizing the rotatable linear polarizer 184, those skilled in the art will recognize that scanning probe microscope assembly 100 may be configured so that the plane polarizer 184 is stationary and probe 102 is rotated by rotating the Z translator 112 in a conventional manner during this mode. Alternatively, object 104 may be rotated by rotating the XY translator 110 in a conventional manner during this mode. As a result, an optical energy pattern detected by the photodetector 192 or 194 during such rotation can be compared with predefined optical energy patterns stored in the data base 198.

Hardness Testing Mode

The scanning probe microscope assembly 100 of FIG. 1 is also configured to perform hardness testing of object 104. The hardness testing mode may also occur when the user selects this mode with the control terminal 116 and issues with control terminal 116 the high magnification zoom control signal. The hardness testing measurements may also be made in conjunction with AFM, STM, spectrophotometric, and near-field optical measurements during the high magnification scan.

In the hardness testing mode, the scanning control routine 122 controls the making of a near-field spectrophotometric measurement in the way described earlier at a particular location of the object 104. A detection signal is provided to the CPU 120 by the photodetector 192 or 194 and the hardness testing analysis routine 195 records in the data base 198 the data of the detection signal representing the optical energy detected by the photodetector 192 or 194. The routine 195 is stored in the memory 124 and run on the CPU 120.

Then, the scanning control routine 122 generates scanning control signals for controlling the Z translator 112 so that tip 132 directly contacts, penetrates, and deforms the surface of the object 104 with a known force at the same location where the near-field spectrophotometric measurement was just made. While the tip 132 penetrates the surface of the object, scanning control routine 122 then controls the making of another near-field spectrophotometric measurement at the same location.

The data contained in the resulting detection signal provided by the photodetector 192 or 194, together with the earlier recorded data, is analyzed and processed by the hardness testing analysis routine 195 to produce data representing information on the hardness of the object 104. This is done by determining the proportionate change in the detected optical energy between the two measurements which provides a measure of the depth of penetration of tip 132. The depth of penetration in turn is a measure of the local binding strength (i.e., hardness) of the object 104. In bulk materials, this measure reflects local changes such as crystal dislocations, etc . . . . In patterned materials, such as semiconductors, this measure provides subsurface structural information. This data is formatted by the display routines 136, in the way described later, and provided to the display monitor 119 for display of the hardness information.

Alternatively, the hardness testing mode may involve STM measurements. In this variation, the scanning control routine 122 controls the tunneling current measurement circuit 158 to make a conductivity measurement for object 104 at a particular location of the object 104 in a similar way to that described earlier for STM measurements. The data in the conductivity measurement signal representing the conductivity measured by the circuit 158 is recorded in the data base 198 by the hardness testing analysis routine 195.

Similar to before, the scanning control routine 122 generates scanning control signals for controlling the Z translator 112 to make the tip 132 directly contact, penetrate, and deform the surface of the object 104 with a known force at the same location. While the tip 132 penetrates the surface of the object 104, scanning control routine 122 then controls the making of conductivity measurements of object 104 at the same location.

The data in the conductivity signal over the period before and during the penetration is recorded, analyzed, and processed by the hardness testing analysis routine 195 to produce data representing information on the hardness of the object 104. In this case, the measured change in conductivity over the period before and during penetration is a measure of the depth of penetration of tip 132 and in turn a measure of the hardness of the object 104. The data produced by the routine 195 is formatted by the display routines 136 and provided to the display monitor 119 for display of the hardness information.

Additionally, the actual deflection or motion of the tip as measured by the optics 134 and the deflection measurement circuit 136 can be used by the hardness testing routine 195 in conjunction with the known force to provide a measure of the hardness of the surface. Like in the earlier described hardness testing embodiments, the data produced by the routine 195 is formatted by the display routines 136 and provided to the display monitor 119 for display of the hardness information.

Probe and Lens Composition

In order to provide all of the foregoing modalities associated with the embodiment of FIG. 1, the probe 102 in the embodiment of FIGS. 2a–2c and the embodiment of FIGS. 3a–3c is formed from a wafer of silicon, silicon nitride, or some other material which is transparent to visible or infrared light. Specifically, in the case where infrared light is used for the medium magnification optical microscopy, the near-field optical microscopy, and the spectrophotometry modes, the probe is formed from a material, such as silicon, which is transparent to infrared light. And, in the case where visible light is used for these modes, the probe is formed from a material, such as silicon nitride, which is transparent to visible light.

The base 128, cantilever 130, tip 132, and clamping arm 140 or clamping structure 141 of probe 102 are etched from the wafer using conventional techniques known to those skilled in the art.

The lens system 174 may also be formed from silicon, silicon nitride, or some other material transparent to infrared or visible light depending on whether infrared or visible light is used for the modes just described above. Similarly, depending on whether infrared or visible light is used for these modes, the lens system support 176 of the embodiment of FIGS. 2a–2c is made of silicon, glass, or some other material transparent to infrared or visible light.

Figure 8A:
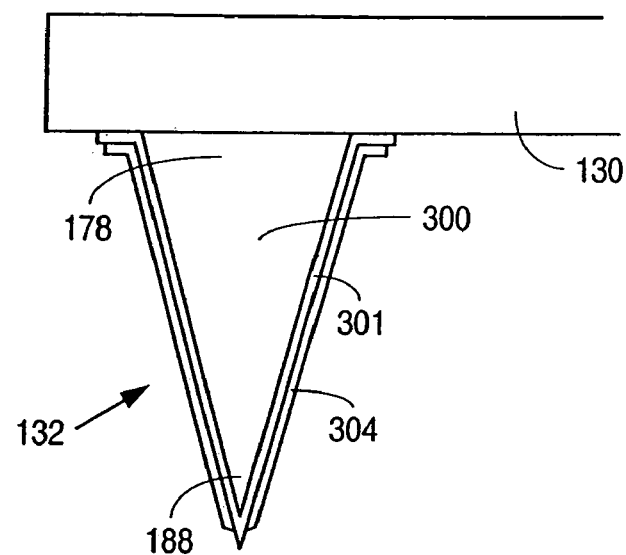
FIGS. 8a–8d show various embodiments of the tip of the scanning probe microscope assembly of FIG. 1.

As shown in FIG. 8a, the core material (silicon, silicon nitride, or other material) 300 of the tip 132 may be coated with an obdurate rigid material 301, such as diamond, tungsten, silicon carbide, or carbon nitride, to increase tip life, as shown in FIG. 8a. The obdurate coating 301 may have a thickness in the range of approximately 5 Angstroms to 1 micron.

To allow operation in the STM mode and/or contain light energy within the tip 132, the tip 132 may be coated using conventional techniques with a thin layer 304 of a conductive material, such as aluminum, tungsten, or gold. This layer 308 is formed over the core material 300 and any obdurate coating 301 at a thickness in the range of approximately 1 Angstrom to 1 micron.

A small portion of the conductive layer 304 is removed or rubbed off at the sharp end 188 of the tip 132 using conventional techniques to at least the point where the conductive layer 304 is no longer opaque to light propagating through the tip 132. Furthermore, the conductive coating 304 is removed or rubbed off only so that the conductive coating 304 ends approximately 5 to 10 nm from the point of the sharp end 188. As a result, an aperture having a diameter in the range of approximately 5 to 100 nm is formed at the sharp end 188.

Figure 8B:
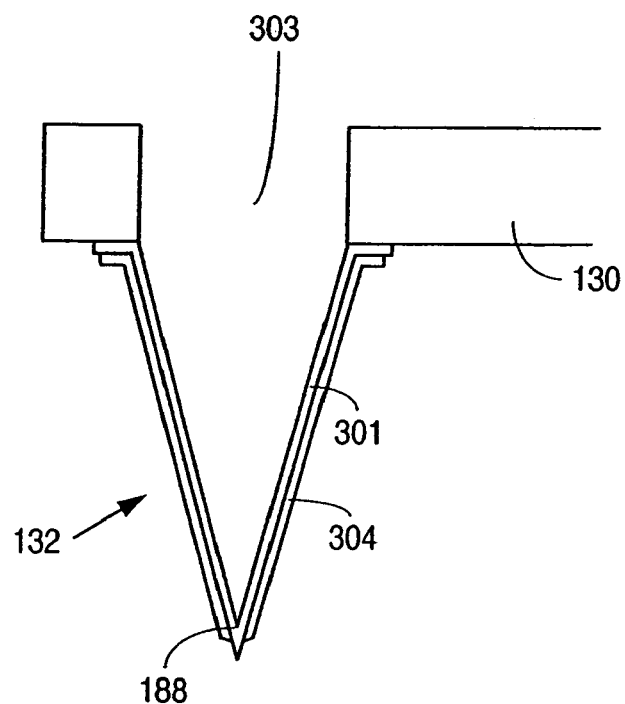

Alternatively, referring to FIGS. 8b and 6c, the core material 300 of the tip 132 and the core material 300 of the cantilever 130 over the tip 132 (shown in FIG. 8a) are etched away using conventional techniques to leave a hole 303 in the cantilever 130 and only the obdurate coating 301 and the conductive coating 304 as the tip 132. As in the tip 132 of FIG. 8a, the conductive coating 304 is removed or rubbed off from the sharp end 188 of the tip 132 to form an aperture near the sharp end 188. In operation, this tip 132 is substantially transparent (in the case of diamond) to an extremely broad range of wavelengths (0.1 to 20 microns).

Figure 8C:
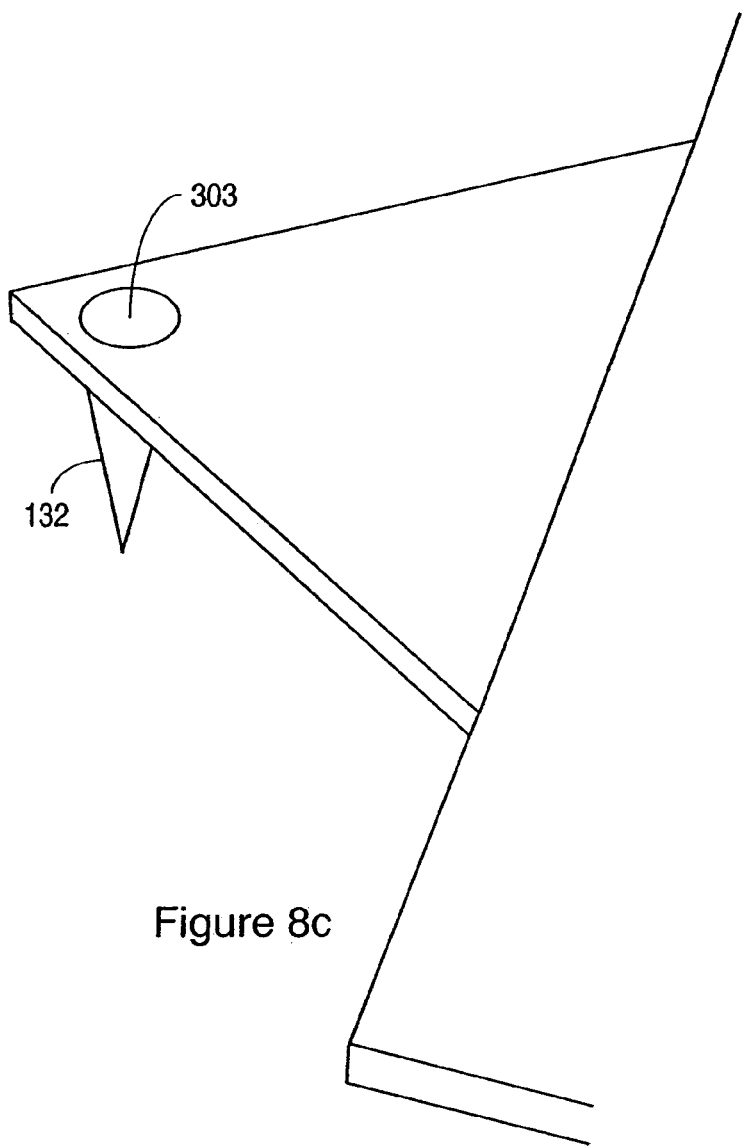

Furthermore, if the obdurate coating 301 of FIGS. 8a–8c is a silicon carbide or silicon nitride coating, it may be doped using conventional techniques so as to be conductive. In this case, the conductive layer 304 would be omitted.

In the case where the obdurate coating 301 of FIGS. 8a–8c is a layer of diamond, the diamond crystals are grown so as to be oriented normal to the surface of the tip 132. This is done in the following manner.

First the wafer containing the probe 102 is placed in a vacuum arc deposition chamber containing carbon. A mask is placed over the probe 102 so that only the tip 132 and the area of the cantilever 130 around the base 178 of the tip 132 are exposed. At a pressure of approximately $1 \times 10^{-7}$ to $1 \times 10^{-11}$, the carbon is heated to a temperature of approximately 2100 to 3000° C. The carbon condenses on the surface of the core material 300 or an overlying tungsten, silicon carbide or silicon nitride layer.

The probe 102 is then placed in a methane hydrogen atmosphere for chemical vapor deposition (CVD) growth of the diamond layer 301 on the surface of the core material 300. The condensed carbon acts as a seed such that the diamond layer 301 grown is a layer of polycrystalline diamond oriented normal to the surface of the core material 300 or overlying layer.

In the case where the obdurate layer 301 is carbon nitride, the same seeding process as was described above is used. Then the probe 102 is placed in an atmosphere of monatomic nitrogen. The monatomic nitrogen is obtained by passing nitrogen gas through a hollow tungsten heater consisting of a hollow tungsten structure through which an electric current is passed. The tungsten heater is maintained at a temperature of 2100 to 3000° C. In one embodiment the tungsten heater also includes a quantity of carbon sufficient to combine chemically to form the carbon nitride layer 301 on the carbon condensation at the cool core material 300 surface (800° C.). The process begins without introducing nitrogen gas. After a few atoms of carbon are deposited, the nitrogen gas is introduced into the tungsten electrode and deposition and growth of the polycrystalline carbon nitride layer 301 is initiated.

Figure 8D:
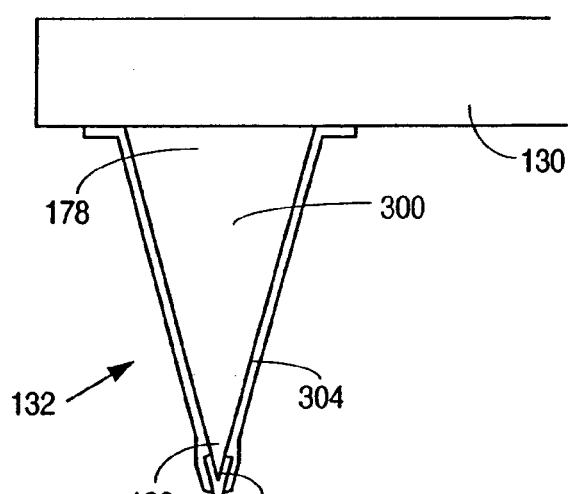

FIG. 8d shows a tip 132 with an obdurate diamond layer 301 over the core material 300 just at the sharp end 188. As in the tips 132 of FIGS. 8a–8c, the conductive coating 304 is removed or rubbed off from the sharp end 188 of the tip 132 to form an aperture at the sharp end 188.

The core material 300 or an overlying tungsten, silicon carbide or silicon nitride layer at the sharp end 188 is pushed into or rubbed on a surface containing fine grain diamond (such as a lap or polycrystalline diamond coated surface). The sharp end 188 picks up a seed crystals of diamond. The probe 102 is then placed in a CVD environment for growth of the polycrystalline diamond layer 301 at the seed sites around the sharp end 188.

Scanning Sequence

Figure 9:
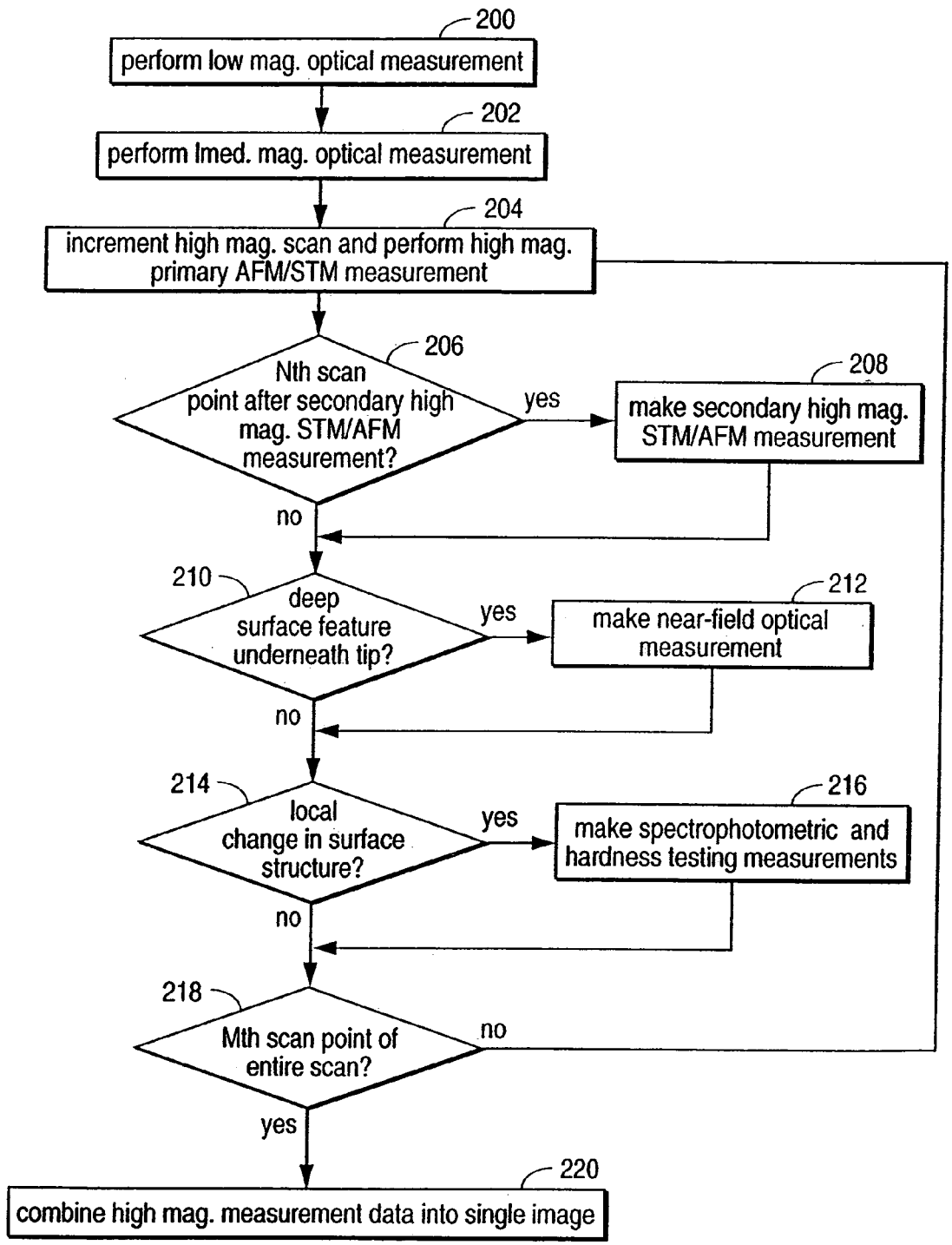
FIG. 9 shows a typical scanning sequence flow of operation of the scanning probe microscope assembly of FIG. 1.

FIG. 9 shows the scanning sequence controlled by the scanning control routine 122.

Initially, the user issues with the control terminal 116 a low magnification zoom control signal for directing a low magnification visible optical microscopy scan of the object 104. In response, the scanning control routine 122 controls the XY translator 110 to position the object in the area specified by the low magnification zoom control signal and then low magnification visible optical microscopy measurements are made in these areas in the way described earlier (block 200). This is done in order that the user may find an area of the object 104 to zoom in on for closer inspection with some of the other modes described earlier.

Figure 20:
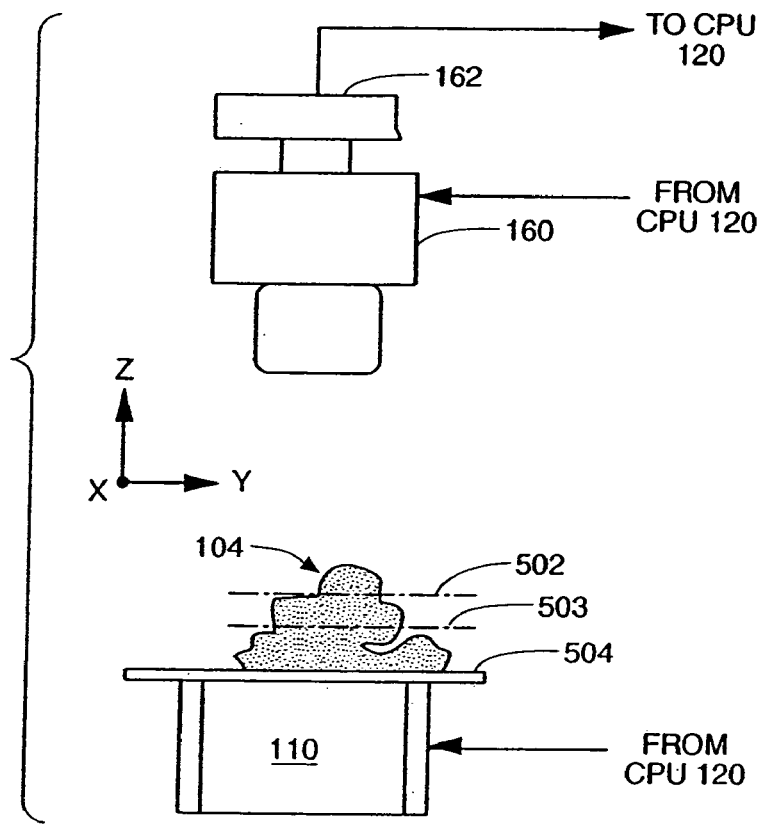
FIG. 20 shows a side view of a confocal microscope performing a scan in accordance with the present invention.

Referring to FIG. 20, in performing the low magnification confocal microscopy scan, the scanning control routine 122 first determines the upper and lower bounds 502 and 504 of the object 104 in the z direction. The upper and lower bounds 502 and 504 may be defined by the user (with the control terminal 116 shown in FIG. 1), fixed by the designer, or determined by the scanning control routine 122. These methods may be combined such that, for example, the upper/lower bound is defined and the lower/upper bound is determined.

In the case where the upper and lower bounds 502 and 504 are determined by the scanning control routine 122, the scanning control routine 122 controls the making of sample confocal microscopy measurements of the object 104 at low and high levels in the z direction. To do so, the scanning control routine 122 generates control signals to control the translator 110 for positioning the object in the x,y plane and generates control signals to control the optics of the microscope 160 for adjusting the confocal region (focal plane) in the z direction. However, those skilled in the art will appreciate that a translator that positions an object in each of the x,y, and z directions could also be used. The scanning control routine 122 then determines from the sample measurements the upper and lower bounds 502 and 504 (z2 and z1) of the object 104 and also the average diameter (n) of the smallest feature detected with the sample measurements.

Based on the upper and lower bounds z2 and z1 and the average diameter n of the smallest feature, the scanning control routine 122 determines in a binary tree the confocal regions in the z direction at which confocal microscopy measurements will be made. Specifically, the scanning control routine 122 determines that the confocal regions for the object 104 will be at z1, z2, (z2−z1)/2, (z2−z1)/2+(z2−z1)/4, (z2−z1)/2−(z2−z1)/4,... (z2−z1)/2+(z2−z1)/4+... (z2−z1)/2n, (z2−z1)/2−(z2−z1)/4−... (z2−z1)/2n. Thus, the resolution of the scanning technique and number of confocal regions that will be scanned is the closest whole number to (z2−z1)/2n. These z values are then recorded in a table in the data base 198 shown in FIG. 1.

Figure 21:
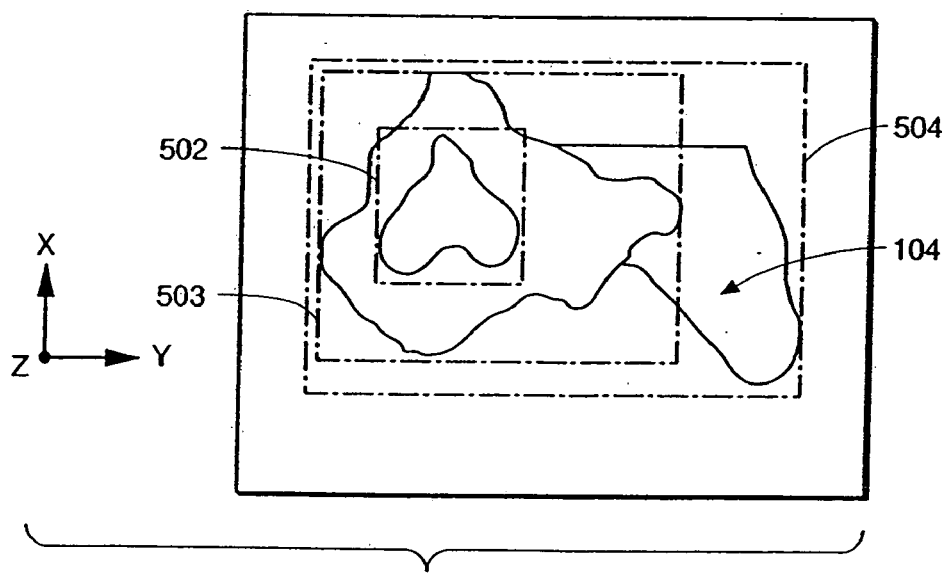
FIG. 21 shows a top view of the scan performed by the microscope of FIG. 10.

Referring to FIG. 21, the scanning control routine 122 then determines at a number of confocal regions 502, 503, and 504 (in the z direction) the bounds of the object 104 in the x,y plane. This is also accomplished with sample measurements made under the control of the scanning control routine in the manner just described. The number of determined confocal regions in the table for which this is done is equal to or less than the resolution of the scanning technique just described. For each confocal region in the table for which x,y boundary values were determined, the scanning control routine 122 assigns the corresponding x,y boundary values to it in the table. If the number of confocal regions for which the bounds in the x,y plane are determined is less than the resolution of the scanning technique, then the scanning control routine 122 uses interpolation to assign x,y boundary values in the table to those confocal regions for which a bound in the x,y plane was not specifically determined.

In the case where the microscope 160 is a spot scanning confocal microscope, then the scanning control routine 122 uses the table to generate control signals to control the translator 110 and the optics of the microscope 16 for making confocal microscopy measurements at each confocal region in the table but only within the bounded area in the x,y plane which the table specifies for it. Moreover, if the microscope 160 is a scanning disk confocal microscope, the scanning control routine 122 will generate control signals for controlling the optics of the microscope 160 to make confocal microscopy measurements at each confocal region in the table and controlling the camera 162 to only take measurement data for the bounded area in the x,y plane which the table specifies for it.

Thus, the table is used to limit the confocal microscopy scan to those areas where most of the object 104 lies. This reduces substantially the time, hardware, and storage requirements needed to acquire a three dimensional confocal image.

Those skilled in the art will recognize that the described scanning technique may be modified to collect information in bounded sections aligned in z,x or z,y planes or in bounded spherical or other non-cartesian sections. In particular when working with simple high numerical aperture optics (in reflection or refraction) images are formed with substantial spherical (or some cases cylindrical) aberration, by using a matching spherical aperture (in spot or scanning disk confocal microscopy) or an image sensor with a spherical surface which matches the spherical aberration of the optics substantial cost and performance benefits may be obtained.

Once an area for inspection is located with the low magnification confocal microscopy scan, then the user issues with control terminal 116 a medium magnification zoom control signal for directing a medium magnification optical microscopy scan of the object 104 in this area. The scanning control routine 122 controls the XY translator 110 to position the tip 132 over the object 104 in the area specified by the zoom control signal and then medium magnification optical microscopy measurements are made in this area in the way described earlier (block 202). This is done to find a smaller area to zoom in on for even closer inspection.

After this smaller inspection area is located, the user issues with control terminal 116 a high magnification zoom control signal for directing a high magnification scan of the object 104 in this area. In doing so, the scanning control routine 122 controls the XY translator 110 so that the tip 132 is sequentially positioned at numerous scan points over the object 104 during the scan.

Referring to FIG. 9, once an area for inspection is located with the low magnification visible optical microscopy scan, then the user issues with control terminal 116 a medium magnification zoom control signal for directing a medium magnification optical microscopy scan of the object 104 in this area. The scanning control routine 122 controls the XY translator 110 to position the tip 132 over the object 104 in the area specified by the zoom control signal and then medium magnification optical microscopy measurements are made in this area in the way described earlier (block 202). This is done to find a smaller area to zoom in on for even closer inspection.

After this smaller inspection area is located, the user issues with control terminal 116 a high magnification zoom control signal for directing a high magnification scan of the object 104 in this area using the various high magnification scanning probe microscopy (AFM, STM, spectrophotometric, near-field optical, and hardness testing) modes described earlier. In doing so, the scanning control routine 122 controls the XY translator 110 so that the tip 132 is sequentially positioned at numerous scan points over the object 104 during the scan.

When the AFM mode has been selected as the primary high magnification mode by the user with the control terminal 116, a flag is set in the data base 198 indicating this. In response to this flag, the scanning control routine 122 directs the Z translator 110 to position tip 132 over the object 104 for an AFM measurement at each scan point in the way described earlier (block 206). The data processed by the AFM analysis routine 137 representing these AFM measurements is then recorded in the data base 198.

Alternatively, when object 104 is a conductive material, the user may select the STM mode as the primary high magnification mode. In this case, the scanning control routine 122, in response to a flag stored in the data base 198 indicating that the STM mode is the primary high magnification mode, directs the Z translator 110 to position tip 132 over the object 104 at each scan point for an STM measurement at each scan point (block 206). These STM measurements are made in the way described earlier and the combined data representing them is processed by the STM analysis routine 138 and recorded in the data base 198. When combined, the recorded data provides the basic high magnification image data of object 104.

After a primary high magnification measurement is made at a scan point, the scanning control routine 122 determines whether to make at this same scan point a secondary high magnification STM measurement (in the case where the primary high magnification mode is the AFM mode) or AFM measurement (in the case where the primary high magnification mode is the STM mode). The scanning control routine 122 accomplishes this by determining if a predefined number N of scan points have occurred since the last secondary STM measurement (in the case where the primary high magnification mode is the AFM mode) or the last secondary AFM measurement (in the case where the primary high magnification mode is the STM mode) (decision block 208). This predefined number N may be selected by the user with the control terminal 116.

If scanning control routine 122 determines that the scan has been incremented by N scan points since the last secondary high magnification STM or AFM measurement, then it controls the making of such a measurement in the way described earlier (block 210). The data representing this measurement is processed by the STM or AFM analysis routines 137 or 138 and then stored in the data base 198. This data provides additional information or image data on local variations of composition or conductivity at the current scan point.

After the secondary measurement has been made at the current scan point, or after scanning control routine 122 determines that such a measurement should not be made at this scan point, it then determines based on the primary high magnification AFM or STM measurement whether a deep surface feature is immediately under the tip 132 if it already has not determined that an anomaly exists at the current scan point (decision block 212). Similar to the way in which an anomaly is detected, this is done by analyzing the data contained in the signal received from the cantilever deflection measurement circuit 135 (when the AFM mode is the primary magnification mode) or the tunneling current measurement circuit 158 (when the STM mode is the primary magnification mode) and comparing it with predefined data stored in memory 124 corresponding to a deep surface feature.

If scanning control routine 122 determines that the received data does not compare with the stored data, then it has determined that a structure and not a deep surface feature is directly underneath tip 132. In this case, a near-field optical measurement is not made.

However, when the received data does compare to the stored data, then scanning control routine 122 has determined that a deep surface feature is underneath tip 132 at the current scan point. In this case, the scanning control routine 122 then controls the making of a near-field optical microscopy measurement at this scan point in the way described earlier (block 214). The data produced by the near-field optical analysis routine 151 provides image data identifying the deep surface structure and is recorded in the data base 198.

After a near-field optical measurement has been made at the current scan point, or if it is determined that such a measurement is not to be made, then the scanning routine 122 determines whether a junction of surface structures or local change in surface structure exists at the current scan point (decision block 216). Similar to the deep surface feature determination described above, scanning control routine 122 determines this by analyzing the data contained in the signal received from the cantilever deflection measurement circuit 135 (when the AFM mode is the primary magnification mode) or the tunneling current measurement circuit 158 (when the STM mode is the primary magnification mode) and comparing it with predefined data stored in memory 124 corresponding to known types of structure junctions to determine if a structure junction is directly underneath tip 132.

If scanning control routine 122 determines that a junction of structures or a local change in structure is directly underneath tip 132, then it controls performance of a near-field spectrophotometric measurement, and/or a hardness testing measurement in the ways described earlier (block 218). The data produced by the analysis routines 143, 149, and 195 provides even more information or image data on local variations of composition at the current scan point and is recorded in the data base 198.

After a near-field spectrophotometric measurement, and/or a hardness testing measurement is made, or if scanning control routine 122 determines that a junction of structures or a local variation in structure is under tip 132 at the current scan point, then the scanning control routine 122 determines if the scan has been completed. This is done by determining if the current scan point is the last scan point of a predefined number of scan points M selected for the entire scan by the user with the control terminal 116.

If the current scan point is not the Mth scan point, then the scan is incremented to the next scan point and the above process is repeated until the Mth scan point is reached. However, if the current scan point is the Mth scan point, then the display routines 136 combine the data processed by the routines 137, 138, 151, 143 and 195 into a single high magnification image of the object in the way described later (block 220).

As one skilled in the art will appreciate, the user can increase the overall scan time by selectively setting flags in the data base 198 indicating which of the above described measurements should not be made during the scan. In response, the scanning control routine 122 will not control the performance of these types of measurements.

Moreover, those skilled in the art will appreciate that the scanning control routine 122 can be modified to make different types of measurements for different types of conditions and materials being inspected.

For example, the near-field optical mode, the near-field spectrophotometry mode, or the hardness testing mode may be made the primary measurement mode.

Or, scanning control routine 122 may also determine that secondary STM or AFM, near-field optical, spectrophotometric, or hardness testing measurements should be made if, based on the primary high magnification AFM or STM measurement, scanning control routine 122 determines that an anomaly exists at a current scan point. This is done similarly to the deep surface feature determination. Specifically, scanning control routine 122 analyzes the data contained in the signal received from the cantilever deflection measurement circuit 135 (when the AFM mode is the primary magnification mode) or the tunneling current measurement circuit 158 (when the STM mode is the primary magnification mode) and compares it with predefined data stored in memory 124 corresponding to known types of structures and surface features to determine if an anomaly is directly underneath tip 132.

Moreover, the criterion for making the various types of measurements described above may be based instead on the planarity of the specimen. Thus, the scanning control routine 122 would control the making of measurements in the magnification and measurement mode appropriate to the region under the tip 132. For example, scanning control routine 122 may control the transitioning from measurements in the low magnification optical mode for a rapidly changing topography (e.g., 2 to 3 microns) to measurements in the high magnification AFM and/or STM mode for a region (e.g., n on a side) which might be expected to be locally planar, atomic, and/or conductive.

Display Control

Figure 10A:
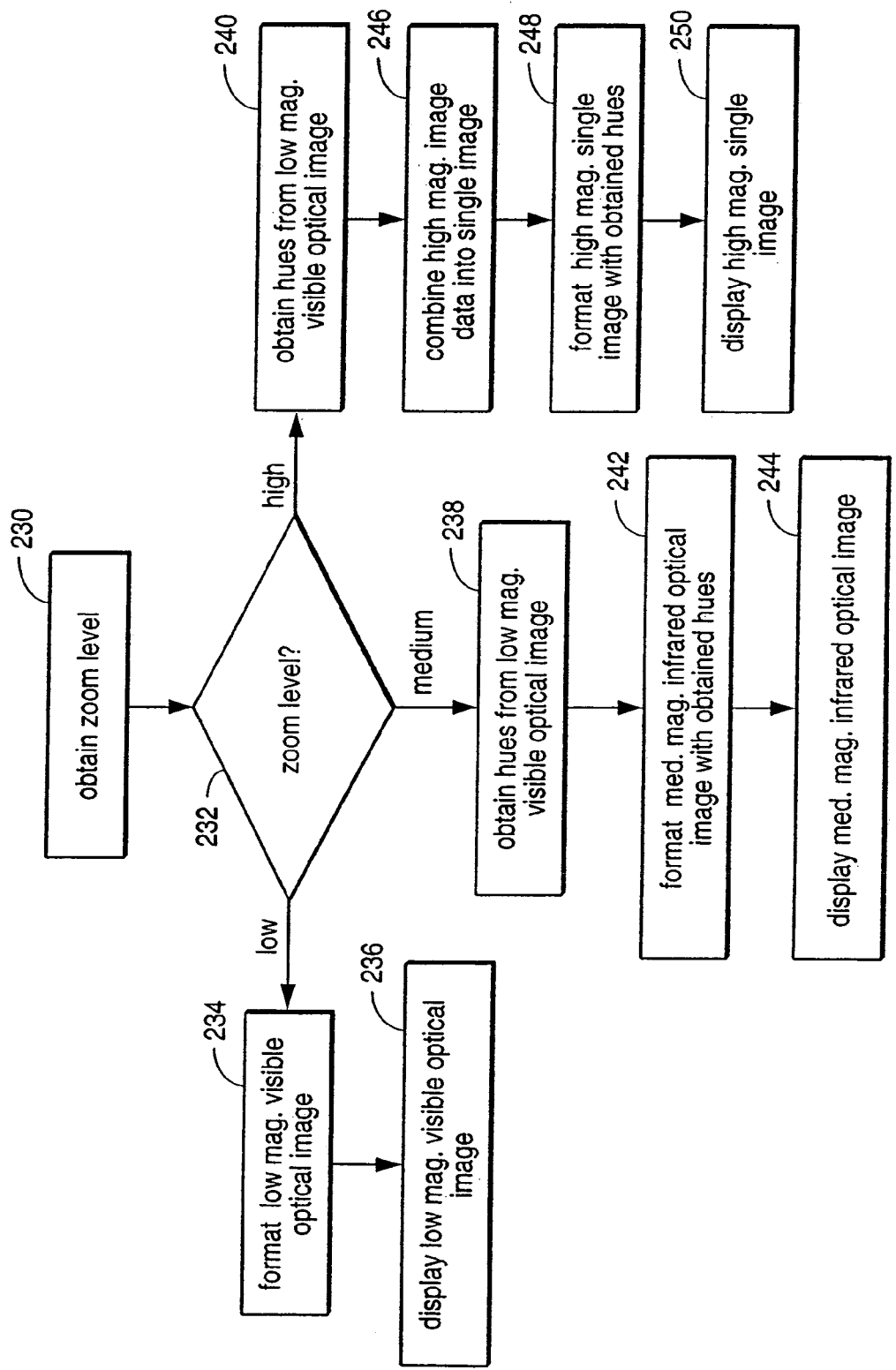
FIGS. 10a and 10b show the display sequence of the scanning probe microscope assembly of FIG. 1.

FIG. 10a shows the display control sequence controlled by the display routines 136 in the case where the medium magnification optical microscopy mode is based on infrared light measurements in the way described earlier.

The display routines 136 first obtain the zoom (i.e., magnification) level desired by the user (block 230). The user requests the zoom level with control terminal 116 which issues a zoom level command signal containing data representing the desired zoom level. This signal is received by the CPU 120 and the display routines 136 in response obtain the desired zoom level.

The display routines 136 then determine the desired zoom level from the data contained in the received zoom level command signal (block 232).

If the desired zoom level is a low magnification zoom level, then display routines 136 format the visible optical image data provided by the visible optical microscopy analysis routine 139 (block 234). This formatted data is then provided to the display monitor for display of the represented image (block 236).

If the desired zoom level is a medium or high magnification zoom level, then display routines 136 first obtain the hues of the low magnification visible optical image data provided by the visible optical microscopy analysis routine 139 (blocks 238 and 240).

In the case of a medium magnification zoom level, display routines 136 use the visible optical image hues to format the infrared optical image data provided by the optical microscopy analysis routine 141 so that it has a color pattern consistent with the visible optical image (block 242). The formatted data is then provided to the display monitor 118 for display of the represented image (block 244).

In the case of a high magnification zoom level, as was suggested earlier, display routines 136 overlays and combines the recorded image data representing the various measurements made during the high magnification scan into a single high magnification image of the object 104 using conventional data processing techniques (block 246). In this way, the data produced by the AFM or STM analysis routines 137 or 138 representing the primary high magnification measurements provides the basic image data. This basic image data is augmented with data produced by the near-field optical analysis routine 151 providing image data on deep surface features. It is also augmented with data produced by the STM or AFM analysis routines 138 or 137 representing the secondary high magnification measurements and providing image data on local variations in the composition or conductivity of object f04. Moreover, the basic image data is augmented with data produced by the spectrophotometric and hardness testing analysis routines 143, 149, and 195 providing further image data on local variations of the composition of object 104.

After the single high magnification image is produced by the display routines 136, they use the visible optical image hues to format the single image so that it has a color pattern consistent with the visible optical image (block 248). Where the visible optical image color differences are smaller than the infrared optical image gray scale differences, intermediate hues are created by display routines 136 around the visible optical image hues using the visible optical image hues as the center for variation. The formatted data is then provided to the display monitor 118 for display of the represented image (block 250).

Figure 10B:
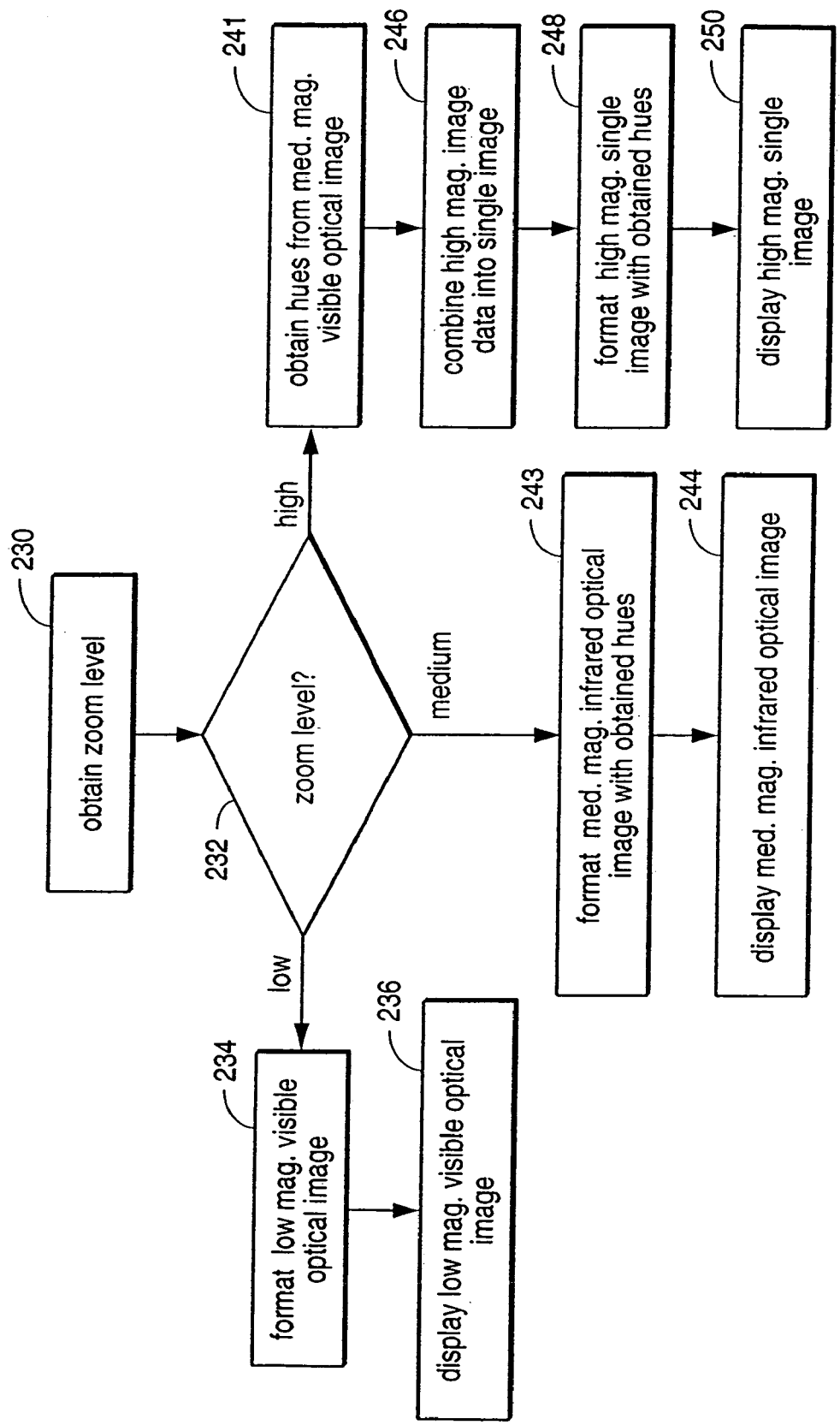

FIG. 10b shows the display control sequence controlled by the display routines 136 in the case where the medium magnification optical microscopy mode is based on visible light measurements, as discussed earlier. Here, the hues of the low magnification visible optical image need not be obtained for formatting the medium magnification visible optical image since this image necessarily would have the same hues (block 243). Moreover, the hues for formatting the high magnification image would be obtained from the medium magnification visible optical image (block 241) since the color differences may be more pronounced thereby providing more hue information.

Since scanning probe microscope assembly 100 is configured to produce high, medium, and low magnification images with a consistent color pattern, the user is provided with continuous single image zoom.

Figure 22:
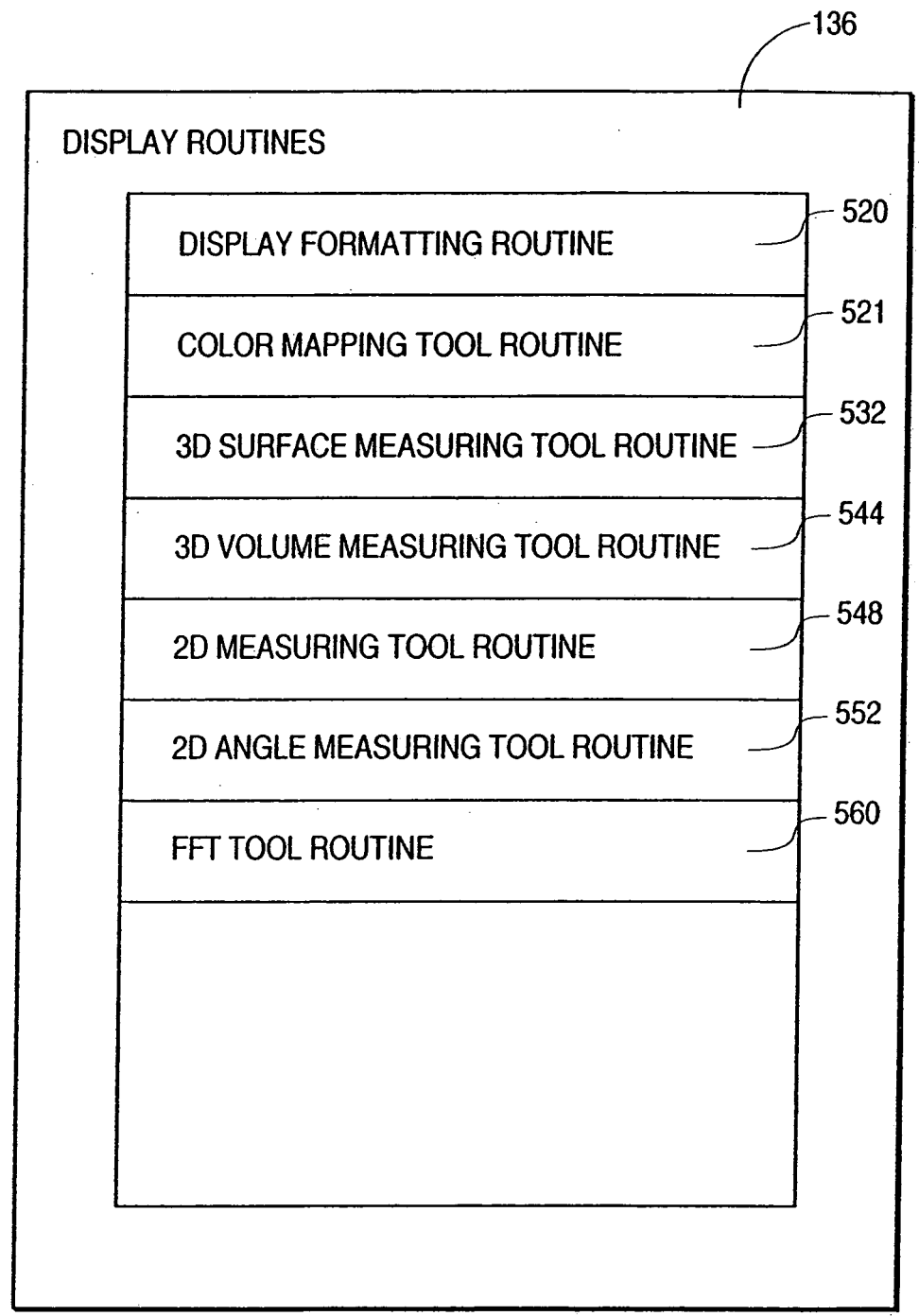
FIG. 22 shows the display routines of the microscope assembly of FIG. 1.

As shown in FIG. 22, the display routines 136 include a display formatting routine 520. The display routines 136 first obtain the zoom (i.e., magnification) level and type of image desired by the user. The user requests the zoom level and image type with control terminal 116 which issues command signals indicating the desired zoom level and image type. This signal is received by the CPU 120 and provided to the display formatting routine 520.

When the zoom level specifies the low magnification confocal microscopy mode or the medium magnification optical microscopy mode, the data formatting routine 520 formats the data provided by the low magnification analysis routine 139 or the medium magnification analysis routine 141. Depending on the zoom level and type of image requested by the user with the control terminal 116, the data formatting routine 520 formats the data for display as a 3D or 2D image of at least a portion of the object 104.

Similarly, when the zoom level specifies the high magnification microscopy mode, the data formatting routine 520 overlays and combines the recorded image data representing the various measurements made during the high magnification scan into a single high magnification 3D or 2D image of at least a portion of the object 104 depending on the desired image type requested by the user. This is done using conventional data processing techniques, as suggested earlier. In this way, the data produced by the AFM or STM analysis routines 137 or 138 representing the primary high magnification measurements provides the basic image data. This basic image data is augmented with data produced by the near-field optical analysis routine 151 providing image data on deep surface features. It is also augmented with data produced by the STM or AFM analysis routines 138 or 137 representing the secondary high magnification measurements and providing image data on local variations in the composition or conductivity of object 104. Moreover, the basic image data is augmented with data produced by the spectrophotometric and hardness testing analysis routines 143 and 195 providing further image data on local variations of the composition of object 104.

The display 118 then receives the formatted image data from the CPU 120. In response, it then displays the formatted image data.

Referring again to FIG. 22, the display routines 136 include a color mapping (or assigning) tool routine 521. The program used to implement the color mapping tool 521 is listed in Appendix A. The user selects and operates the color mapping tool routine 521 by issuing appropriate commands with the terminal 116. Thus, the color mapping tool routine 521 is responsive to commands issued by the user with the terminal 116 such that the user can map a specific range of data elements to a specific range of colors.

Figure 23A:
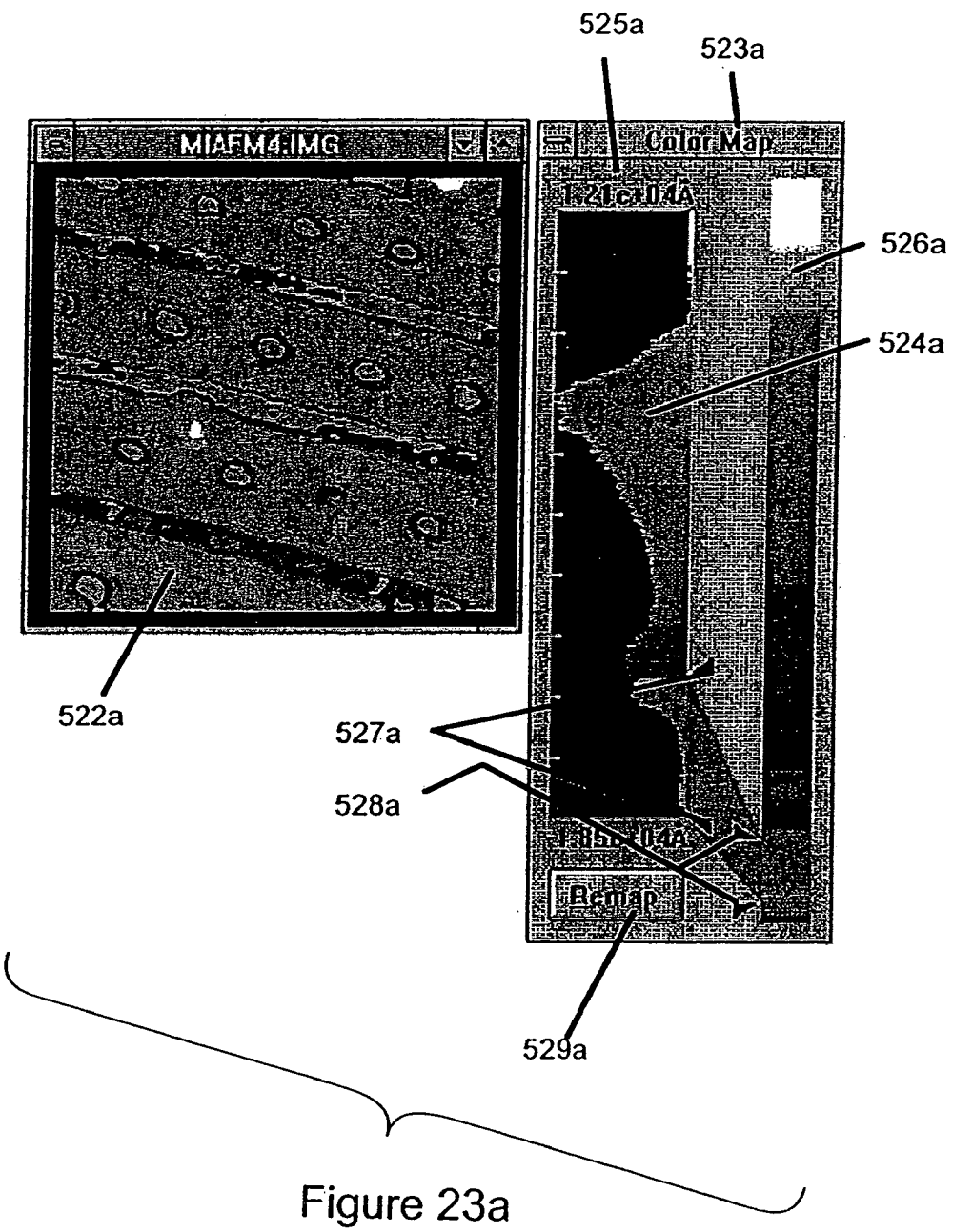
FIGS. 23a–35 show images created by the display routines of FIG. 12.

Specifically, as shown in FIG. 23*a*, when the user selects the color mapping tool routine 521, it generates a color mapping tool 523*a* of the image 522*a* of object 104 currently being displayed by the display 118. Although the image 522*a* shown in FIG. 23*a* is a 2D image, those skilled in the art will recognize that the image of object 104 displayed by the display may also be a 3D image. The data representing the color mapping tool 523*a* is formatted by the data formatting routine 520 for display and provided from the CPU 120 to the display 118 which then displays the color mapping tool 523*a*. The image 522*a* and the color map 523*a* may be displayed in window fashion such that they may be displayed simultaneously together or separately at the command of the user with the terminal 116.

The generated color mapping tool 523*a* includes a histogram 524*a* of the image data of the image 522*a*. The histogram 524*a* sorts all of the topographic data points of the image data by their heights in the z direction (i.e., z values). The vertical axis of the histogram 524*a* is a linear range of the z values bounded by the max and min values 525*a*. The horizontal axis indicates for each z value how many data points of the image data have that z value.

The color mapping tool 523*a* also includes a vertical color strip (or bar or pallette) 526*a* that identifies a range of colors. The color mapping tool 523*a* initially (in the default condition) maps each z value in the histogram 524*a* to a corresponding color in the color strip 526*a* over a predetermined range of colors in the color strip 526*a*. The color mapping tool routine 521 provides the color assignments to the data formatting routine 520 which formats the image data for display of the image 522*a* with these color assignments.

As shown in FIG. 1, the terminal 116 includes a pointing device 117 such as a mouse, joy stick, track ball, or other multi-axis device. The color mapping tool 523*a* includes z value range identifying cursers 527*a* and color range identifying cursers 528*a*. The color mapping tool routine 521 is responsive to commands issued with the pointing device 117 such that a user can manipulate the cursers 526*a* and 527*a* with the pointing device 117 to identify a specific range of z values in the histogram 524*a* to be mapped to a specific range of colors in the color strip 526*a*. When the user selects the Remap button 527*a* of the color mapping tool 523*a* with the pointing device 117, the histogram 524*a* is updated with the new color assignments and the color tool 521 provides the new color assignments to the data formatting routine 520 for formatting the image data to update the image 522*a* with the new color assignments. Thus, using the color mapping tool routine 521, the user may linearly map a large or small range of colors to a range of z values to visually amplify or de-amplify changes in z.

Figure 23B:
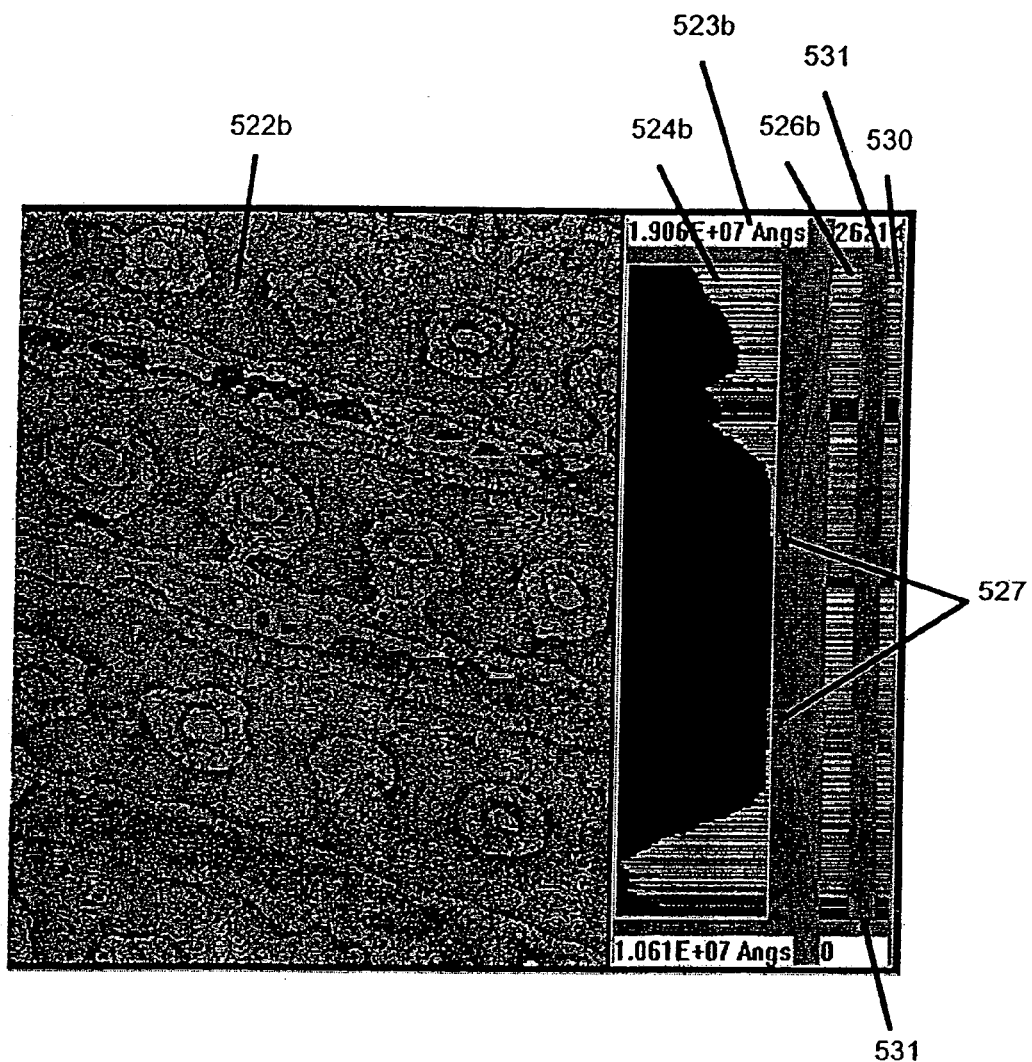

Although a conventional 24 bit display can display 16 million colors, the color strip 526*a* in FIG. 23*a* may include only a specific range of these colors. Therefore, as shown in FIG. 23*b*, in order to be able to select color ranges from the entire set of 16 million colors, the color mapping tool routine 521 may include a color mapping tool 523*a* 523*b* that has a base color strip 530 that identifies all 16 million colors. In addition, the color mapping tool 523*a* 523*b* includes a magnifying color strip 526*b* which is similar to the color strip 526*a*. The user then can manipulate the base color range identifying cursers 531 with the pointing device 117 to select a range of colors in the base color strip 530 which is magnified by the magnifying color strip 526*b* to show the various colors in the selected range. The user then manipulates the cursers 527*b* and 528*b* to map a specific range of the magnified colors to a specific range of z values in the same way as described earlier.

Furthermore, the base color strip 530 may be configured such that each individual color is layered sequentially in the color strip 530 as a darkened version of the color below the color below a lightened version of the color. This forms color bars each having corresponding z values such that image 522*b* is composed of a series of bars of dark and light colors making a topographic image of the surface of object 104. Since each color bar has a specific linear incremental z value corresponding to it, it represents a precise measure of the change in the z direction of the image 522*b*.

Figure 23C:
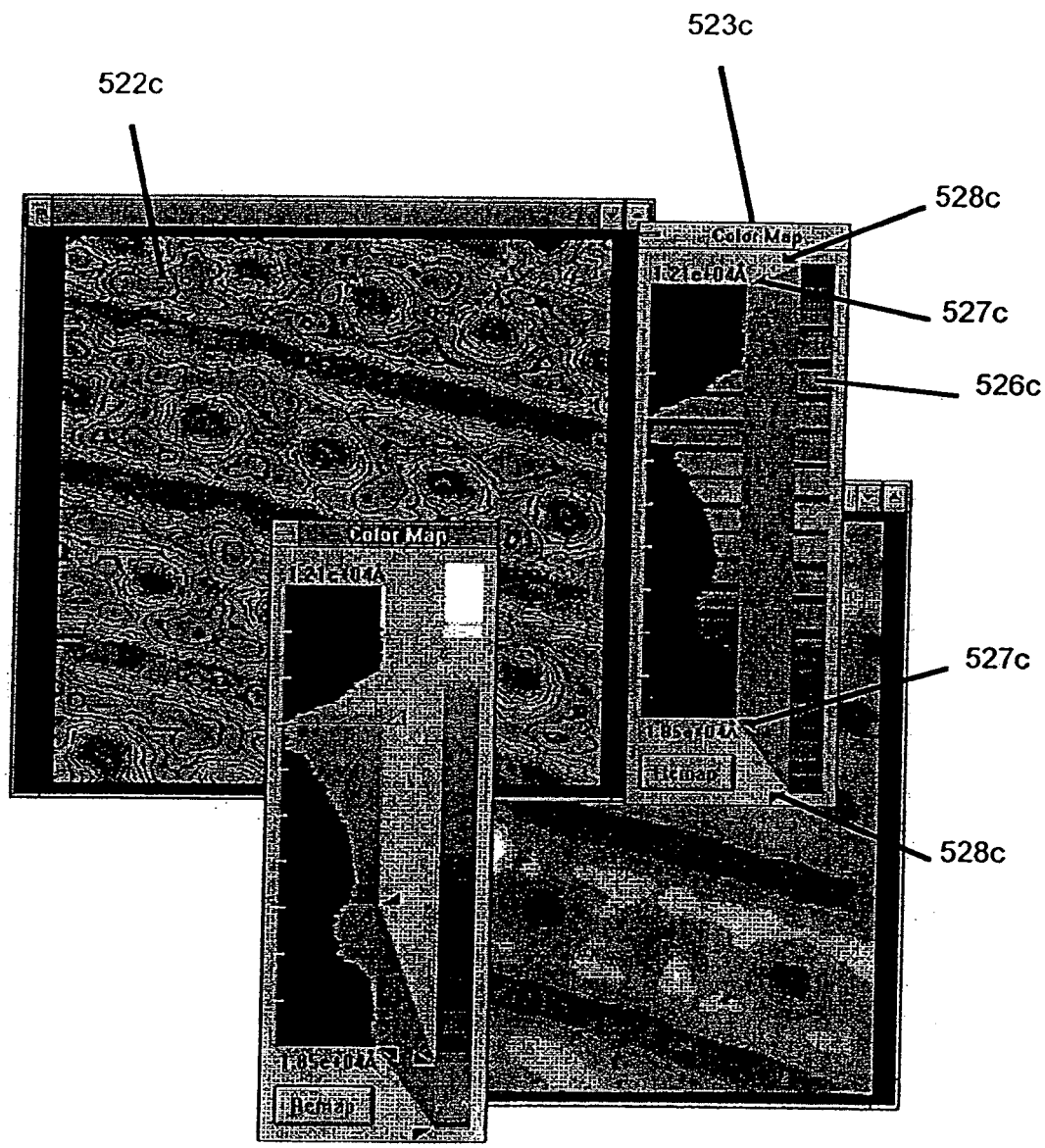

Alternatively, as shown in FIG. 23*c*, the color strip 526*c* may be configured such that the same small range of dark colors occurs between larger ranges of lighter colors. The ranges of lighter colors are the same length in z such that the image 522*c* is composed of larger ranges of lighter colors separated by the small range of dark colors. Since the range of dark colors separate the larger ranges of lighter colors at equal distances, this provides a topographic image of the object 104 and provides a precise measure of the change in the z direction of the image 522*c*.

Figure 24:
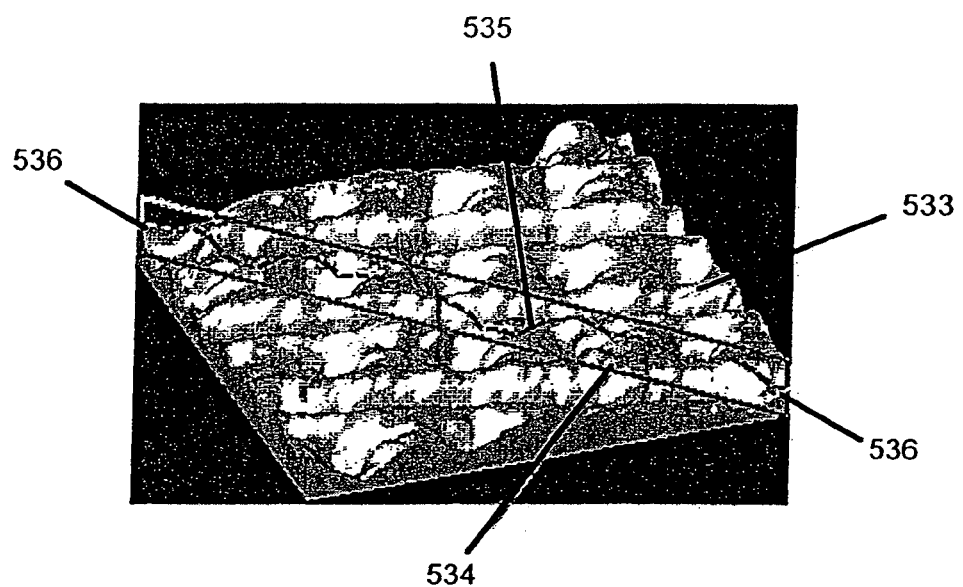

Turning to FIG. 22 again, the display routines 136 also include a 3D surface measuring tool routine 532 which can be used when a 3D surface image of object 104 is displayed by the display 118. Such a 3D surface image 533 is shown in FIG. 24 and produced when the user has selected the high magnification microscopy mode (i.e., AFM, STM, near-field optical, and hardness testing measurements). The user selects and operates the 3D measuring routine tool 532 by issuing appropriate commands with the terminal 116. The 3D measuring tool routine 532 is therefore responsive to commands issued by the user with the terminal 116 for making surface related measurements of the image 533.

Specifically, as shown in FIG. 24, when the user selects the 3D surface measuring tool routine 532, it generates a cutting plane (or ruler) 534 formed by a rectangle projected on the image 533. Since the image 533 does not include interior imaged data points, the cutting plane 534 includes a single line 535 that delineates where the 3D surface image 533 is intersected by the cutting plane including the portions of the image 533 which are not visible. The data representing the image 533 and the cutting plane 534 is formatted by the data formatting routine 520 and provided from the CPU 120 to the display 118 which then displays the cutting plane 534 so that it is projected on the image 533.

The 3D surface measuring tool routine 532 is responsive to commands issued with the pointing device 117 such that a user can select and manipulate the end points 536 of the cutting plane 534 to position the cutting plane with respect to the image 533. When selected, the end points 536 of the cutting plane 534 are circular magnifying cursers with crosshairs (similar to that shown in FIG. 27) for accurate positioning of the end points 536 of the cutting plane 534. The magnification of the cursers is selectable by the user with the terminal 116. Thus, since the 3D surface measuring tool routine 532 slices and delineates the 3D surface image 533 in real time, it gives the user a very rapid method for probing any surface feature of the object 104.

Figure 25:
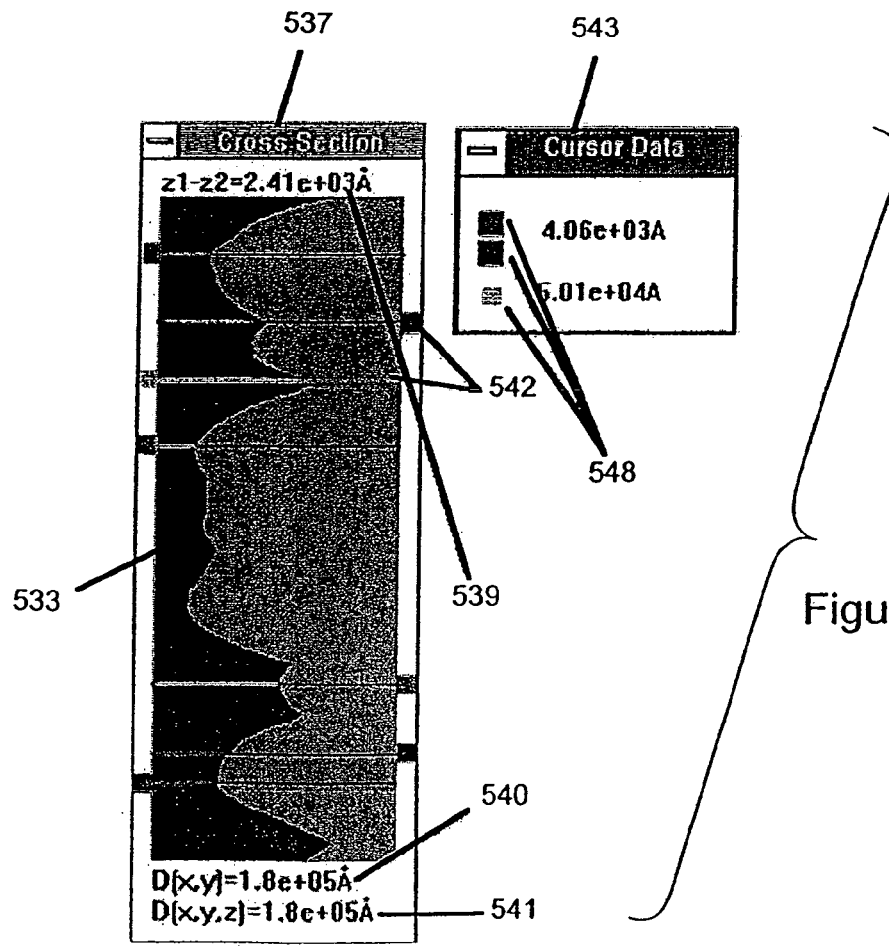

After the cutting plane 534 is positioned by the user with the pointing device 117, the 3D surface measuring tool routine 532 generates cross section data corresponding to the cross section of the image 533 along the intersection of the cutting plane 534 and the image 533. Referring to FIG. 25, the cross section data 537 is formatted for display by the data formatting routine 520 and provided by the CPU 120 to the display 118 for display. The 3D surface image 533 and the cross section information 537 may be displayed in window fashion such that they may be displayed simultaneously together or separately at the command of the user with the terminal 116.

The cross section formatting routine 537 includes a 2D cross sectional image 538 along the intersection of the cutting plane 534 and the image 533. The cross section formatting routine 537 includes the surface height difference 539 at the end points 536 of the cutting plane 534, the absolute length 540 of the cutting plane 534 in the x,y plane, and the length 541 of a line extending between the surface points of the cross sectional image 538 at the end points 536 in terms of the x,y,z coordinates.

Moreover, the cross sectional information 537 includes cursers 542 and 543 to make absolute and relative measurements of the separation and angle of surface points intersection or interior points. The 3D surface measuring tool 533 is responsive to commands issued with the pointing device 117 such that a user can manipulate the cursers 542 to make absolute and relative measurements of the difference in z values, separation in the x,y plane, and angle between surface points of the image 538.

The 3D surface measuring tool routine 532 generates cross section cursor data representing the measurements made with the cursers 542. The cross section cursor data is formatted for display by the data formatting routine 520 and provided by the CPU 120 to the display 118 for display of the cross section cursor information 543 including the measurements 548 made with the 542. The cross section cursor information 543 may also be displayed in window fashion along with the 3D surface image 533 and the cross section information 537.

Figure 26:
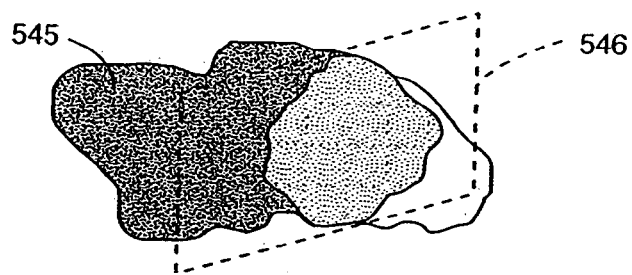

Turning to FIG. 22 again, the display routines 136 also include a 3D volume measuring tool routine 544 which can be used when a 3D volume image of object 104 is displayed by the display 118. Such a 3D volume image 545 is shown in FIG. 26 and produced when the user has selected the low or medium magnification microscopy mode (i.e., confocal or infrared optical measurements). The 3D volume measuring tool routine 544 is similar to the 3D surface measuring tool routine 532 and, like it, the user selects and operates the 3D volume measuring tool routine 544 by issuing appropriate commands with the terminal 116 for making 3D volume related measurements of the image 545.

Figure 27:
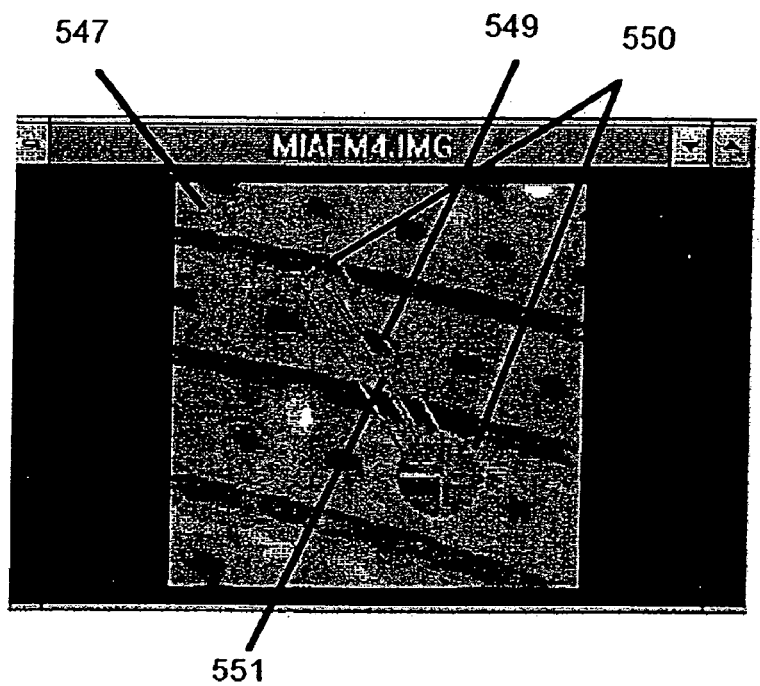

The cutting plane 546 of the 3D volume measuring tool routine 544 is positioned by the user with the pointing device 117 in the same way as with the 3D surface measuring tool 532. After the cutting plane 546 is positioned, the portion of the image 545 between the user's viewpoint and the cutting plane 546 is made transparent with only the silhouette of its surface visible to the user. Furthermore, after the cutting plane 546 is positioned, the 3D volume measuring tool routine 544 also generates cross section data corresponding to the cross section of the image 545 at the intersection of the cutting plane 546 and the image 545. However, in this case the cross section data includes information about interior data points of the cross section. Referring to FIG. 27, the cross section data is formatted for display by the data formatting routine 520 and provided by the CPU 120 to the display 118 for display as a 2D cross sectional image 547. The 3D volume image 545 and the 2D cross sectional image 547 may be displayed in window fashion such that they may be displayed simultaneously together or separately at the command of the user with the terminal 116.

As shown in FIG. 22, the display routines 136 include a 2D measuring tool routine 548 which can be used on the 2D cross sectional image 547, as well as any other 2D image of object 104 displayed by the display 118. The user selects and operates the 2D measuring tool routine 548 by issuing appropriate commands with the terminal 116 for making 2D related measurements of the image 547.

As shown in FIG. 27, when the user selects the 2D measuring tool routine 548, it generates a flat ruler 549 formed by a rectangle projected on the image 547. The data representing the image 547 and the ruler 549 is formatted by the data formatting routine 520 and provided from the CPU 120 to the display 118 which then displays the ruler 549 so that it is projected on the image 547.

Similar to the cutting planes 534 and 546 of the 3D measuring tool routines 532 and 544, the end points 550 of the ruler 549 are magnifying cursers with crosshairs when selected by the user with the pointing device 117. Thus, the ruler may be positioned in the same way as was described for the cutting planes 534 and 546. After the ruler 549 is positioned, the 2D measuring tool routine 548 generates cross section data corresponding to the cross section of the image 547 along the inner region 551 of the ruler 549. This cross section data is generated, displayed, and measured in the same manner as that described earlier for the cross section data 537 shown in FIG. 25.

Figure 28:

The display routines 136 also include a 2D angle measuring tool routine 552 for measuring angles between points of a 2D image. As shown in FIG. 28, when the user selects the 2D angle measuring tool routine 552, it generates an angle measuring tool 553 formed by two flat rulers (similar to ruler 549 described earlier) joined at one of the end points 554 and projected on the image 547. The data representing the image 547 and the angle measuring tool 553 is formatted by the data formatting routine 520 and provided from the CPU 120 to the display 118 which then displays the angle measuring tool 553 so that it is projected on the image 547.

As with each ruler 549, the end points 550 of the ruler 549 are magnifying cursers with crosshairs when selected by the user with the pointing device 117. Thus, the end points 554 may be positioned in the same way as was described for the end points 550 of the ruler 549. After the end points 550 are positioned, the 2D angle tool 552 generates angle data representing the angle formed between the inner regions of the two rulers of the angle measurer 553. The angle data may then be generated and displayed like the cursor data 543 of FIG. 25. Those skilled in the art will appreciate that one of the rulers of the angle measurer 533 could be used as the ruler 549 of the 2D measuring tool 548.

The program used to implement the 3D surface measuring tool routine 532, the 3D volume measuring tool routine 544, the 2D measuring tool routine 548, and the 2D angle measuring tool routine 552 is listed in Appendix B.

Figure 16:
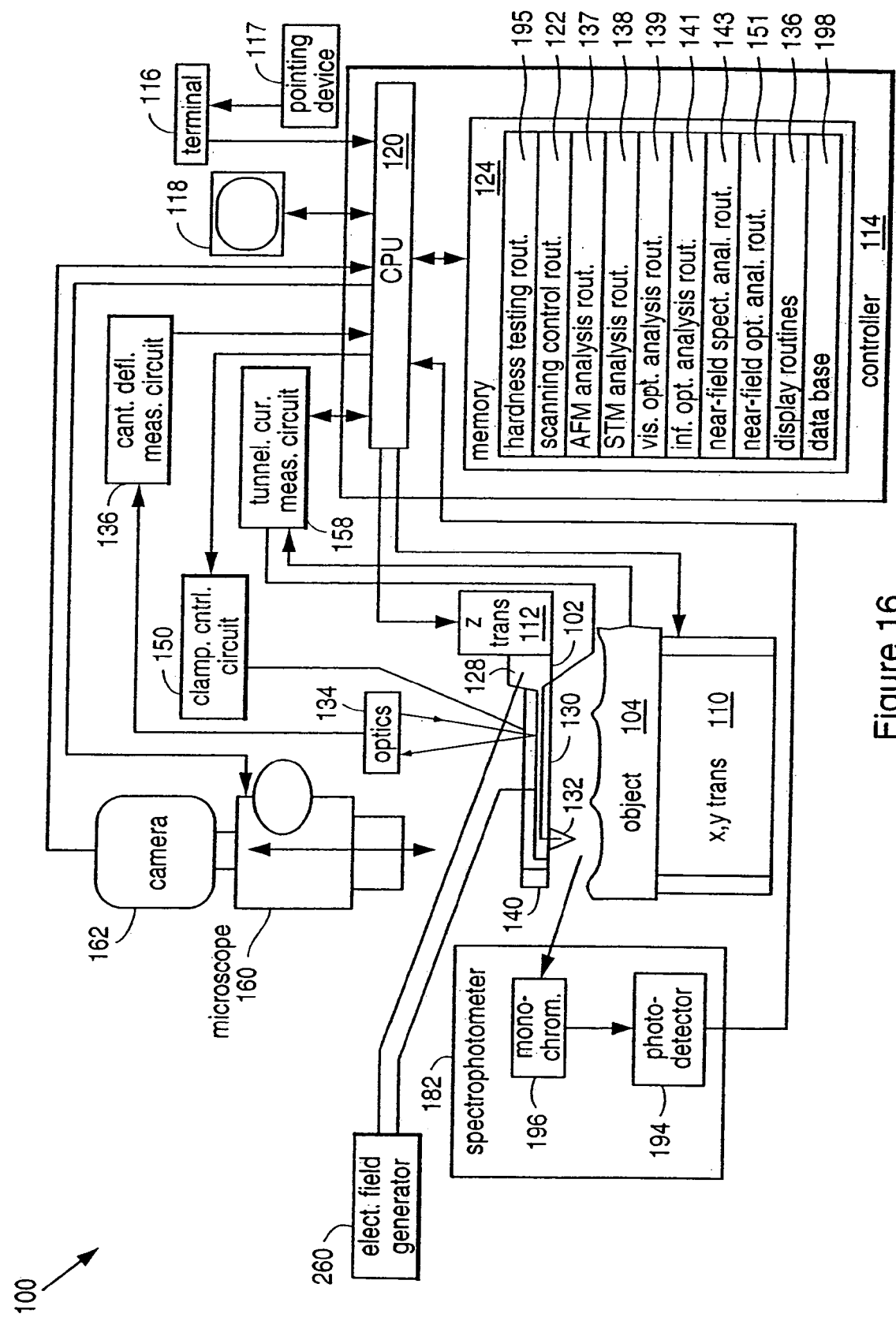
FIG. 16 shows yet another conceptual view of a scanning probe microscope assembly in accordance with the present invention.

The display routines 136 further include a Fast Fourier Transform (FFT) routine 560 for filtering a 3D image, such as image 533 or 545 shown in FIG. 24 or 16. The program used to implement the FFT routine 560 is listed in Appendix C. The user selects and operates the FFT routine 560 by issuing appropriate commands with the terminal 116.

Figure 29:
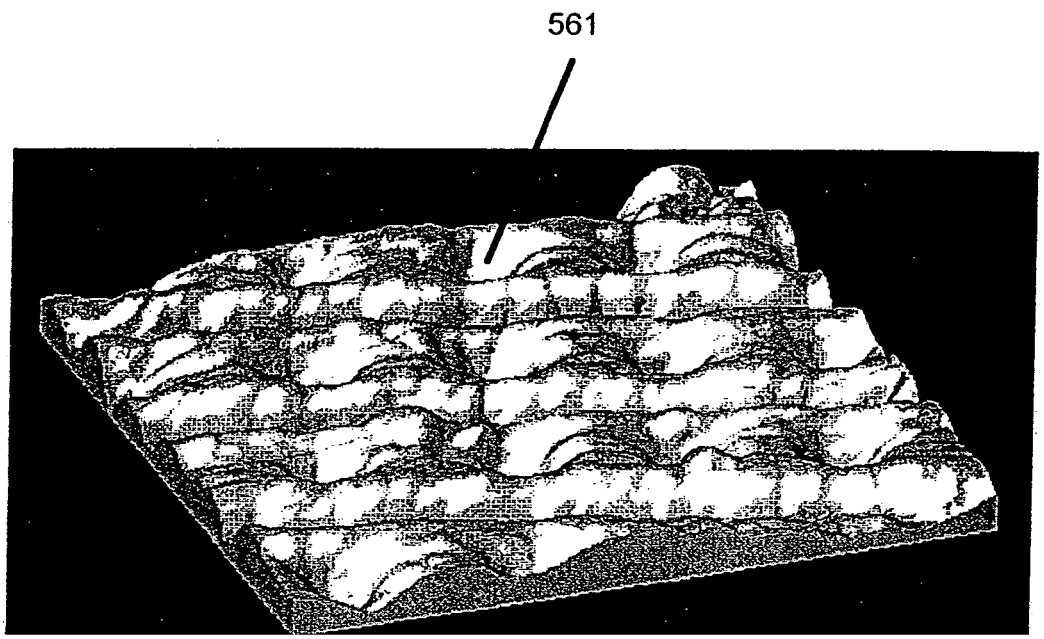
Figure 30:
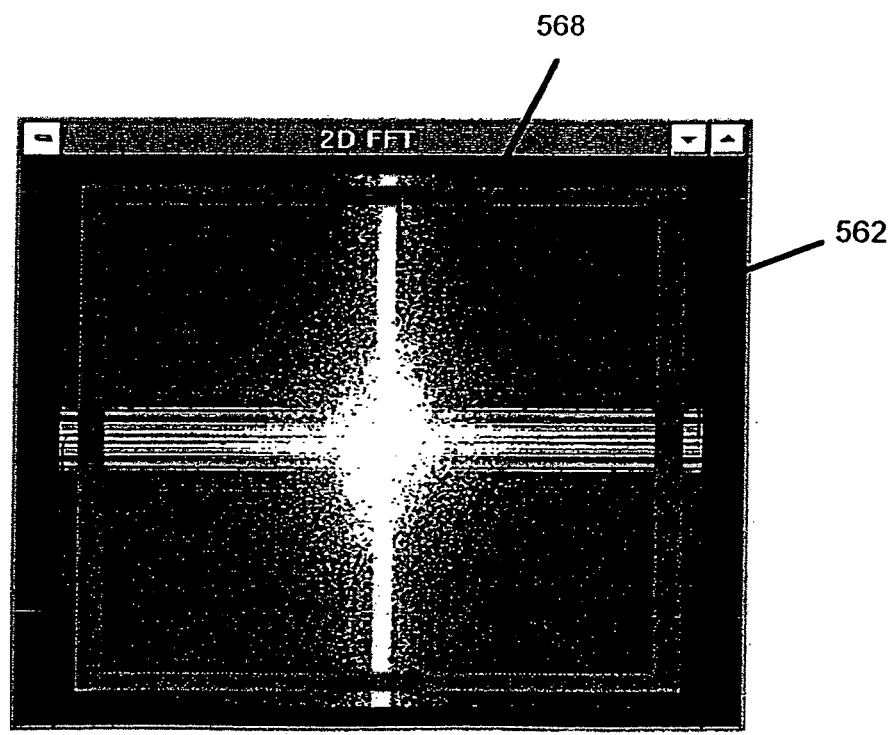
Figure 31:
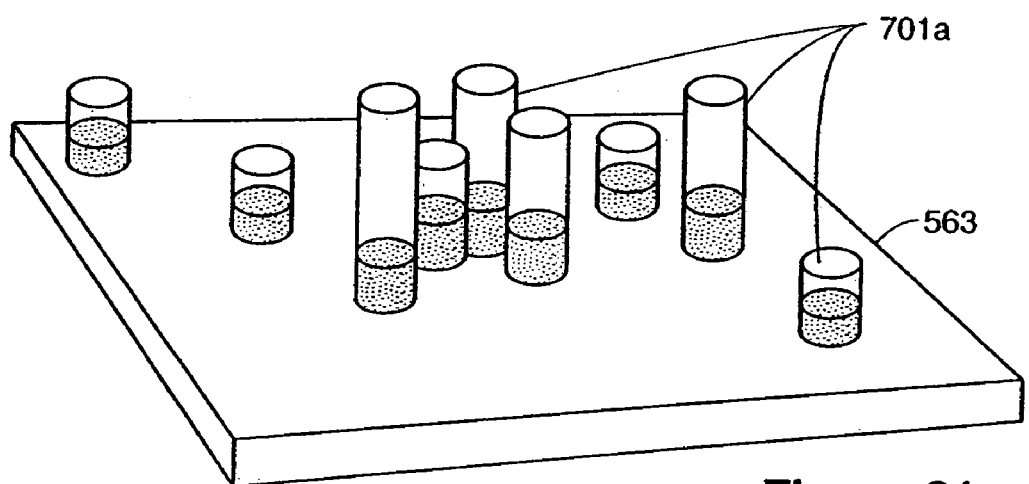

Referring to FIG. 29, when the user selects the FFT routine 560, it generates a 2D FFT of the 3D image 561 currently being displayed by the display 118 and a 3D projection of the 2D FFT. The data representing the 2D FFT and the 3D projection are formatted by the data formatting routine 520 and provided from the CPU 120 to the display 118 which then displays the 2D FFT as the 2D FFT image 562 shown in FIG. 30 and the 3D projection as the 3D FFT image 563 as shown in FIG. 31. The displayed FFT images 562 and 563 provide a mapping of the spatial frequency of the structural elements of the 3D image 561. The 3D image 561, the 2D FFT image 562, and the 3D FFT projection image 563 may be displayed in window fashion such that they may be displayed simultaneously together or separately at the command of the user with the terminal 116.

Figure 33:
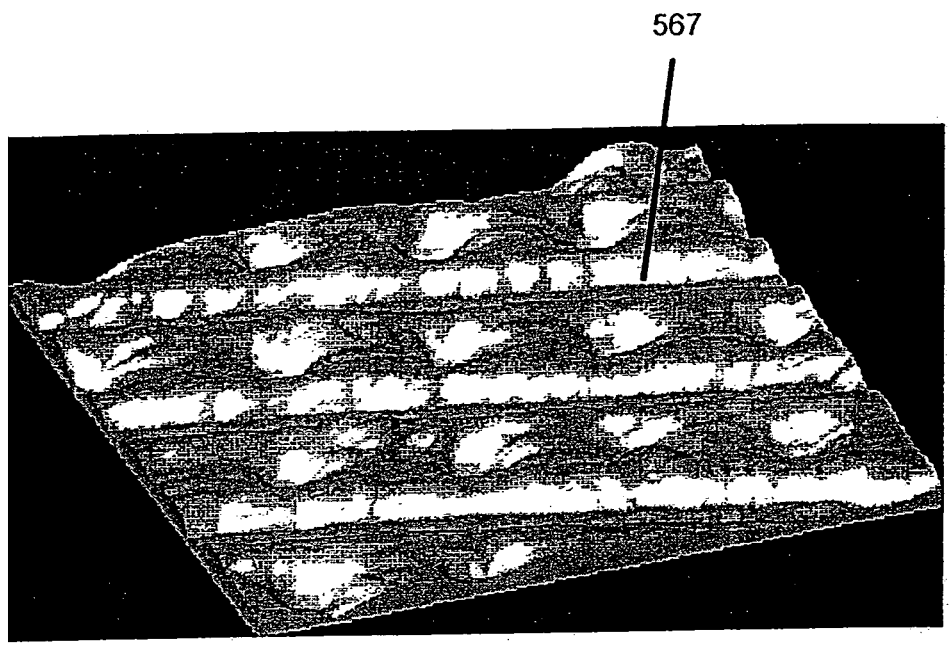

In the 3D FFT image 563, each FFT node of the 2D FFT is a peak whose height (in z) is directly related to its magnitude (or intensity). Thus, the 3D image 563 may then be colored using the color mapping tool routine 521 described earlier. In this way, low magnitudes are colored darker than greater magnitudes so as to establish a floor above which are the principle peaks (FFT nodes) of the original space domain image 561. The FFT routine 560 then makes an individual inverse transform of the data group representing each light colored peak region above the floor which are then all linearly summed together with a single inverse transform of the data group representing all the dark colored regions below the floor to form the 3D image 567 in FIG. 33.

Figure 32:
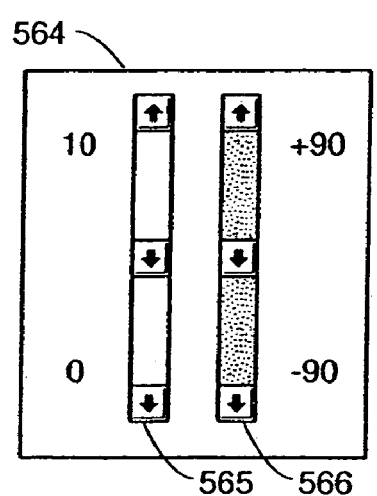

The FFT tool routine 560 generates data representing a control panel. The data is formatted by the data formatting routine and the control panel 564 is displayed by the display 118 as shown in FIG. 32. The user then uses the pointing device 117 to select particular peaks of the 3D FFT image 563 and then manipulate the control bar 565 to increase or decrease the magnitude of the selected peak and the control bar 566 to vary the phase of the selected peak. This permits the user to change the magnitude and phase of each peak using the on screen controls while seeing the change in the resulting image 567 when the inverse transform data group for the peak is changed in response. In modest performance computing platforms even very complex images can be examined by this means in real time (changing for the user as fast as he manipulates the controls).

Additionally, with the pointing device 117, the user can select or create regions (or masks) of the 2D FFT image 562 covering specific spatial frequencies so that structures of spatial frequency within the region can be selected for filtering or amplification by the user. The 2D FFT tool generates the data representing a region and the data formatting routine 520 formats the data so that the region 568 is projected on the 2D FFT image 562 by the display 118. The user then changes the inverse transform data group for the region by using the pointing device 117 to manipulate the control bar 565 of the control panel 564 to increase or decrease the magnitude of the spatial elements within the created region and the control bar 566 to vary the phase of the spatial elements within the created region. Thus, the user can create any shape or number of regions on the 2D FFT in which the magnitudes and phases can be varied continuously. In addition the 2D FFT is calibrated in spacial frequencies each of which are displayed next to the 2D FFT so that structures of specific frequency can be selected while all others are de-emphasized or eliminated.

Furthermore once created the regions 568 form separate FFT masks which can be stored and recalled in data base 198 by the user for reuse with other images in which the regions will automatically size themselves to conform to the spacial characteristics of the new image. That is the regions forming the mask carry the specific spacial frequency information they were formed with and scale according to the range of the image to which they are applied. Thus if a region spanned 2 units square on a ten unit image it would scale down linearly for a 100 unit image and up linearly for a 5 unit image. Therefore these regions have a radial mirrored symmetry directly related to the mirror symmetry of the FFT.

Figure 34:
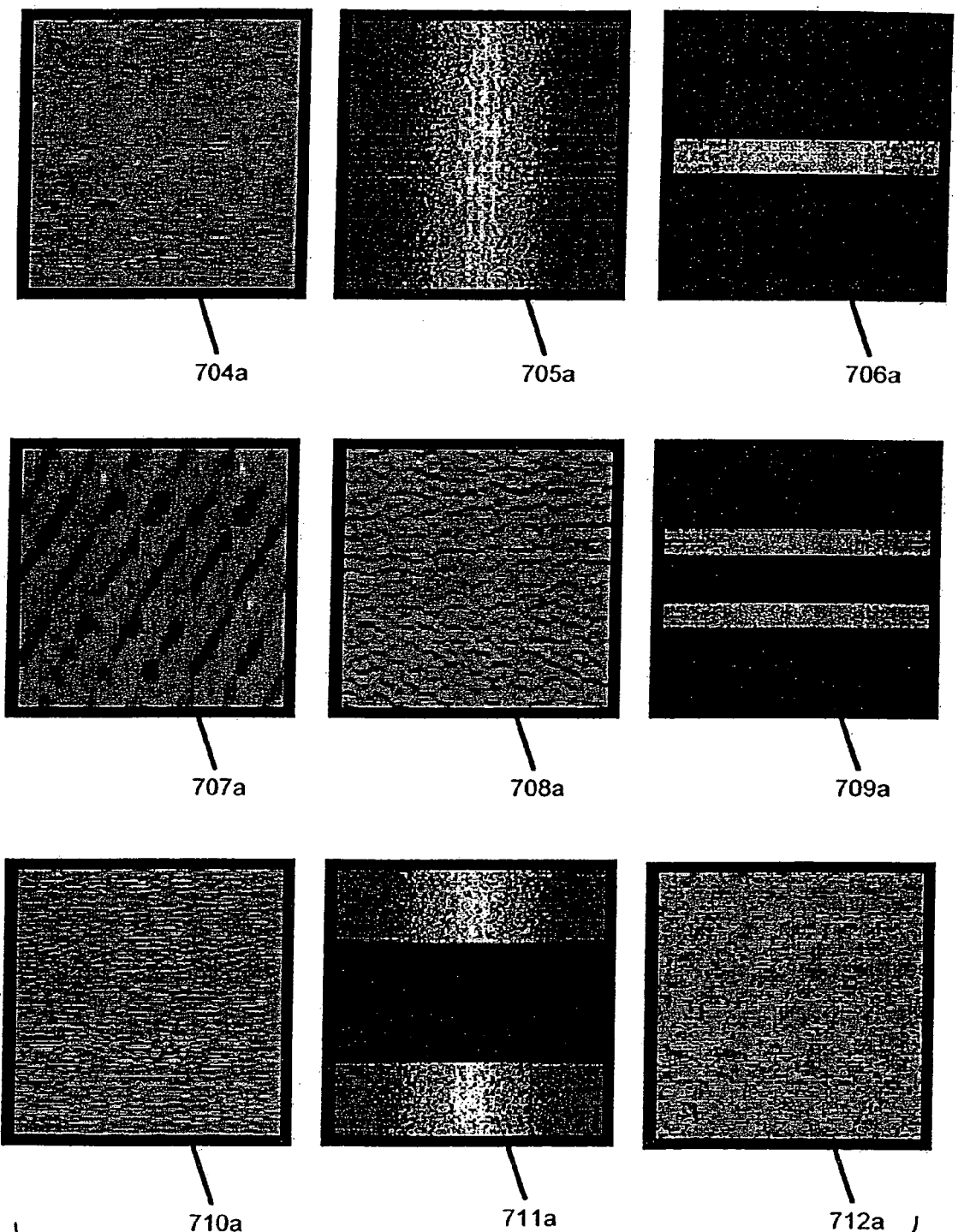

FIG. 34 shows a sequence of masks 705*a*, 706*a*, 709*a*, and 711*a* and images 704*a*, 707*a*, 708*a*, and 710*a* used to create a particular FFT image 712*a*. Each mask is located next to its resultant image. The original image 704*a* has a null or no masking of the associated FFT 705*a*. In addition, the inverse 710*a* is recolored so that the resultant sum image 712*a* of the inverse images 707*a*, 708*a*, and 710*a* shows the spatial components associated with the mask 711*a* in blue.

Figure 35:
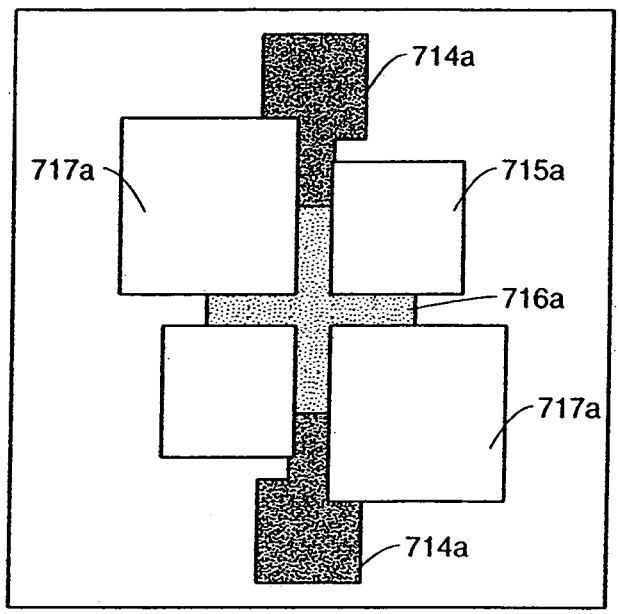

FIG. 35 shows an alternative way to create a multi-region mask on a 2D FFT display by using regions which are drawn with the draw tools in separate colors 714*a*–717*a*. Again each region may be selected and the control panel 564 used to vary the sum inverse image in the user's real time.

Scaling Display Images

Referring again to FIG. 1, diffraction of visible light at the edges of structures of the object 104 may result in these edges being inaccurately represented by the image of the object 104 produced in the low magnification optical microscopy mode by the display routines 136 and displayed by the display monitor 118. However, these edges are accurately represented in the image of the object 104 produced in the high magnification scanning probe microscopy mode by the display routines 136. This is because measurements made during a scan with scanning probe microscopy (in particular AFM and/or STM) accurately resolve or identify the edges of the object 104. Therefore, particular portions of the optical image of the object 104 can be scaled by using particular portions of the scanning probe image.

Specifically, to do this, scanning control routine 122 controls the making of scanning probe microscopy measurements along one or more (i.e., 1 to N) cross sectional scans of object 104. Each cross sectional scan can be made in the manner described earlier with a combination of different types of scanning probe microscopy measurements at various scan points, or with other combinations of these scanning probe microscopy measurements, or with just AFM or STM measurements alone. In fact, AFM measurements are particularly suited to accurately resolving the edges of structures on object 104.

From the scanning probe measurements, the appropriate ones of the scanning probe microscopy analysis routines 137, 138, 143, and 151 generate data that is formatted by the display formatter 520 to produce scanning probe image data of the portion of the object covered by the scanning probe microscopy measurements. From this scanning probe image data, the display formatter 520 computes, for selected structures of the object 104 characteristic parameters (i.e., indicia or dimensions) of the structure which are accurately resolvable by the scanning probe microscopy measurements. For example, the width or length from edge to edge of the structure along the center cross sectional scan and the average width or length from edge to edge and standard deviation over all of the cross sectional scans could be computed. Similarly, the height from the top to bottom of the structure along the center cross sectional scan and the average height and standard deviation over all of the cross sectional scans could be computed.

At the same time, the scanning control routine 122 controls the making of low magnification optical microscopy mode scan of the entire object 104. The analysis routine 139 generates data from the optical microscopy measurements that is formatted into optical image data by the display formatter 520. The display formatter 520 then uses the measurements made during this scan to compute the same parameters for the same structures as were computed using the scanning probe microscopy measurements. The data formatter 520 then compares the two sets of computed parameters and computes a scale (i.e., calibration, correction, or adjustment) factor for scaling (i.e., calibrating, correcting, or adjusting) the optical image data of these structures.

In one approach, the scale factors would be computed for a large number of structures of the object 104. Then, the data formatter would correspondingly scale the optical image data for each structure based on the correction factor computed for it.

Alternatively, the predefined minimum height could be set high so that scale factors would be computed for only the highest structures of the object 104 in certain regions. Then, the scanning probe microscopy measurements over the cross sectional scans could be used by the data formatter 520 to identify the boundary of the regions or areas which include these structures and have the same overall approximate surface roughness. Since the surface roughness is a measure of (i.e., correlated to) the albedo (i.e., reflectivity) of the surface, the computed scale factors can be used to correspondingly scale the optical image data for each region (including the corresponding structure within the region for which the scale factor was computed).

Of course, either of these two approaches can be used regionally for the object 104 such that the predefined minimum height selected for each region is different. Moreover, these approaches can be used regionally in combination such that one approach may be used for some regions while the other approach is used for other regions.

The selective use of scanning probe microscopy with optical microscopy can be used to substantially reduce the overall time needed to conduct a scan of an object. Specifically, although a confocal optical microscopy scan of an entire object takes about ⅓₀ to ⅙₀ of a second, a typical AFM or STM scan of an entire object takes about 1 to 2 minutes. Thus, by using scanning probe images of selected portions of an object developed with AFM and/or STM measurements to accurately scale an overall image of the object developed with confocal optical measurements in the manner just described, the overall scan time for scanning an object to develop an accurate image of the object can be significantly reduced.

Furthermore, as indicated earlier, AFM and STM alone cannot define with fine resolution walls of structures which prevent the end of the probe tip 132 from coming close enough to the object in these areas for accurate inspection. As a result, the angle of the walls of the object 104 may not be accurately represented by the scanning probe image of the object 104 when only AFM and/or STM measurements are being used. However, the angle of the walls are accurately represented in the optical image of the object 104 because measurements made during a scan with optical microscopy accurately resolve or identify the walls of the object 104. Therefore, particular portions of the scanning probe image of the object 104 can be scaled by using particular portions of the optical image.

Specifically, wall angles in the optical image data may be used directly to replace those wall angles in the scanning probe image whenever the wall angles approach or exceed the predetermined angle of the tapered tip 132. For example, this will occur when the bottom portion of a hole has a diameter that approaches the diameter of the tip 132 or when the height change of a structure (i.e., wall) defines an angle that approaches or exceeds the predetermined angle of the tip 132. This sufficiently eliminates the tip angle/wall angle interaction in scanning probe microscopy when only AFM and/or STM is used.

In operation, the data formatter 520 computes from the optical image data the wall angle for structures whose height changes rapidly enough to define an angle that approaches or exceeds the angle of the tapered tip 132. The computed angles for these structures are then used to scale or correct the corresponding angles in the scanning probe image data.

Furthermore, the resolution in terms of heights of structures of the scanning probe image data is very accurate. But, the accuracy of these heights may not be as accurate because of drift in the Z piezoelectric translator 112 due to hysterisis, the motion of the tip 132 actually being an arc, temperature and humidity.

Thus, an optical interferomic measure of height in Z using the Mach Zender arrangement described earlier between two areas on the object 104 may be used as a reference to scale the scanning probe microscopy heights obtained directly from the same surface areas. Specifically, the data formatter 520 takes the heights determined by the scanning control routine 122 during the scanning probe microscopy scan over these areas and computes an average height between the two areas. The data formatter 520 than compares this average height to the average height it computes between these same areas using the scanning probe image data and then computes a scale factor. The scale factor is then applied to all of the scanning probe image data to scale the heights of all structures of the scanning probe image data.

Establishing Safe Heights for AFM and/or STM Operation

Additionally, the optical image of the regions of interest or the entire object 104 may be used to create a known height map of a safe non-measurement making height or heights at which the tip 132 may be moved without mechanical interference with the object 104 when not actually making measurements of the object 104 during a scanning probe microscopy scan. Specifically, the scanning control routine 122 takes the optical image data developed during a optical microscopy mode and constructs a height map. It then controls positioning of the tip 132 when not making measurements during a scanning probe microscopy scan so that it is always as close as reasonably possible to the surface of the object 104 without interfering with it. By operating the tip 132 at the safe non-measurement making height(s), the tip 132 can be lowered from the safe height(s) to the measurement making heights for actually making measurements with the tip 132 during the scanning probe microscopy modes. Thus the total time of any scan which normally includes substantial time for lowering the tip into proximity to the surface can be substantially reduced.

Closed Feedback Loop Scanning

Figure 36:
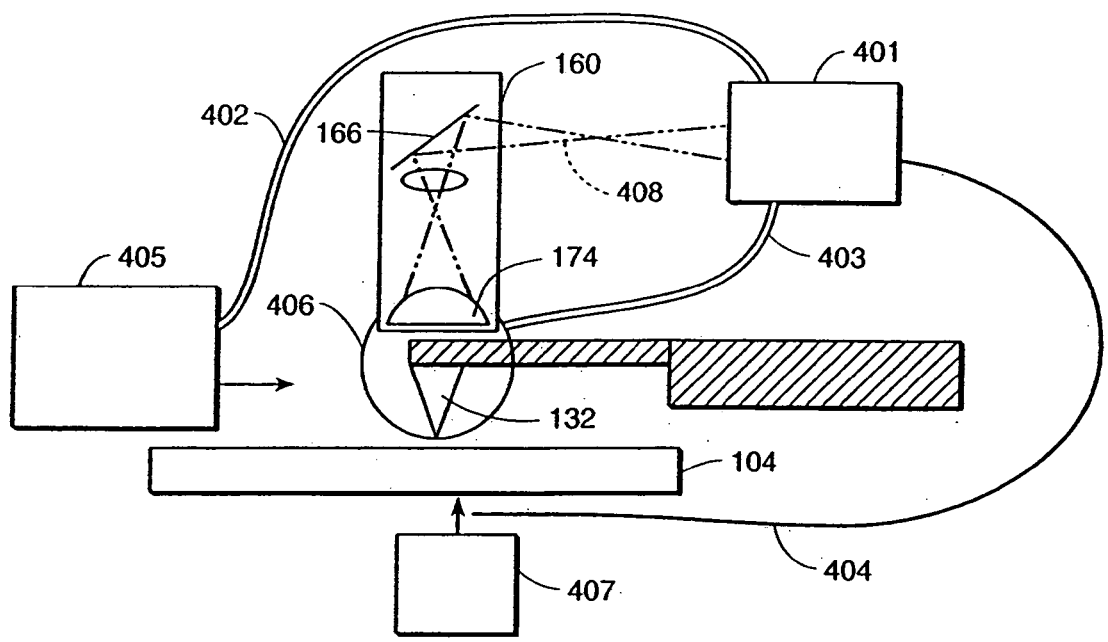
FIG. 36 shows a Mach-Zehnder interferometer for measuring the position of the tip of a scanning probe microscope.

As shown in FIG. 36, the scanning probe microscope assembly 100 may include a Mach-Zehnder interferometer arrangement to determine the position of the tip 132. In this arrangement, reference light sources 405–407 which may comprise lasers, operate at different visible or infrared wavelengths (i.e., different colors) and respectively shine light at the tip 132 in the X, Y, and Z directions. Fiber optic light guides 402–404 pick off part of the light from the light sources 405–407, respectively. The light shone on the tip 132 by the light sources 405–407 is captured or collected by the tip 132 in the manner discussed earlier and provided to the optical microscope 160 by the lens 174. The mirror 166 directs the light to a dual detector 401.

Detector 401 splits the collected light into light beams of the constituent colors of the lasers with appropriate filters. It then combines each split light beam with the light from the corresponding one of the light guides 402–404 and provides the each combined light beam to an independent high gain photodetector (such as a photomultplier). The data output of the photodetectors is provided to the scanning control routine 122 which calculates the position of the tip 132 in X, Y, and Z based on the interferometric characteristics (i.e., intensity) of the combined light beams represented by the data provided by the photodetectors.

Alternatively, only one of the light sources 405–407 could be used and mirrors implemented so that the light provided by the light source is shone in the X, Y, and Z directions at different time periods. The light captured with the tip 132 during each time period is combined with the light picked off by the corresponding one of the light guides 402–404 to provide an interferometric measure of the position in X, Y, and Z.

In either case, scanning control routine 122 can reposition the tip in a closed feedback loop fashion so as to provide servo controlled positioning of the tip 132.

Referring back to FIG. 1, in an alternative embodiment, the optical microscope 160 may be used as an inverted biological confocal optical microscope so that it is located below the object 104 and X,Y translator 110. The scanning control routine 122 may then control the emission of light from tip 132 in the manner described earlier or in the manner to be described later. This light would be emitted at a chopping frequency of the type described earlier for lock in detection and amplification. The portion of the X,Y translator 110 supporting the object 104 is transparent so that the light passes through the object 104 and this portion of the X,Y translator 110 and is detected by the optical microscope 160.

The camera 162 then converts all the light focused to it by the microscope 160 into a data signal containing data representing an image of the focused light. The data contained by the signal is analyzed and processed by the scanning control routine 122 to determine the location of the tip 132 in the X and Y directions. Since the position of the tip 132 corresponds to a particular pixel in the camera 162, the light emitted by the tip 132 is locked into this pixel with the chopped frequency and therefore can be identified by the scanning control routine 122. As a result, the scanning control routine 122 can compute the position of the tip 132 in X and Y and therefore can control positioning of the tip 132 in X and Y in a feedback loop fashion. Moreover, as those skilled in the art will recognize, this may be done where optical microscope 160 is a conventional, spot scan, or spinning disk confocal optical microscope.

Alternatively, the tip 132 may be a light absorbing (or colored) tip or dyed to be fluorescing at a particular wavelength (by use of well known dyes such as rodomine-B). Thus, in the case where optical microscope 160 is a confocal microscope, the tip can be made to fluoresce when light of a particular wavelength is shone on the tip 132 by the confocal microscope 160. The light is detected by use of a filter which blocks all light except that corresponding to the light emitted by the tip and a photodetector to detect the light. Alternatively, the confocal microscope can shine light of a particular wavelength on the tip 132 which will be absorbed by the tip 132. The absorption of the light is detected by use of a filter and a photodetector. Therefore, in either case, the position of tip 132 can be computed from the data provided by the photodetector to the scanning control routine 122.

Moreover, when optical microscope 160 is a spot scan or spinning disk confocal microscope, it can be used to determine the position of the tip 132 in Z by being controlled by the scanning control routine 122 to focus on the tip 132. Thus, from the data signal provided from the camera 162, the scanning control routine 122 can compute the position of the tip 132 in Z. Therefore, in this case, scanning control routine can now control positioning of the tip 132 in X, Y, and Z in a feedback loop fashion. For example a optical microscope 160 may be used to image a semiconductor mask or wafer from below in the visible spectrum and infrared light emitted by the tip 132 on the top of the wafer or mask may then be used to determine the exact position of the tip 132 on the wafer.

Coincidental Surface Scan

Additionally, in the case where optical microscope 160 is an inverted biological type spot scan or spinning disk confocal optical microscope, an optical map of the surface of the object 104 coincident with the surface of the object 104 scanned with the tip 132 in the scanning probe microscopy mode can be made. This is done in a similar fashion to that just described for positioning the tip 132 in a feedback loop fashion except that an optical map in X, Y, and Z of the surface of the object 104 is generated by the analysis routine 141 using the accurate feedback loop positioning just described during a scanning probe microscopy scan. This is because a collection of focus points under the tip 132 will make a confocal optical map of the surface coincident with the surface probed by the tip 132 during the scanning probe microscopy scan.

The data formatter 520 may then replace the map of the surface of the optical image data developed during an confocal optical microscopy scan with the coincident confocal optical surface map just described. Similarly, an exact offset surface may be plotted optically by collecting points some ±ΔZ displaced from the coincident confocal surface just described. Among other things such coincident confocal surfaces may provide important information about the deformation of the surface made by the tip 132 during the AFM mode and guide the insertion of the tip 132 a specific distance into the surface during the AFM or hardness testing modes. That is, the coincident confocal surface may be used by the scanning control routine 122 to servo control the Z distance the tip 132 is pushed into the specimen during AFM or hardness testing modes.

DESCRIPTION OF THE SECOND EMBODIMENT

Figure 11:
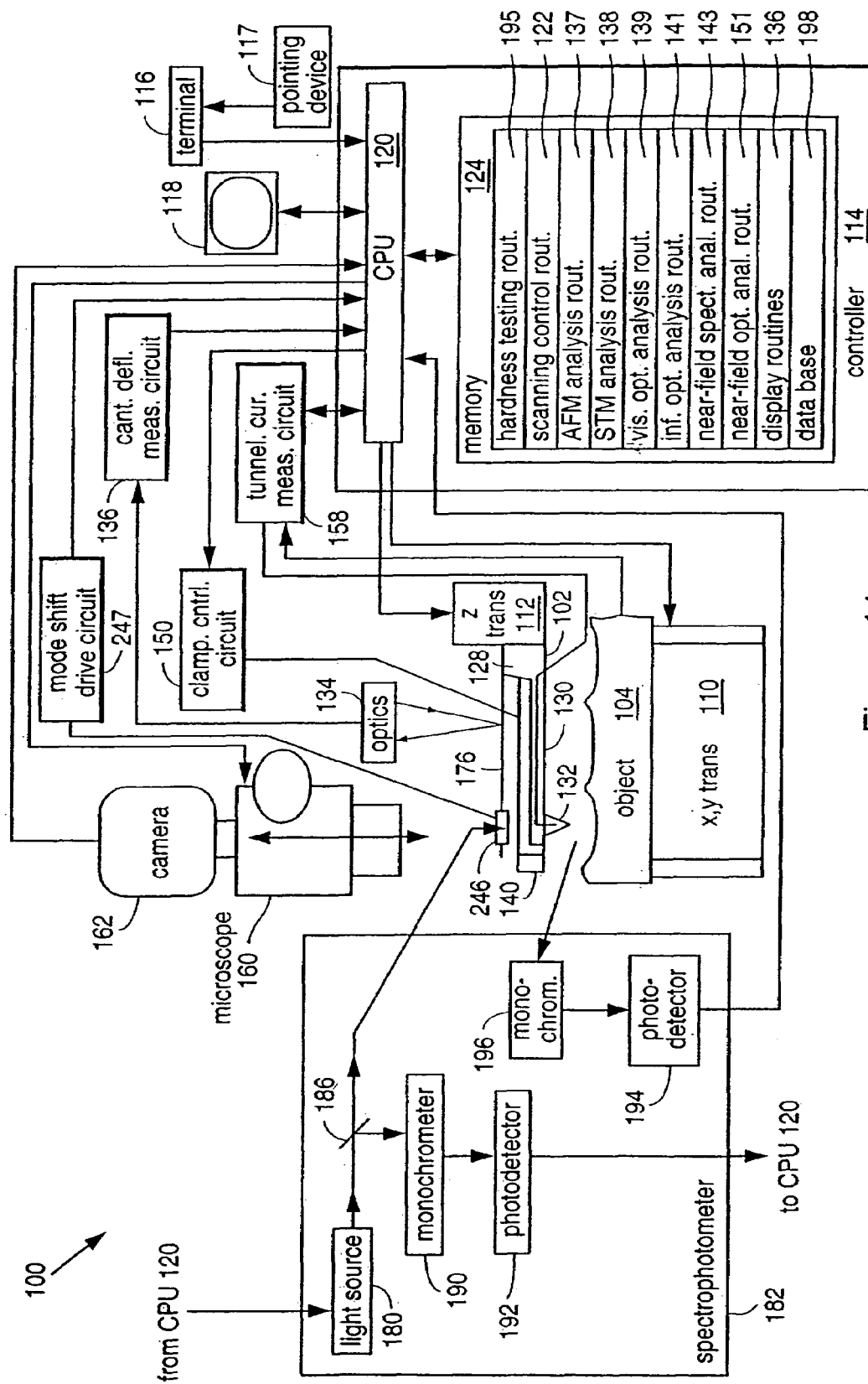
FIG. 11 shows another conceptual view of a scanning probe microscope assembly in accordance with the present invention.

Referring to FIG. 11, there is shown a conceptual diagram of another embodiment of a scanning probe microscope assembly 100 in accordance with the present invention. In this embodiment, scanning probe microscope assembly 100 includes a fiber optic light guide 244 for guiding the light 185 provided by the light source 180 to the probe 102.

Figure 12A:
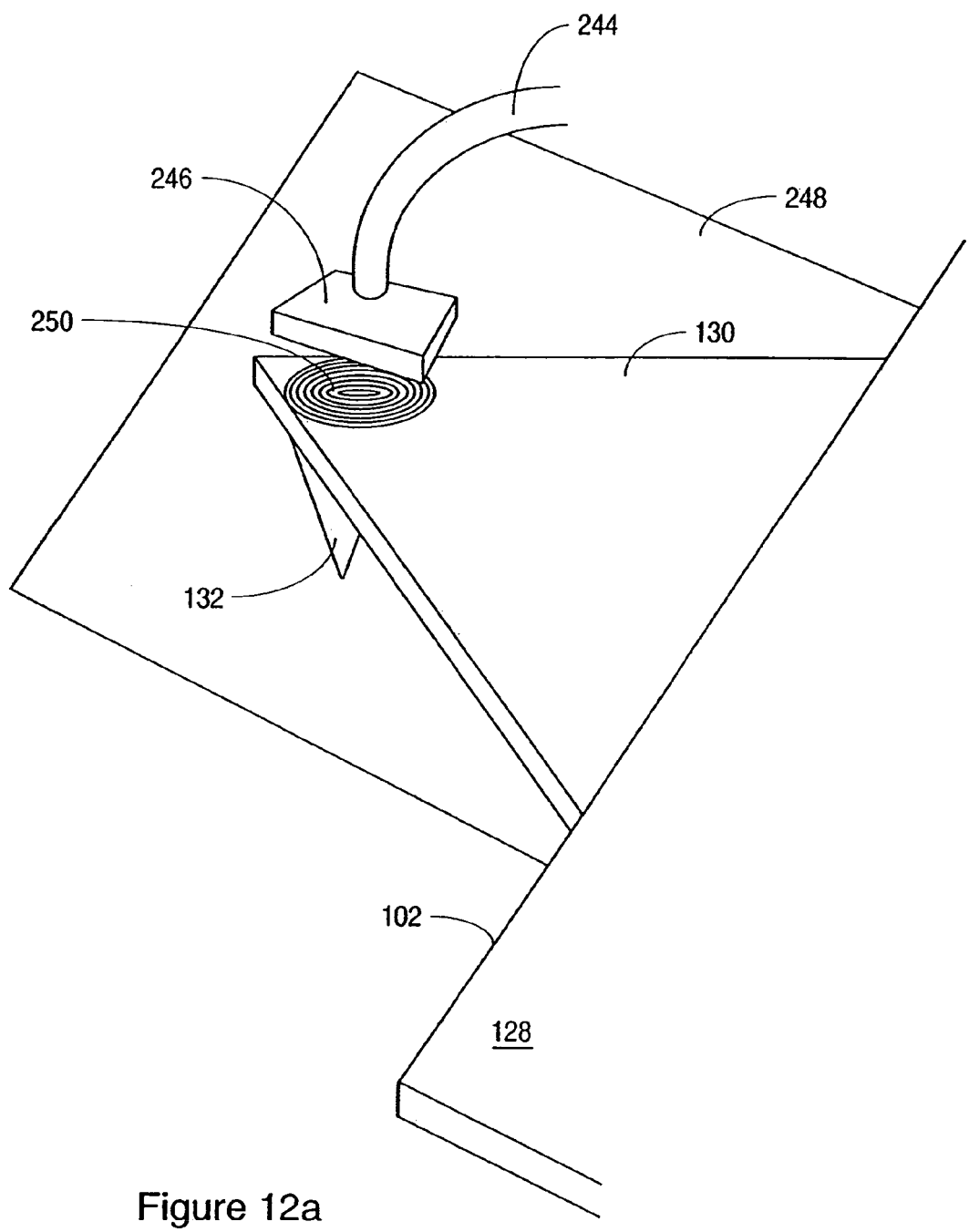
FIG. 12a shows the probe of the scanning probe microscope assembly of FIG. 11 with a mode shifter and a fresnel lens over the tip of the probe.
Figure 12B:
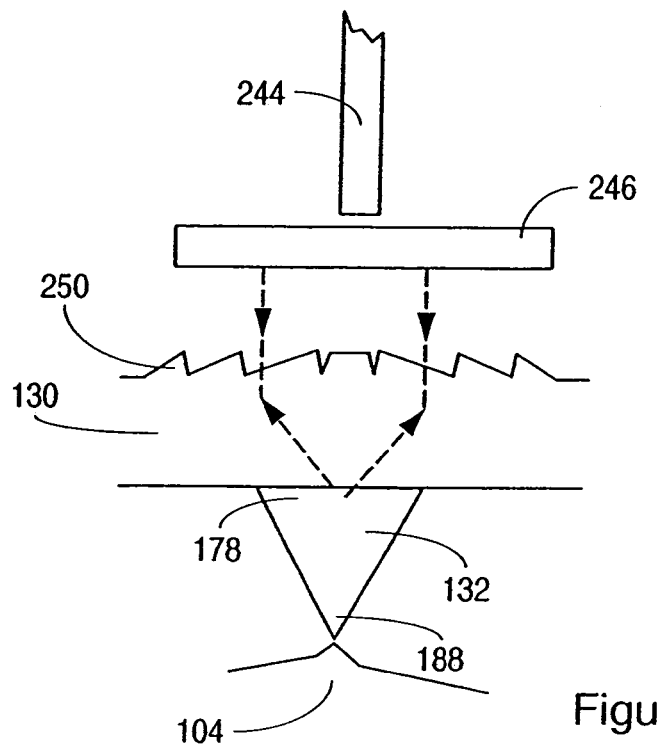

As shown in FIGS. 12a and 12b, the light guide 244 is optically coupled to an electro-optic mode shifter 246. Referring to FIG. 12a, the mode shifter 246 is held and supported by a thin support 248 connected to the base 128 of the probe 102 and is disposed over the fine fresnel lens 250 formed in the cantilever 130. The support 248 is transparent to visible light.

The electro-optic mode shifter 246 may be a plane polarizer on top of a liquid crystal in conjunction with a wave plate and is connected to the light guide 244 with optical cement. The plane polarizer of the mode shifter 246 plane polarizes the light received from the light guide 244. At the same time, the scanning control routine 122 generates control signals for controlling the mode shift drive circuit 247 to apply a variable voltage to the liquid crystal. In response to the applied voltage, the liquid crystal rotates the plane polarized light and the wave plate in response alternatingly produces right circular, elliptical, and left circular polarized light provided to the frensel lens 250. In other words, the mode shifter 246 continuously changes the polarization state of the light provided by the light source 180 during the near-field optical mode.

Alternatively, a mechanically rotatable plane polarizer such as polarizer 184 of FIG. 1 may be used to rotationally polarize the light provided by the light source 180. In this configuration, the mode shifter 246 includes only the wave plate. When scanning control routine 122 generates control signals for controlling the polarizer 184 to rotationally plane polarize the light provided to the mode shifter 246, then right circular, elliptical, and left circular light is alternatingly produced during the near-field optical mode by the wave plate of the mode shifter 246.

However, those skilled in the art will appreciate that other configurations may be employed for rotating or continuously changing the polar state of the light 185 during the near-field optical mode. For example, the mode shifter 246 may be entirely omitted with the light 185 being rotationally polarized as was described for the configuration of FIG. 1. Also, the mode shifter 246 may include a ferro-optic liquid crystal (with the wave plate being omitted) that may be electrically excited to change the polarization state. Or, the mode shifter may be a Pockels cell (with the wave plate being omitted) that may be excited with an electric field to change the polarization state. Moreover, a mechanically rotatable Glan prism may be used.

Referring to FIG. 12b, the light 185 provided by the light guide 244 to the mode shifter 246 is passed to the fresnel lens 250 and then focussed within the base 178 of the tip 132 by the fresnel lens 250. As was indicated earlier, the light 185 focused within the base 178 propagates through the tip 132 and is emitted at the sharp end 188 of the tip 132. The emitted light 185 optically interacts with the object 104 and the sharp end 188 of the tip 132 captures the resulting light due to the optical interaction of the emitted light with the object 104. This light propagates back through the tip 132 to the fresnel lens 250 which provides it to the mode shifter 246. From there, it is provided to the light guide 244 which guides the light back to the spectrophotometer 180 for spectrophotometric measurements in the same way as was described earlier. Moreover, photoemissive energy due to the optical interaction is detected by the photodetector 194 as was the case in the embodiment of FIG. 1.

This embodiment includes all of the modalities described above for the embodiment of FIG. 1 except the medium magnification mode.

DESCRIPTION OF THIRD EMBODIMENT

Figure 13:
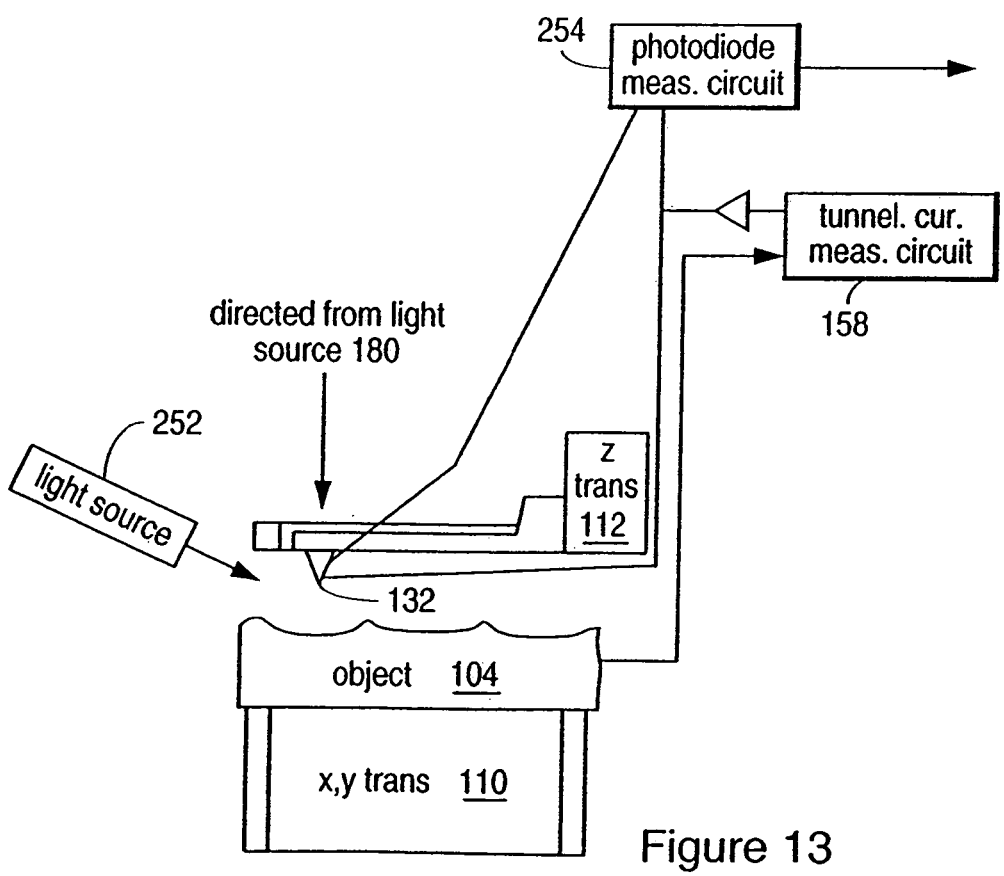
FIG. 13 shows still another conceptual view of a scanning probe microscope assembly in accordance with the present invention.
Figure 14:
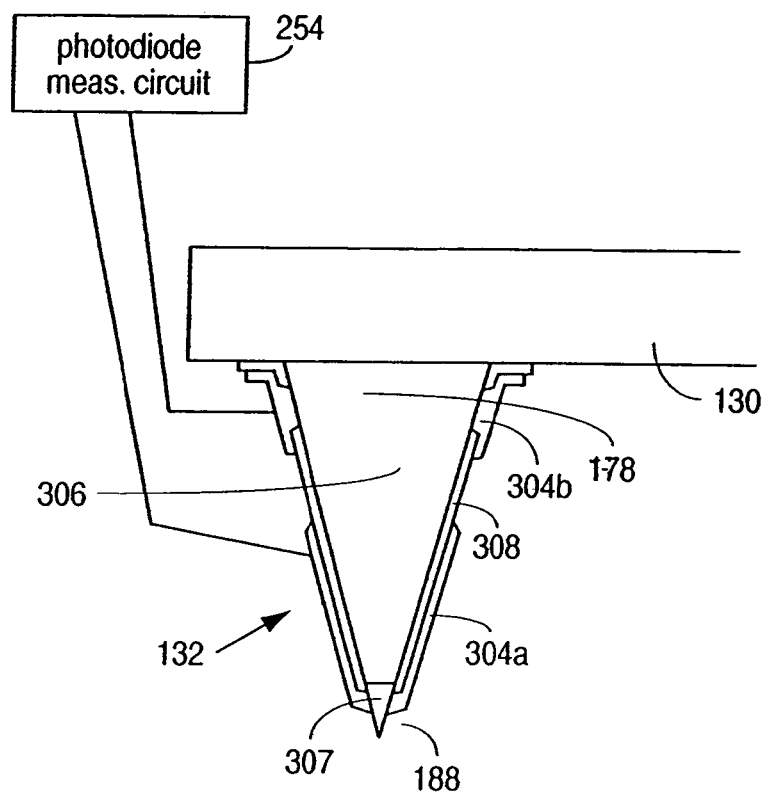
FIG. 14 shows the photodiode tip of the probe of the scanning probe microscope assembly of FIG. 13.

FIG. 13 in conjunction with FIG. 14 provides a variation to the embodiments of FIGS. 1 and 11. In this embodiment, a photodiode is built into the tip 132 for making near-field spectrophotometric measurements similar to those described earlier.

Referring to FIG. 14, the bulk silicon portion 306 of the tip 132 is doped to be N or P type and then oxidized so as to have a thick silicon dioxide layer 308. A small region 307 (e.g., approximately 10 nm) at the sharp end 188 of the silicon tip 132 is oppositely doped (P or N doped) to the bulk silicon portion 306 and oxidation etched.

Then, the entire tip 132 is lightly overcoated with a conductive material such as doped silicon carbide, aluminum, tungsten, gold, or other appropriate conductor and then etched to form the conductive contacts 304a and 304b. Similar to the tips 132 of FIGS. 8a–8d, the conductive coating 304a is removed or rubbed off from the sharp end 188 of the tip 132. Or, if the conductive coating 304a is a sufficiently light metal layer, it may pass an adequate amount of light without being removed. Moreover, if the conductive coating 304a is a conductive optically transparent material like doped silicon carbide, then it need not be removed at all.

In any case, this is all done through conventional techniques known to those skilled in the art and results in a tip 132 with a PN or NP junction confined to a very small region of the tip 132 at the sharp end 188. This small junction area forms the effective aperture of the tip 132.

Referring to FIG. 13, in operation, an external light source 252 may be used to illuminate the region of the tip at the object 104 for spectrophotometric measurements made with the photodiode. Alternatively, infrared light 185 may be provided to the tip 132 in the ways described for FIGS. 1 an 11. The light 185 is emitted by tip 132 to induce Raman, second harmonic radiation, florescence or other photoemissive modes at the surface of the object 104 beneath the tip 132. In either case, the optical energy detected by the photodiode is represented by a voltage across the metal contacts 304a and 304b of FIG. 14 and is provided to the photodiode measurement circuit 254 which measures the optical energy and provides the CPU 120 with a signal containing data representing the measured optical energy. This data is then analyzed and processed by the near-field spectrophotometry analysis routine 143 in the same way as was discussed earlier for the data received from the photodetector 192.

Referring to FIGS. 1 and 13, in an alternative embodiment, the optical microscope 160 may be used as an inverted biological confocal optical microscope as described earlier. The scanning control routine 122 may then control the optical microscope to shine light on the tip 132.

The photodiode tip 132 then detects the light and the photodiode measurement circuit 254 provides a data signal to the scanning control routine 122 indicating the intensity of the light. As a result, the position of the tip 132 in X and Y can be computed by the scanning control routine 122 from this data signal and therefore it can also control positioning of the tip 132 in X and Y in a feedback loop fashion.

Moreover, as in discussed earlier, when optical microscope 160 is a spot scan or spinning disk confocal microscope, it can be used to determine the position of the tip 132 in Z by being controlled by the scanning control routine 122 to focus on the tip 132. Therefore, in this case as well, scanning control routine can now control positioning of the tip 132 in X, Y, and Z in a feedback loop fashion.

Additionally, in this embodiment as well, a coincident confocal optical surface map can be generated. Such a map would be made and used in a similar way to that described earlier. However, in this case, the X and Y positions of the tip 132 (and therefore the map) are computed using the photodiode feature of the tip 132, in the manner just described.

DESCRIPTION OF FOURTH EMBODIMENT

Figure 15:
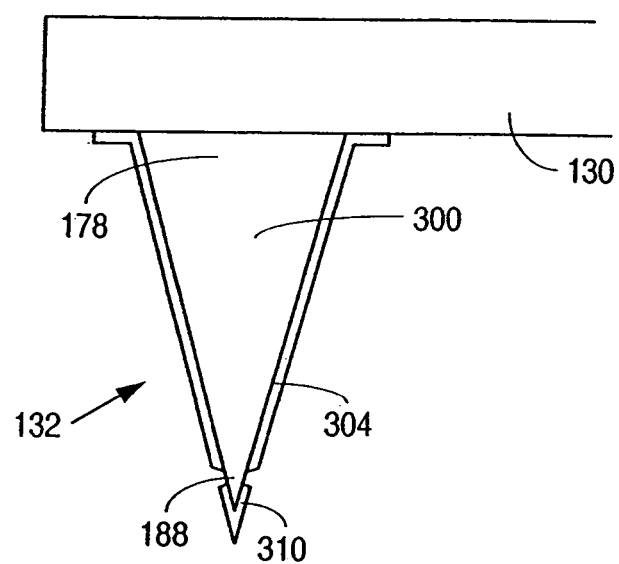
FIG. 15 shows a tip of a probe for use with the scanning probe microscope assembly of FIGS. 1 and 11.

FIG. 15 shows another variation of tip 132 for the embodiments of FIGS. 1 and 11. In this case, a coating 310 of an emissive material, such as gallium nitride or gallium arsenide, or a non-linear frequency doubling emissive material, such as potassium niobate or lithium titanate, is coated over a small region of the core material 300 at the sharp end 188 of the tip 132. The coating 310 extends approximately a few Angstroms to 10's of Angstroms from the point of the sharp end 188 and has a thickness in the range of approximately 0.5 to 500 Angstroms.

The conductive coating 304 over the core material 300 of the tip 132 ends approximately few 10's of nm away from the point of the sharp end 188 of tip 132. Thus, the spatial resolution in the near-field of this arrangement is limited only by the size of this material rather then the electromagnetic confinement properties of the coatings on tip 132 or the smoothness of tip 132. In other words, the aperture of tip 132 at the sharp end 188 is formed by the coating 310.

Light 185 may be provided to the tip 132 in the ways described for FIGS. 1 and 11. This light propagates down the tip 132 and interacts with the coating 310 and is emitted at the sharp end 188. This light may induce Raman, second harmonic radiation, florescence or other photoemissive modes at the surface of the object 104 beneath the tip 132 for the near-field spectrophotometric mode or may be used in the way described earlier for the near-field optical mode. The light resulting from the optical interaction with the object 104 is detected by photodetector 194.

DESCRIPTION OF THE FIFTH EMBODIMENT

Referring to FIG. 16, there is shown a conceptual diagram of still another embodiment of a scanning probe microscope assembly 100 in accordance with the present invention. In this embodiment, scanning probe microscope assembly 100 includes an electric field generator 260 for applying an electric field to the probe 102 so that light including blue and/or ultraviolet light is emitted by the tip 132 in response.

Figure 17A:
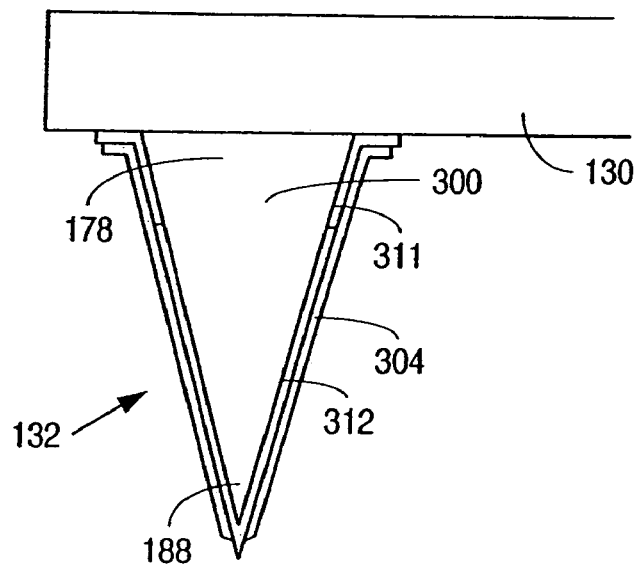
FIGS. 17a–17c show light emissive tips for use with the scanning probe microscope assembly of FIG. 16.

As shown in FIG. 17a, the core material 300 of the tip 132 at the base 178 and the core material 300 of the cantilever 130 around the base 178 are first coated with an emissive material 311 such as gallium nitride or gallium arsenide at a thickness of approximately 10 to 200 nm. Then, the tip 132 is coated with an insulating material 312 such as diamond, silicon carbide, carbon nitride, or silicon dioxide with a thickness of approximately 1 to 10 nm. The portion of the coating 312 over the emissive material 311 is removed using conventional techniques and then a conductive layer 304 of aluminum, gold, tungsten, or some other conductor is formed over the emissive material 311 and the coating 312 with a thickness of approximately 20 to 200 nm. Similar to the tips 132 of FIGS. 8a–8d, the conductive coating 304 is removed or rubbed off from the sharp end 188 of the tip 132 to form an aperture near the sharp end 188.

Referring back to FIG. 16, during the near-field spectrophotometry mode describe earlier, scanning control routine 122 controls the electric field generator 260 to generate an electrical field (voltage). This is applied between the outside conductive layer 304 shown in FIG. 17a and the core silicon material 300 of the probe 102. As a result, with an applied voltage of approximately 4 volts, blue (423 nm) and ultraviolet light (372 nm) is emitted by the emissive coating 310 as described in *Deposition Characterization, and Device Development in Diamond, Silicon Carbide, and Gallium Nitride Thin Films*, by Robert F. Davis, Journal of Vacuum Science and Technology, volume A 11(4) (July/August 1993). The light propagates through the tip 132 until it is emitted at the sharp end 188 of the tip 132 in a small region substantially smaller than the wavelength of the light.

Figure 17B:
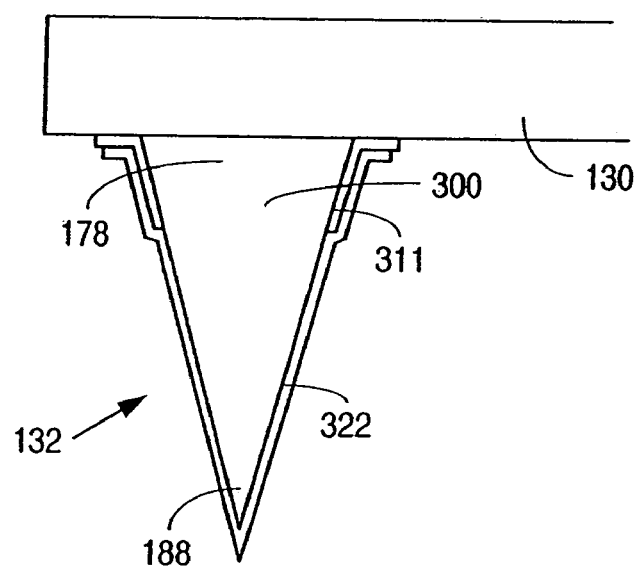

Alternatively, as shown in FIG. 17b, a silicon carbide coating 322 over the emissive coating 311 may be doped to be conductive. As a result, the conductive coating 304 would be omitted and a voltage would be applied by the electric field generator 260 across the core silicon material 300 and the silicon carbide coating 312 so that the emissive coating 311 produces the blue and ultraviolet light.

Figure 17C:
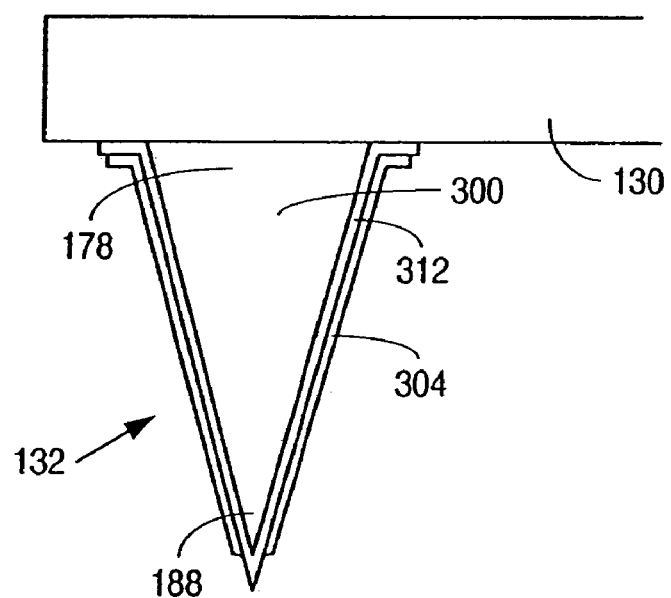

Moreover, as shown in FIG. 17c, the core silicon material 300 of the cantilever 130 and tip 132 may be first coated with a silicon carbide layer 312. The silicon carbide is then doped to be emissive in the way described in *Deposition Characterization, and Device Development in Diamond, Silicon Carbide, and Gallium Nitride Thin Films*. Then, a conductive layer 304 of aluminum, gold, tungsten, or some other conductor is formed over the silicon carbide layer 312. Similar to the tips 132 of FIGS. 8a–8d, the conductive coating 304 is removed or rubbed off from the sharp end 188 of the tip 132 to form an aperture near the sharp end 188. An applied voltage between the conductive layer 304 and the core silicon material 300 results in blue light being emitted by the silicon carbide layer 322, as described in *Deposition Characterization, and Device Development in Diamond, Silicon Carbide, and Gallium Nitride Thin Films*. The light energy propagates through the tip 132 until it is emitted at the sharp end 188 of the tip 132.

In each of the configurations described above, photoemissive energy due to the optical interaction is detected by the photodetector 194 in the near-field spectrophotometry and optical modes in the same way as described for the embodiment of FIG. 1.

DESCRIPTION OF THE SIXTH EMBODIMENT

Figure 18:
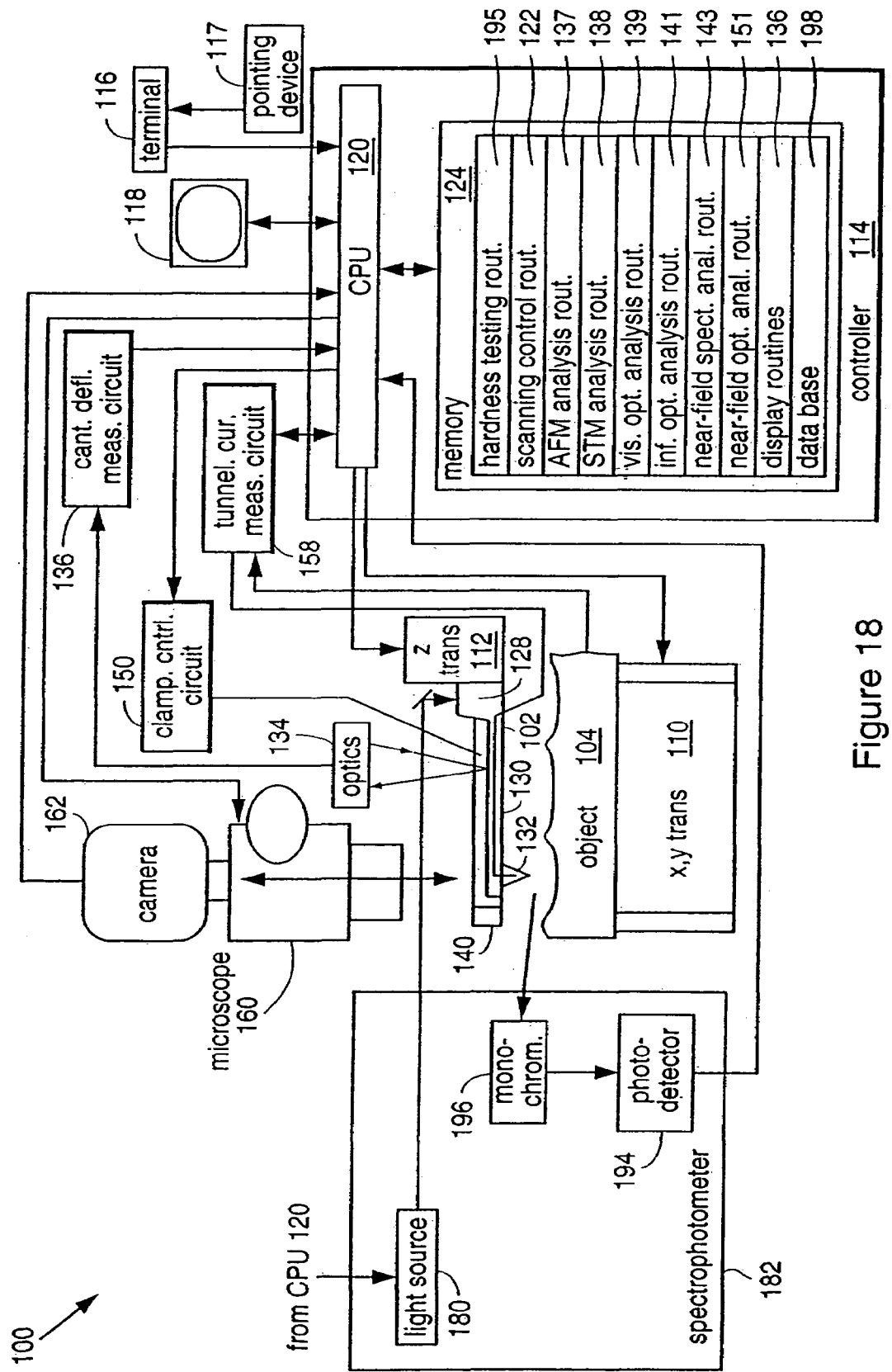
FIG. 18 shows one more conceptual view of a scanning probe microscope assembly in accordance with the present invention.

Referring to FIG. 18, there is shown a conceptual diagram of yet another embodiment of a scanning probe microscope assembly 100 in accordance with the present invention. In this embodiment, scanning probe microscope assembly 100 includes an infrared light source 270 and mirror 272 for providing infrared light 273 to the base 128 of the probe 102. Alternatively, a fiber optic light guide such as the one shown in FIG. 11 may be used to provide the light 273 to the base 128 of the probe 102.

Figure 19A:
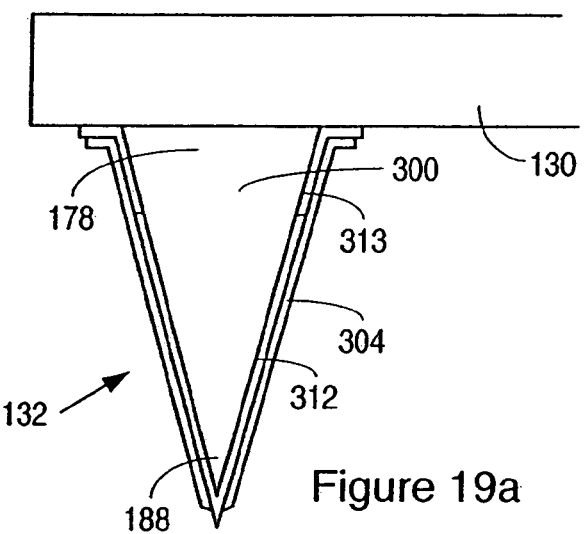
FIG. 19a shows a frequency doubling tip and cantilever for use with the scanning probe microscope assembly of FIG. 18.

As shown in FIG. 19a, the core material 300 of the cantilever 130 near the base 178 of the tip 132 is first coated with a non-linear frequency doubling emissive material 313 such as potassium niobate or lithium titanate. Then, the tip 132 is coated with an obdurate material or insulator 312 such as diamond, silicon carbide, or silicon dioxide. The portion of the coating 312 over the frequency doubling emissive material 313 is removed using conventional techniques and then a conductive layer 304 of aluminum, gold, tungsten, or some other conductor is formed over the frequency doubling emissive material 313 and the coating 312. Similar to the tips 132 of FIGS. 8a–8d, the conductive coating 304 is removed or rubbed off from the sharp end 188 of the tip 132 to form an aperture near the sharp end 188.

Figure 19B:
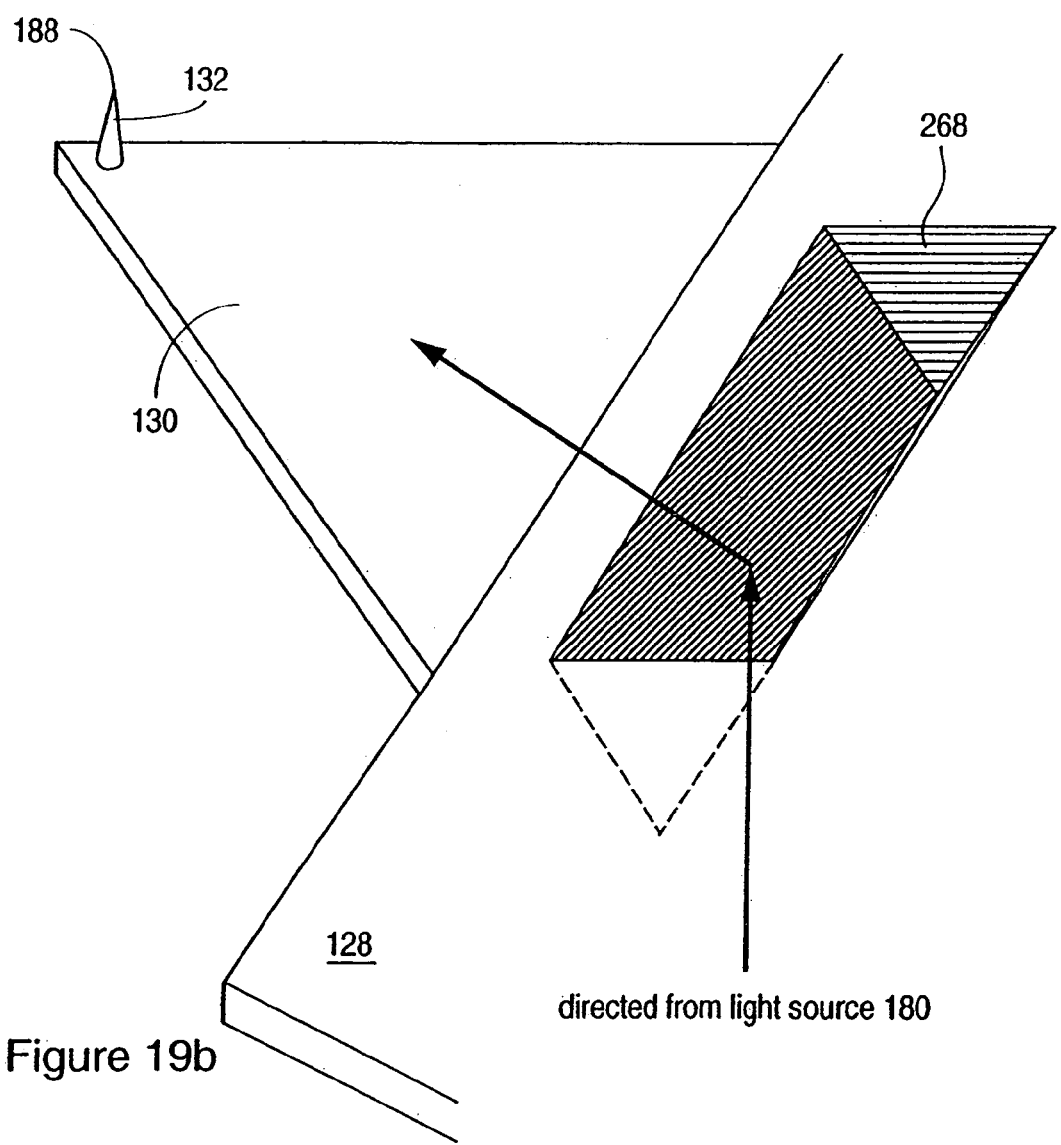
FIG. 19b shows a trench reflector for use with the scanning probe microscope assembly of FIG. 18.

As shown in FIG. 19b, an elongated pyramid shaped trench (or similar reflecting structure) 268 is etched into the bottom of the base 128 to form a reflecting surface. This trench 268 directs the infrared light 273 into the cantilever 130 where it will be frequency doubled by the frequency doubling material 330. The frequency doubled light energy propagates through the tip 132 until it is emitted at the sharp end 188 of the tip 132.

In this embodiment, photoemissive energy due to the optical interaction is detected by the photodetector 194 in the same way as described or the embodiment of FIG. 1.

And, the near-field spectrophotometry and optical modes are not included in this embodiment but the other modalities described above for the embodiment of FIG. 1 are still included.

DESCRIPTION OF SEVENTH EMBODIMENT

Figure 37:
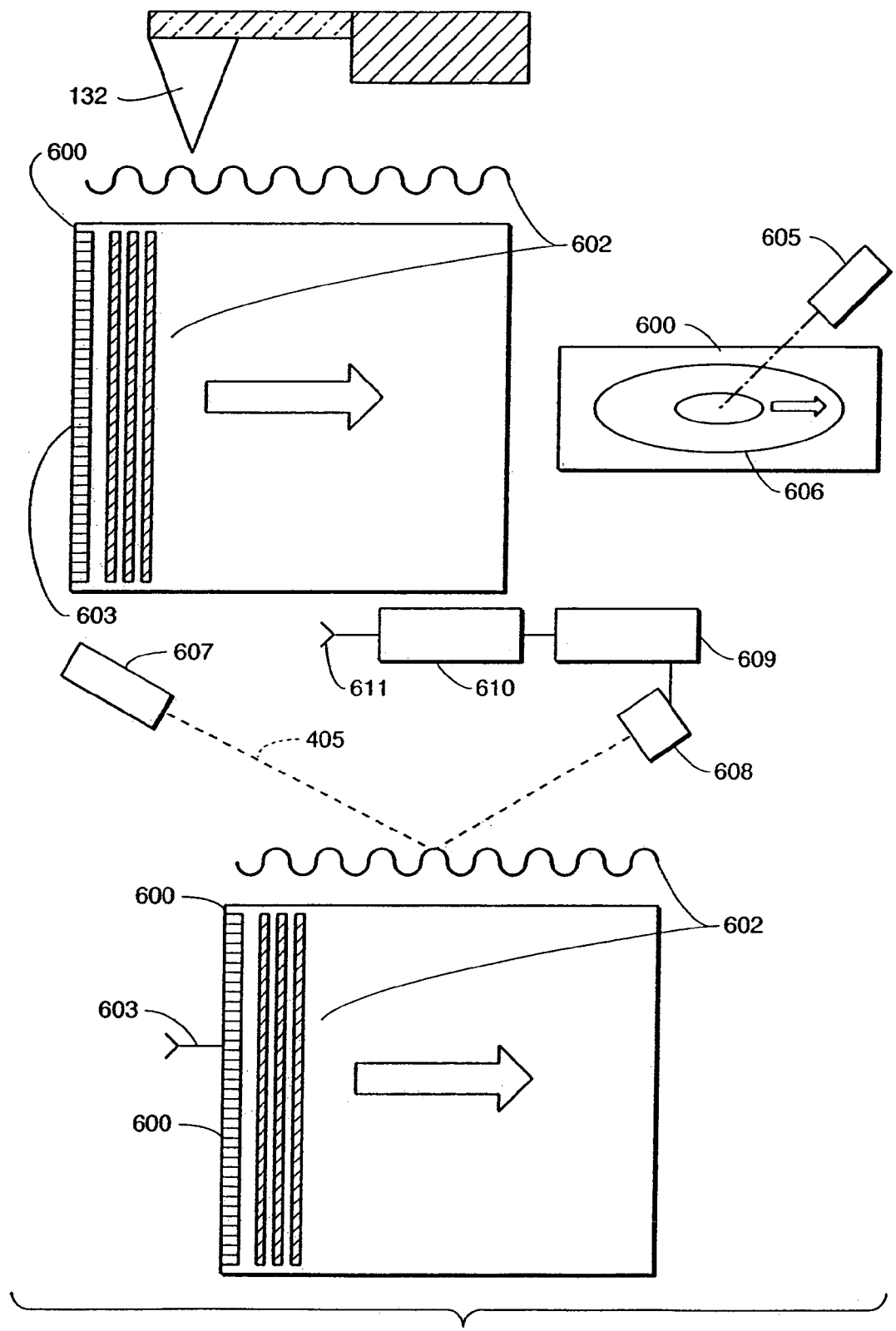
FIG. 37 shows an atomic force microscope probe sensing an acoustic wave in accordance with the present invention.

FIG. 37 shows tip 132 in the AFM mode sensing an acoustic wave 602 propagating to the right and generated by piezoelectric exiter strip 603 on glass semiconductor mask specimen 600. The scanning control routine 122 controls the generation of the acoustic wave 602. In one mode of operation, the acoustic wave is generated continuously and, in conjunction with reflections from the edges of the specimen, forms standing acoustic waves on the surface at the acoustic excitation wavelength.

After scanning a line, the image data generated by the analysis routine 137 is fourier transformed and the component of the transform at the excitation frequency is masked and amplified (the magnitude is increased) and color coded (a separate color is assigned to this wavelength only) by the display routines 136 to provide a precise reference in the final specimen image. Alternately the acoustic signal may be pulsed at each point of the scan to provide a difference signal for each point of the scan and permit the position of the tip to be adjusted according to the displacement measured by the reference acoustic wave. Clearly both techniques may be used sequentially or in selected portions of the scan.

Modulated laser 605 may also be used to excite an acoustic wave on the specimen 600 at a point (or with proper beam shaping in a line, oval, or rectangular area to create a parallel wave 602) to produce circular waves 606 whose generation could be made closer to the scanned area of the specimen and thereby overcome attenuation at very small wavelengths. Furthermore techniques for generation of picosecond and femptosecond pulses capable of generating acoustics wavelengths in the Angstrom range are well known to those in the art.

A calibration control system 607 through 611 can be used to drive the piezoelectric wave generator 603 or acoustic excitation laser and modulator 605 at frequencies locked to a reference optical frequency. In operation a chopped monochromatic light source such as a laser 607 reflects light off the acoustic wave 602 or 606 on the specimen 600 into a linear array (or square array) sensitive detectors 608. Due to the diffraction effects of the grating like structure formed by the acoustic wave 602 or 606, the diffraction angle will be sensitively limited by wavelength of the light and the acoustic grating spacing. Control circuit 609 (which acts to lock in the signal to chopping frequency of the source light, thus rejecting extraneous light sources) increases and decreases the acoustic drive frequency output by acoustic drive signal generator 610 to lock it to the reference optical frequency at any given diffraction angle. Multiple sensors within detectors 608 are aligned in the plane of the diffraction angle allow different angles (and thus acoustic wavelengths) to be selected and locked against the reference optical frequency. In addition the use of vernier acoustic excitation (exciting a beat frequency in the acoustic waves) allow any acoustic wavelength to be reference locked to the optical frequency.

Conclusion

While the present invention has been described with reference to a few specific embodiments, the description is illustrative of the invention and is not to be construed as limiting the invention. Furthermore, various other modifications may occur to those skilled in the art without departing from the true spirit and scope of the invention as defined by the appended claims.

What is claimed is:

1. A scanning probe microscope assembly for examining an object, comprising:
    a probe having a tip with a sharp end;
    means for inducing and detecting non-optical interaction of said tip and said object, said non-optical interaction being other than a tunneling current between said tip and said object;
    a light source optically coupled to said tip for providing light to said tip;
    said tip being shaped to emit light resulting from said provided light at said sharp end so that said emitted light optically interacts with said object, wherein said tip is shaped to capture light resulting from said emitted light optically interacting with said object; and
    a photodetector that is optically coupled to said tip for detecting said captured light.

2. A scanning probe microscope assembly as recited in claim 1 wherein:
    said probe includes a cantilever connected to said tip; and
    said non-optical interaction inducing and detecting means includes means for inducing atomic force interaction between said tip and said object and for detecting deflection of said cantilever due to said atomic force interaction.

3. A scanning probe microscope assembly as recited in claim 1 wherein said non-optical interaction inducing and detecting means includes, in addition to said means for inducing and detecting non-optical interaction that is other than a tunneling current between said tip and said object, means for inducing and detecting a tunneling current between said tip and said object.

4. A scanning probe microscope assembly as recited in claim 1 further comprising a spectrophotometer including said light source and said photodetector for making spectrophotometric measurements of said resulting light.

5. A scanning probe microscope assembly as recited in claim 1 wherein:
    said tip has a base; and
    said scanning probe microscope assembly further comprises a lens disposed over said tip and optically coupled between said light source and said tip for focusing said provided light in said base of said tip.

6. A scanning probe microscope assembly as recited in claim 5 wherein said lens is a fresnel lens.

7. A scanning probe microscope assembly as recited in claim 5 wherein said lens is a refractive lens.

8. A scanning probe microscope assembly as recited in claim 1 wherein:
    said tip has a base; and
    said scanning probe microscope assembly further comprises a lens disposed over said tip and optically coupled between said light source and said tip for focusing said provided light in said base of said tip, said lens also optically coupled between said tip and said photodetector for focusing said captured light for detection by said photodetector.

9. A scanning probe microscope assembly as recited in claim 8 further comprising means for directing said provided light to said lens and for directing said focused captured light to said photodetector.

10. A scanning probe microscope assembly as recited in claim 9 wherein said directing means includes a fiber optic light guide optically coupled between said light source and said lens and between said photodetector and said lens.

11. A scanning probe microscope assembly as recited in claim 1 wherein said photodetector includes a photodiode formed in said tip for detecting said captured light.

12. A scanning probe microscope assembly as recited in claim 11 wherein:
said photodiode comprises:
a first doped silicon region in said tip;
a second doped silicon region in said tip oppositely doped to and in contact with said first doped region;
a first conductive region in contact with said first doped region;
a second conductive region in contact with said second doped region;
said photodetector further comprises a photodiode measurement circuit coupled across said first and second conductive regions for making measurements of said captured light detected by said photodiode.

13. A scanning probe microscope assembly as recited in claim 1 wherein said emitted light is light that results from said provided light being transmitted through said tip.

14. A scanning probe microscope assembly as recited in claim 1 wherein said emitted light is light emitted by a coating on said sharp end of said tip that results from an interaction between said provided light and said coating.

15. A scanning probe microscope assembly for examining an object, comprising:
a probe having a tip with a sharp end and a base;
means for inducing and detecting non-optical interaction of said tip and said object, said non-optical interaction being other than a tunneling current between said tip and said object;
a light source optically coupled to said tip for providing light to said tip;
a fresnel lens that is formed in said probe over said tip for focusing said provided light in said base of said tip;
said tip being shaped to emit light resulting from said provided light at said sharp end so that said emitted light optically interacts with said object; and
a photodetector for detecting light resulting from said emitted light optically interacting with said object.

16. A scanning probe microscope assembly for examining an object, comprising:
a probe having a tip with a sharp end wherein said tip includes a core material transparent to said provided light and an obdurate layer transparent to said provided light over said core material at least at said sharp end;
means for inducing and detecting non-optical interaction of said tip and said object, said non-optical interaction being other than a tunneling current between said tip and said object;
a light source optically coupled to said tip for providing light to said tip;
said tip being shaped to emit light resulting from said provided light at said sharp end so that said emitted light optically interacts with said object; and
a photodetector that is optically coupled to said tip for detecting light resulting from said emitted light optically interacting with said object.

17. A scanning probe microscope assembly as recited in claim 16 wherein said obdurate layer comprises diamond oriented normal to the surface of said core material.

18. A scanning probe microscope assembly as recited in claim 16 wherein said obdurate layer comprises silicon carbide.

19. A scanning probe microscope assembly as recited in claim 16 wherein said silicon carbide is doped to be conductive.

20. A scanning probe microscope assembly as recited in claim 16 wherein said obdurate layer comprises carbon nitride.

21. A scanning probe microscope assembly as recited in claim 16 wherein said obdurate layer comprises tungsten.

22. A scanning probe microscope assembly for examining an object, comprising:
a probe having a tip with a sharp end;
means for inducing and detecting non-optical interaction of said tip and said object;
a light source optically coupled to said tip for providing light to said tip wherein said tip includes a core material transparent to said provided light and a light-emissive coating over said core material at said sharp end, which light-emissive coating emits light in response to said provided light;
said tip being shaped at said sharp end so that emitted light from said light-emissive coating optically interacts with said object; and
a photodetector for detecting light resulting from said emitted light optically interacting with said object.

23. A scanning probe microscope assembly for examining an object, comprising:
a probe having a tip with a sharp end;
means for inducing and detecting non-optical interaction of said tip and said object;
a light source optically coupled to said tip for providing light to said tip wherein said tip includes a core material transparent to said provided light and a frequency-doubling coating over said core material at said sharp end, which frequency-doubling coating emits light, referred to as emitted light, in response to said provided light;
said tip being shaped at said sharp end so that emitted light from said frequency-doubling coating optically interacts with said object; and
a photodetector for detecting light resulting from said emitted light optically interacting with said object.

24. A scanning probe microscope assembly for examining an object, comprising:
a probe having a tip, said tip including:
a core material with a sharp end;
a light emissive layer over at least a portion of said core material; and
a conductive layer over said light emissive layer but not over said core material at said sharp end;
means for applying a voltage between said conductive layer and said core material so that said light emissive layer emits light within said probe that propagates through said probe and is emitted at said sharp end, said emitted light optically interacting with said object; and
a photodetector for detecting light resulting from said emitted light optically interacting with said object.

25. A scanning probe microscope assembly as recited in claim 24 wherein:
said probe includes a cantilever connected to said tip; and
said scanning probe microscope assembly further comprises means for inducing atomic force interaction between said tip and said object and for detecting deflection of said cantilever due to said atomic force interaction.

26. A scanning probe microscope assembly as recited in claim 24 further comprising means for inducing and detecting a tunneling current between said tip and said object.

27. A scanning probe microscope assembly as recited in claim 24 wherein said emissive layer comprises gallium nitride.

28. A scanning probe microscope assembly as recited in claim 24 wherein said emissive layer comprises gallium arsenide.

29. A scanning probe microscope assembly as recited in claim 24 wherein said emissive layer comprises silicon carbide doped to be emissive.

30. A method of operating a scanning probe microscope for examining an object, said scanning probe microscope having a probe that includes a base, a cantilever connected to said base, and a tip connected to said cantilever, said scanning probe microscope assembly having a tunneling current mode and an atomic force mode, the method comprising:
inducing and detecting a tunneling current between said tip and said object during said tunneling current mode;
inducing atomic force interaction between said tip and said object and detecting deflection of said cantilever due to said atomic force interaction during said atomic force mode; and
immobilizing said tip with respect to said base so as to prevent said tip from moving toward or away from said object during said tunneling current mode, wherein:
said cantilever has a lower surface to which said tip is connected and an upper surface; and
said immobilizing said tip with respect to said base is accomplished by;
a member disposed over said upper surface of said cantilever;
a first coil on said upper surface of said cantilever;
a second coil on said lower surface of said member; and
producing currents in said coils to magnetically immobilize said tip with respect to said base during said tunneling current mode.

31. A method of operating a scanning probe microscope for examining an object wherein
said scanning probe microscope has a probe that includes a base, a cantilever connected to said base, and a tip connected to said cantilever,
said cantilever has a free end adjacent to said tip, and
said scanning probe microscope assembly has a tunneling current mode and an atomic force mode,
the method comprising:
inducing and detecting a tunneling current between said tip and said object during said tunneling current mode;
inducing atomic force interaction between said tip and said object and detecting deflection of said cantilever due to said atomic force interaction during said atomic force mode;
providing a clamping structure having a clamping arm connected to said base, said clamping arm extending from said base and having a free end extending past and opposing said free end of said cantilever; and
controlling movement of said free end of said clamping arm against said free end of said cantilever during said tunneling mode to immobilize said tip with respect to said base.

32. A method of operating a scanning probe microscope for examining an object wherein
said scanning probe microscope has a probe that includes a base, a cantilever connected to said base, and a tip connected to said cantilever,
said cantilever has a free end adjacent to said tip, and
said scanning probe microscope assembly has a tunneling current mode and an atomic force mode,
the method comprising:
inducing and detecting a tunneling current between said tip and said object during said tunneling current mode;
inducing atomic force interaction between said tip and said object and detecting deflection of said cantilever due to said atomic force interaction during said atomic force mode;
providing a clamping structure that surrounds said cantilever and includes clamping arms; and
controlling movement of said clamping arms against said cantilever during said tunneling mode to immobilize said tip with respect to said base.

33. A method of operating a scanning probe microscope for examining an object, said scanning probe microscope having a probe that includes a base, a cantilever connected to said base, and a tip connected to said cantilever, said scanning probe microscope assembly having a tunneling current mode and an atomic force mode, the method comprising:
inducing and detecting a tunneling current between said tip and said object during said tunneling current mode;
inducing atomic force interaction between said tip and said object and detecting deflection of said cantilever due to said atomic force interaction during said atomic force mode; and
immobilizing said tip with respect to said base so as to prevent said tip from moving toward or away from said object during said tunneling current mode, wherein:
said cantilever has a lower surface to which said tip is connected and an upper surface; and
said immobilizing said tip with respect to said base is accomplished by:
providing a member disposed over said upper surface of said cantilever;
providing a permanent magnet on said upper surface of said cantilever;
providing a coil on said lower surface of said member; and
producing a current in said coil to magnetically immobilize said tip with respect to said base during said tunneling current mode.

34. A method of operating a scanning probe microscope for examining an object, said scanning probe microscope having a probe that includes a base, a cantilever connected to said base, and a tip connected to said cantilever, said scanning probe microscope assembly having a tunneling current mode and an atomic force mode, the method comprising:
inducing and detecting a tunneling current between said tip and said object during said tunneling current mode;
inducing atomic force interaction between said tip and said object and detecting deflection of said cantilever due to said atomic force interaction during said atomic force mode; and
immobilizing said tip with respect to said base so as to prevent said tip from moving toward or away from said object during said tunneling current mode, wherein:
said cantilever has a lower surface to which said tip is connected and an upper surface; and
said immobilizing said tip with respect to said base is accomplished by:
providing an element coupled to said base having a lower surface disposed over said upper surface of said cantilever;
providing a permanent magnet on said lower surface of said element;

providing a coil on said upper surface of said cantilever; and producing a current in said coil to magnetically hold said cantilever rigid with respect to said base during said tunneling current mode.

35. A method of operating a scanning probe microscope for examining an object, said scanning probe microscope having a probe that includes a base, a cantilever connected to said base, and a tip connected to said cantilever, said scanning probe microscope assembly having a tunneling current mode, an atomic force mode, and a spectrophotometry mode, the method comprising:

inducing and detecting a tunneling current between said tie and said object during said tunneling current mode;

inducing atomic force interaction between said tip and said object and detecting deflection of said cantilever due to said atomic force interaction during said atomic force mode;

immobilizing said tip with respect to said base so as to prevent said tip from moving toward or away from said object during said tunneling current mode;

providing a spectrophotometer including a light source optically coupled to said tip;

controlling said light source to provide light to said tip during said spectrophotometry mode;

said tip being shaped to emit said provided light at said sharp end so that said emitted light optically interacts with said object; and detecting light that results from said emitted light optically interacting with said object to make spectrophotometric measurements of said detected light.

36. A scanning probe microscope assembly for examining an object wherein said scanning probe microscope assembly has a near-field optical mode and at least one of a tunneling current mode and an atomic force mode, said scanning probe microscope assembly comprising:

a probe having a tip with a sharp end;

a light source optically coupled to said tip;

means for controlling said light source to provide light to said tip during said near-field optical mode;

rotationally polarizing means for rotationally polarizing said provided light;

means for controlling said rotationally polarizing means to rotationally polarize said provided light during said near-field optical mode;

a photodetector for detecting light that results from said emitted light optically interacting with said object; and deep surface feature analysis means coupled to said photodetector for identifying deep surface features based on said resulting light detected by said photodetector during said near-field optical mode.

37. A scanning probe microscope assembly for examining an object wherein said scanning probe microscope assembly has a hardness testing mode and at least one of a tunneling current mode and an atomic force mode, said scanning probe microscope assembly comprising:

a probe having a tip with a sharp end;

a light source optically coupled to said tip;

directing means for directing said tip to penetrate said object at a specific point with a predefined known force;

means for controlling said light source to provide light to said tip during said hardness testing mode before and after said tip penetrates said object;

said tip emitting at said sharp end said light provided before and while said tip penetrates said object so that said emitted light optically interacts with said object before and while said tip penetrates said object;

a photodetector, said photodetector detecting light resulting from said emitted light optically interacting with said object before and while said tip penetrates said object; and comparing means for comparing said resulting light detected before said tip penetrates said object with said resulting light detected while said tip penetrates said object to determine the hardness of said object.

38. A scanning probe microscope assembly for examining an object wherein said scanning probe microscope assembly has a hardness testing mode and at least one of a tunneling current mode and an atomic force mode, said scanning probe microscope assembly comprising:

a probe having a tip with a sharp end;

means for directing said tip to penetrate said object at a specific point with a predefined known force; and means for measuring the conductivity of said object before and while said tip penetrates said object to determine the hardness of said object.

39. A scanning probe microscope assembly for examining an object, comprising:

a probe that includes
a base,
a cantilever connected to said base, and
a tip having a sharp end, said tip connected to said cantilever;

atomic force means for inducing atomic force interaction between said tip and said object and for detecting deflection of said cantilever due to said atomic force interaction during said atomic force mode;

tunneling current means for-inducing and detecting a tunneling current between said tip and said object during a tunneling current mode;

holding means for immobilizing said tip with respect to said base during said tunneling current mode;

a light source optically coupled to said tip for providing light to said tip;

said tip being shaped to emit light resulting from said provided light at said sharp end so that said emitted light optically interacts with said object; and a photodetector for detecting light resulting from said emitted light optically interacting with said object.

* * * * *